US008222696B2

(12) United States Patent
Yamazaki et al.

(10) Patent No.: US 8,222,696 B2
(45) Date of Patent: Jul. 17, 2012

(54) SEMICONDUCTOR DEVICE HAVING BURIED OXIDE FILM

(75) Inventors: Shunpei Yamazaki, Setagaya (JP); Hisashi Ohtani, Atsugi (JP); Jun Koyama, Atsugi (JP); Takeshi Fukunaga, Atsugi (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 12/427,140

(22) Filed: Apr. 21, 2009

(65) Prior Publication Data

US 2009/0315111 A1 Dec. 24, 2009

Related U.S. Application Data

(63) Continuation of application No. 10/694,477, filed on Oct. 27, 2003, now Pat. No. 7,535,053, which is a continuation of application No. 09/192,745, filed on Nov. 16, 1998, now Pat. No. 6,686,623.

(30) Foreign Application Priority Data

| Nov. 18, 1997 | (JP) | 9-333453 |
| Nov. 21, 1997 | (JP) | 9-337710 |
| Nov. 26, 1997 | (JP) | 9-340754 |

(51) Int. Cl.
  *H01L 27/12* (2006.01)
(52) U.S. Cl. ............... 257/347; 257/E29.286
(58) Field of Classification Search ........... 257/347, 257/410, 413, 900, 353, 354, E29.286
See application file for complete search history.

(56) References Cited

U.S. PATENT DOCUMENTS

| 3,890,632 A | 6/1975 | Ham |
| 3,964,941 A | 6/1976 | Wang |
| 4,004,159 A | 1/1977 | Rai |
| 4,217,153 A | 8/1980 | Fukunaga et al. |
| 4,454,524 A | 6/1984 | Spence |
| 4,495,693 A | 1/1985 | Iwahashi |
| 4,549,336 A | 10/1985 | Sheppard |
| 4,583,122 A | 4/1986 | Ohwada et al. |

(Continued)

FOREIGN PATENT DOCUMENTS

EP 0 369 676 A2 5/1990

(Continued)

OTHER PUBLICATIONS

Koyanagi et al., "Submicron Devices I", Maruzen Co., Ltd. pp. 88-138, 1987.

(Continued)

*Primary Examiner* — Mark Prenty
(74) *Attorney, Agent, or Firm* — Eric J. Robinson; Robinson Intellectual Property Law Office, P.C.

(57) ABSTRACT

An active region, a source region, and a drain region are formed on a single crystal semiconductor substrate or a single crystal semiconductor thin film. Impurity regions called pinning regions are formed in striped form in the active region so as to reach both of the source region and the drain region. Regions interposed between the pinning regions serve as channel forming regions. A tunnel oxide film, a floating gate, a control gate, etc. are formed on the above structure. The impurity regions prevent a depletion layer from expanding from the source region toward the drain region.

22 Claims, 35 Drawing Sheets

U.S. PATENT DOCUMENTS

| | | | |
|---|---|---|---|
| 4,665,419 A | 5/1987 | Sasaki | |
| 4,697,198 A | 9/1987 | Komori | |
| 4,733,947 A | 3/1988 | Ota et al. | |
| 4,753,896 A | 6/1988 | Matloubian | |
| 4,768,076 A | 8/1988 | Aoki et al. | |
| 4,786,955 A | 11/1988 | Plus et al. | |
| 4,822,752 A | 4/1989 | Sugahara et al. | |
| 4,857,986 A | 8/1989 | Kinugawa | |
| 4,899,202 A | 2/1990 | Blake et al. | |
| 4,933,298 A | 6/1990 | Hasegawa | |
| 4,943,837 A | 7/1990 | Konishi et al. | |
| 4,959,697 A | 9/1990 | Shier | |
| 4,999,682 A | 3/1991 | Xu | |
| 5,002,630 A | 3/1991 | Kermani et al. | |
| 5,059,304 A | 10/1991 | Field | |
| 5,130,770 A | 7/1992 | Blanc et al. | |
| 5,196,367 A | 3/1993 | Lu | |
| 5,198,879 A | 3/1993 | Ohshima | |
| 5,210,437 A | 5/1993 | Sawada | |
| 5,215,931 A | 6/1993 | Houston | |
| 5,243,213 A | 9/1993 | Miyazawa et al. | |
| 5,258,323 A | 11/1993 | Sarma et al. | |
| 5,261,999 A | 11/1993 | Pinker et al. | |
| 5,262,987 A | 11/1993 | Kojima | |
| 5,289,030 A | 2/1994 | Yamazaki et al. | |
| 5,317,236 A | 5/1994 | Zavracky et al. | |
| 5,324,960 A | 6/1994 | Pfiester | |
| 5,341,028 A | 8/1994 | Yamaguchi et al. | |
| 5,343,051 A | 8/1994 | Yamaguchi | |
| 5,350,940 A | 9/1994 | Rona | |
| 5,371,037 A | 12/1994 | Yonehara | |
| 5,374,564 A | 12/1994 | Bruel | |
| 5,387,555 A | 2/1995 | Linn et al. | |
| 5,403,759 A | 4/1995 | Havemann | |
| 5,405,802 A | 4/1995 | Yamagata | |
| 5,407,837 A | 4/1995 | Eklund | |
| 5,424,230 A | 6/1995 | Wakai | |
| 5,426,062 A | 6/1995 | Hwang | |
| 5,426,325 A | 6/1995 | Chang | |
| 5,428,234 A | 6/1995 | Sumi | |
| 5,444,282 A | 8/1995 | Yamaguchi et al. | |
| 5,449,937 A | 9/1995 | Arimura | |
| 5,455,791 A | 10/1995 | Zaleski | |
| 5,488,001 A | 1/1996 | Brotherton | |
| 5,506,178 A | 4/1996 | Suzuki et al. | |
| 5,508,209 A | 4/1996 | Zhang et al. | |
| 5,532,175 A | 7/1996 | Racanelli | |
| 5,548,143 A | 8/1996 | Lee | |
| 5,550,070 A | 8/1996 | Funai et al. | |
| 5,569,620 A | 10/1996 | Linn et al. | |
| 5,573,961 A | 11/1996 | Hsu et al. | |
| 5,574,292 A | 11/1996 | Takahashi et al. | |
| 5,576,556 A | 11/1996 | Takemura et al. | |
| 5,581,092 A | 12/1996 | Takemura | |
| 5,606,191 A | 2/1997 | Wang | |
| 5,608,231 A | 3/1997 | Ugajin | |
| 5,612,230 A | 3/1997 | Yuzurihara et al. | |
| 5,614,752 A | 3/1997 | Takenaka | |
| 5,619,053 A | 4/1997 | Iwamatsu | |
| 5,635,749 A | 6/1997 | Hong | |
| 5,640,033 A | 6/1997 | Matsuoka | |
| 5,643,826 A | 7/1997 | Ohtani | |
| 5,644,147 A | 7/1997 | Yamazaki et al. | |
| 5,648,277 A | 7/1997 | Zhang et al. | |
| 5,661,059 A | 8/1997 | Liu | |
| 5,670,389 A | 9/1997 | Huang | |
| 5,674,788 A | 10/1997 | Wristers | |
| 5,675,164 A | 10/1997 | Brunner | |
| 5,693,959 A | 12/1997 | Inoue et al. | |
| 5,698,869 A | 12/1997 | Yoshimi et al. | |
| 5,698,884 A | 12/1997 | Dennen | |
| 5,710,057 A | 1/1998 | Kenney | |
| 5,714,395 A | 2/1998 | Bruel | |
| 5,719,065 A | 2/1998 | Takemura et al. | |
| 5,719,427 A | 2/1998 | Tong | |
| 5,729,045 A | 3/1998 | Buynoski | |
| 5,750,000 A | 5/1998 | Yonehara et al. | |
| 5,767,529 A | 6/1998 | Kobori et al. | |
| 5,778,237 A | 7/1998 | Yamamoto et al. | |
| 5,784,131 A | 7/1998 | Kim et al. | |
| 5,784,132 A | 7/1998 | Hashimoto | |
| 5,786,618 A | 7/1998 | Wen | |
| 5,793,073 A | 8/1998 | Kaminishi et al. | |
| 5,801,416 A | 9/1998 | Choi | |
| 5,807,771 A * | 9/1998 | Vu et al. | 438/154 |
| 5,814,854 A | 9/1998 | Liu | |
| 5,818,076 A | 10/1998 | Zhang et al. | |
| 5,818,083 A | 10/1998 | Ito | |
| 5,821,138 A | 10/1998 | Yamazaki et al. | |
| 5,831,294 A | 11/1998 | Ugajin | |
| 5,837,569 A | 11/1998 | Makita et al. | |
| 5,840,616 A | 11/1998 | Sakaguchi et al. | |
| 5,841,173 A | 11/1998 | Yamashita | |
| 5,849,627 A | 12/1998 | Linn et al. | |
| 5,854,123 A | 12/1998 | Sato et al. | |
| 5,854,505 A | 12/1998 | Suzuki et al. | |
| 5,854,509 A | 12/1998 | Kunikiyo | |
| 5,856,229 A | 1/1999 | Sakaguchi et al. | |
| 5,869,387 A | 2/1999 | Sato et al. | |
| 5,877,070 A | 3/1999 | Goesele et al. | |
| 5,882,987 A | 3/1999 | Srikrishnan | |
| 5,885,872 A | 3/1999 | Tamaki | |
| 5,886,385 A | 3/1999 | Arisumi et al. | |
| 5,893,730 A | 4/1999 | Yamazaki et al. | |
| 5,893,740 A | 4/1999 | Chang | |
| 5,894,137 A | 4/1999 | Yamazaki | |
| 5,894,151 A | 4/1999 | Yamazaki | |
| 5,899,711 A | 5/1999 | Smith | |
| 5,904,528 A | 5/1999 | Lin et al. | |
| 5,905,291 A | 5/1999 | Utsunomiya | |
| 5,913,111 A | 6/1999 | Kataoka et al. | |
| 5,923,962 A | 7/1999 | Ohtani et al. | |
| 5,926,430 A | 7/1999 | Noda et al. | |
| 5,929,479 A | 7/1999 | Oyama | |
| 5,936,887 A | 8/1999 | Choi | |
| 5,940,722 A | 8/1999 | Tamura | |
| 5,943,105 A | 8/1999 | Fujikawa et al. | |
| 5,949,107 A | 9/1999 | Zhang | |
| 5,952,699 A | 9/1999 | Yamazaki | |
| 5,953,622 A | 9/1999 | Lee et al. | |
| 5,962,897 A | 10/1999 | Takemura et al. | |
| 5,965,918 A | 10/1999 | Ono | |
| 5,966,594 A | 10/1999 | Adachi et al. | |
| 5,966,620 A | 10/1999 | Sakaguchi et al. | |
| 5,982,002 A | 11/1999 | Takasu et al. | |
| 5,985,681 A | 11/1999 | Hamajima et al. | |
| 5,985,740 A | 11/1999 | Yamazaki et al. | |
| 5,989,981 A | 11/1999 | Nakashima et al. | |
| 6,020,252 A | 2/2000 | Aspar et al. | |
| 6,027,988 A | 2/2000 | Cheung et al. | |
| 6,031,249 A | 2/2000 | Yamazaki et al. | |
| 6,034,896 A | 3/2000 | Ranaweera | |
| 6,044,474 A | 3/2000 | Klein | |
| 6,049,092 A | 4/2000 | Konuma et al. | |
| 6,051,453 A | 4/2000 | Takemura | |
| 6,054,363 A | 4/2000 | Sakaguchi et al. | |
| 6,063,706 A | 5/2000 | Wu | |
| 6,072,199 A | 6/2000 | Iwamuro | |
| 6,077,731 A | 6/2000 | Yamazaki et al. | |
| 6,087,679 A * | 7/2000 | Yamazaki et al. | 257/65 |
| 6,093,937 A | 7/2000 | Yamazaki et al. | |
| 6,096,582 A | 8/2000 | Inoue et al. | |
| 6,107,639 A | 8/2000 | Yamazaki et al. | |
| 6,107,654 A | 8/2000 | Yamazaki | |
| 6,111,296 A | 8/2000 | Yamazaki | |
| 6,118,148 A | 9/2000 | Yamazaki | |
| 6,121,117 A | 9/2000 | Sato et al. | |
| 6,124,613 A | 9/2000 | Kokubun | |
| 6,127,702 A | 10/2000 | Yamazaki | |
| 6,133,073 A | 10/2000 | Yamazaki et al. | |
| 6,140,667 A * | 10/2000 | Yamazaki et al. | 257/59 |
| 6,157,421 A | 12/2000 | Ishii | |
| 6,165,880 A | 12/2000 | Yaung et al. | |
| 6,171,982 B1 | 1/2001 | Sato | |
| 6,184,556 B1 | 2/2001 | Yamazaki | |
| 6,191,007 B1 | 2/2001 | Matsui et al. | |
| 6,191,476 B1 | 2/2001 | Takahashi et al. | |

| | | |
|---|---|---|
| 6,198,141 B1 | 3/2001 | Yamazaki |
| 6,207,969 B1 | 3/2001 | Yamazaki |
| 6,211,041 B1 | 4/2001 | Ogura |
| 6,218,678 B1 | 4/2001 | Zhang et al. |
| 6,232,642 B1 | 5/2001 | Yamazaki |
| 6,246,068 B1 | 6/2001 | Sato et al. |
| 6,262,438 B1 | 7/2001 | Yamazaki et al. |
| 6,268,842 B1 | 7/2001 | Yamazaki et al. |
| 6,271,101 B1 | 8/2001 | Fukunaga |
| 6,287,900 B1 | 9/2001 | Yamazaki et al. |
| 6,291,275 B1 | 9/2001 | Yamazaki et al |
| 6,294,478 B1 | 9/2001 | Sakaguchi et al. |
| 6,306,709 B1 | 10/2001 | Miyagi |
| 6,307,214 B1 * | 10/2001 | Ohtani et al. ............ 257/59 |
| 6,307,220 B1 | 10/2001 | Yamazaki |
| 6,326,249 B1 | 12/2001 | Yamazaki et al. |
| 6,329,269 B1 | 12/2001 | Hamada |
| 6,331,208 B1 | 12/2001 | Nishida et al. |
| 6,335,231 B1 | 1/2002 | Yamazaki et al. |
| 6,335,716 B1 | 1/2002 | Yamazaki et al. |
| 6,342,433 B1 | 1/2002 | Ohmi et al. |
| 6,350,702 B2 | 2/2002 | Sakaguchi et al. |
| 6,365,933 B1 | 4/2002 | Yamazaki et al. |
| 6,369,410 B1 | 4/2002 | Yamazaki et al. |
| 6,380,046 B1 | 4/2002 | Yamazaki |
| 6,380,560 B1 | 4/2002 | Yamazaki et al. |
| 6,388,291 B1 | 5/2002 | Zhang et al. |
| 6,388,652 B1 | 5/2002 | Yamazaki et al. |
| 6,396,105 B1 * | 5/2002 | Yamazaki et al. ............ 257/350 |
| 6,420,759 B2 | 7/2002 | Yamazaki et al. |
| 6,421,754 B1 | 7/2002 | Kau et al. |
| 6,424,011 B1 | 7/2002 | Assaderaghi et al. |
| 6,433,361 B1 | 8/2002 | Zhang et al. |
| 6,452,211 B1 | 9/2002 | Ohtani et al. |
| 6,455,401 B1 | 9/2002 | Zhang et al. |
| 6,458,637 B1 | 10/2002 | Yamazaki et al. |
| 6,465,287 B1 | 10/2002 | Yamazaki et al. |
| 6,498,376 B1 | 12/2002 | Miyagi |
| 6,528,820 B1 | 3/2003 | Yamazaki et al. |
| 6,534,380 B1 | 3/2003 | Yamauchi et al. |
| 6,549,184 B1 | 4/2003 | Koyama et al. |
| 6,583,474 B2 | 6/2003 | Yamazaki et al. |
| 6,590,230 B1 | 7/2003 | Yamazaki et al. |
| 6,602,761 B2 | 8/2003 | Fukunaga |
| 6,617,612 B2 | 9/2003 | Zhang et al. |
| 6,653,687 B1 | 11/2003 | Yamazaki |
| 6,667,494 B1 | 12/2003 | Yamazaki et al. |
| 6,686,623 B2 | 2/2004 | Yamazaki |
| 6,730,932 B2 | 5/2004 | Yamazaki et al. |
| 6,744,069 B1 | 6/2004 | Yamazaki et al. |
| 6,787,806 B1 | 9/2004 | Yamazaki et al. |
| 6,803,264 B2 | 10/2004 | Yamazaki et al. |
| 6,808,965 B1 | 10/2004 | Miyasaka et al. |
| 6,849,872 B1 | 2/2005 | Yamazaki et al. |
| 6,867,431 B2 | 3/2005 | Konuma et al. |
| 6,875,628 B1 | 4/2005 | Zhang et al. |
| 6,875,633 B2 | 4/2005 | Fukunaga |
| 6,882,018 B2 | 4/2005 | Ohtani et al. |
| 7,023,052 B2 | 4/2006 | Yamazaki et al. |
| 7,126,102 B2 | 10/2006 | Inoue et al. |
| 7,138,658 B2 | 11/2006 | Yamazaki et al. |
| 7,148,119 B1 | 12/2006 | Sakaguchi et al. |
| RE39,484 E | 2/2007 | Bruel |
| 7,172,929 B2 | 2/2007 | Yamazaki et al. |
| 7,176,525 B2 | 2/2007 | Fukunaga |
| 7,199,024 B2 | 4/2007 | Yamazaki |
| 7,223,666 B2 | 5/2007 | Ohtani et al. |
| 7,381,599 B2 | 6/2008 | Konuma et al. |
| 7,473,592 B2 | 1/2009 | Yamazaki et al. |
| 7,473,971 B2 | 1/2009 | Yamazaki et al. |
| 7,476,576 B2 | 1/2009 | Yamazaki et al. |
| 7,525,158 B2 | 4/2009 | Konuma et al. |
| 7,535,053 B2 * | 5/2009 | Yamazaki ............ 257/316 |
| 7,569,856 B2 | 8/2009 | Konuma et al. |
| 7,638,805 B2 | 12/2009 | Yamazaki et al. |
| 7,642,598 B2 | 1/2010 | Yamazaki et al. |
| 2001/0019153 A1 | 9/2001 | Sato et al. |
| 2001/0053607 A1 | 12/2001 | Sakaguchi et al. |
| 2002/0102820 A1 | 8/2002 | Hamada |
| 2002/0109144 A1 | 8/2002 | Yamazaki |
| 2003/0087503 A1 | 5/2003 | Sakaguchi et al. |
| 2004/0104435 A1 | 6/2004 | Ohtani et al. |
| 2004/0164300 A1 | 8/2004 | Yamazaki et al. |
| 2004/0256621 A1 | 12/2004 | Konuma et al. |
| 2005/0009252 A1 | 1/2005 | Yamazaki et al. |
| 2005/0142705 A1 | 6/2005 | Konuma et al. |
| 2005/0153489 A1 | 7/2005 | Konuma et al. |
| 2007/0007529 A1 | 1/2007 | Takemura et al. |
| 2007/0020888 A1 | 1/2007 | Yamazaki et al. |
| 2007/0108510 A1 | 5/2007 | Fukunaga |
| 2007/0173000 A1 | 7/2007 | Yamazaki |
| 2007/0184632 A1 | 8/2007 | Yamazaki et al. |
| 2007/0210451 A1 | 9/2007 | Ohtani et al. |
| 2007/0252206 A1 | 11/2007 | Yamazaki et al. |
| 2008/0054269 A1 | 3/2008 | Yamazaki et al. |
| 2008/0061301 A1 | 3/2008 | Yamazaki |
| 2008/0067529 A1 | 3/2008 | Yamazaki |
| 2008/0067596 A1 | 3/2008 | Yamazaki et al. |
| 2008/0067597 A1 | 3/2008 | Yamazaki |
| 2008/0070335 A1 | 3/2008 | Yamazaki et al. |
| 2008/0083953 A1 | 4/2008 | Yamazaki |
| 2008/0113487 A1 | 5/2008 | Yamazaki et al. |
| 2008/0113488 A1 | 5/2008 | Yamazaki et al. |
| 2008/0213953 A1 | 9/2008 | Yamazaki |
| 2008/0286941 A1 | 11/2008 | Yamazaki |
| 2008/0286942 A1 | 11/2008 | Yamazaki |
| 2008/0286956 A1 | 11/2008 | Yamazaki |
| 2009/0236698 A1 | 9/2009 | Yamazaki et al. |
| 2009/0289254 A1 | 11/2009 | Konuma et al. |

FOREIGN PATENT DOCUMENTS

| | | |
|---|---|---|
| EP | 0 485 233 | 5/1992 |
| EP | 0 553 852 | 8/1993 |
| EP | 0 645 802 | 3/1995 |
| EP | 0 723 286 | 7/1996 |
| EP | 0 767 486 | 4/1997 |
| EP | 0 793 263 | 9/1997 |
| JP | 61-256674 | 11/1986 |
| JP | 62-11277 | 1/1987 |
| JP | 62-71277 | 4/1987 |
| JP | 63-300567 | 7/1988 |
| JP | 63-318779 | 12/1988 |
| JP | 02-042725 | 2/1990 |
| JP | 02-260442 | 10/1990 |
| JP | 03-054869 | 3/1991 |
| JP | 03-079035 | 4/1991 |
| JP | 04-79270 | 3/1992 |
| JP | 04-96278 | 3/1992 |
| JP | 04-206766 | 7/1992 |
| JP | 04-242958 | 8/1992 |
| JP | 04-348532 | 12/1992 |
| JP | 05-82787 | 4/1993 |
| JP | 05-136429 | 6/1993 |
| JP | 05-166689 | 7/1993 |
| JP | 05-218410 | 8/1993 |
| JP | 05-226620 | 9/1993 |
| JP | 05-315355 | 11/1993 |
| JP | 05-341317 | 12/1993 |
| JP | 06-60678 | 3/1994 |
| JP | 07-056189 | 3/1995 |
| JP | 07-86532 | 3/1995 |
| JP | 07-130652 | 5/1995 |
| JP | 07-249749 | 9/1995 |
| JP | 08-64788 | 3/1996 |
| JP | 08-078329 | 3/1996 |
| JP | 08-274330 | 10/1996 |
| JP | 08-293598 | 11/1996 |
| JP | 08-330598 | 12/1996 |
| JP | 09-008124 | 1/1997 |
| JP | 09-045882 | 2/1997 |
| JP | 09-055633 | 2/1997 |
| JP | 09-107086 | 4/1997 |
| JP | 09-165216 | 6/1997 |
| JP | 09-212428 | 8/1997 |
| JP | 09-213916 | 8/1997 |
| JP | 09-260682 | 10/1997 |
| JP | 09-289323 | 11/1997 |
| JP | 09-293876 | 11/1997 |

| JP | 03-54869 | 3/1998 |
| JP | 10-065163 | 3/1998 |
| JP | 10-065164 | 3/1998 |
| JP | 10-093100 | 4/1998 |
| JP | 10-125879 | 5/1998 |
| JP | 10-125881 | 5/1998 |
| JP | 11-17169 | 1/1999 |
| JP | 11-163363 | 6/1999 |
| WO | WO 88/03328 | 5/1988 |
| WO | WO 97/02605 | 1/1997 |

OTHER PUBLICATIONS

Ohuchi, K. et al, "A High-Performance 0.05 μm SOI MOS FET: Possibility of Velocity Overshoot," Japanese Journal of Applied Physics, vol. 35, Part 1, No. 2B, Feb. 1996, pp. 960-964.

Okazawa et al. "Nikkei Microdevices", Okazawa, et al., pp. 47-48, May 1992.

Izumi, K., et al., "C.M.O.S. Devices Fabricated on Buried $SiO^2$ Layers Formed by Oxygen Implantation Into Silicon," Electronic Letters, Aug. 31, 1978, vol. 14, No. 18, pp. 593-594.

Wolf, S., "Silicon Processing for the VLSI Era," Jan. 1, 1990, vol. 2, Process Integration, pp. 238-239.

Bruel, M., Silicon on Insulator Material Technology, Electronics Letter, Jul. 6, 1995, vol. 31, No. 14, pp. 1201-1202.

Sakaguchi, K., et al., "Current Progress in Epitaxial Layer Transfer (ELTRAN®)," IECE Trans. Electron, Mar. 1, 1997, vol. E80C, No. 3, pp. 378-387.

Auberton-Herve, A.J., et al., "Smart-Cut®: The Basic Fabrication Process for UNIBOND® SOI Wafers," IEICE Trans. Electron, Mar. 3, 1997, vol. E80C, No. 3, pp. 358-363.

Auberton-Herve, A.J., et al., "Unibond SOI Wafer by Smart Cut," Electronic Material, Aug. 1, 1997, vol. 36, No. 8, pp. 83-87.

Ishiyama, T., et al., "Application of Reversed Silicon Wafer Direct Bonding to Thin-Film SOI Power Ics," Extended Abstracts of the 1997 International Conference on Solid State Devices and Materials, Sep. 16, 1997, pp. 162-163.

Chau, R., et al., "Scalability of Partially Depleted SOI Technology for Sub-0.25 μm Logic Applications," IEDM 97: Technical Digest of International Electron Devices Meeting, Dec. 7, 1997, pp. 591-594.

Assaderaghi, F., et al., "A 7.9/5.5 psec Room/Low Temperature SOI CMOS," IEDM Technical Digest of International Electron Devices Meeting, Dec. 7, 2007, pp. 415-418.

Bell, T. et al., "A Dissolved Wafer Process Using a Porous Silicon Sacrificial Layer and a Lightly-Doped Bulk Silicon Etch-Stop," Micro Electro Mechanical Systems, Jan. 25, 1998, pp. 251-256.

Nandakumar, M., et al., Shallow Trench Isolation for Advanced ULSI CMOS Technologies, IEDM 98: Technical Digest of International Electron Devices Meeting, Dec. 6, 1998, pp. 133-136.

Assaderaghi, F., et al., "A 7.9/5.5 psec Room/Low Temperature SOI CMOS," IEDM Technical Digest of International Electron Devices Meeting, Dec. 7, 1997, pp. 415-418.

Office Action (U.S. Appl. No. 12/469,978) dated Nov. 8, 2011.

Pending Claims (U.S. Appl. No. 12/469,978) as of May 21, 2009.

* cited by examiner

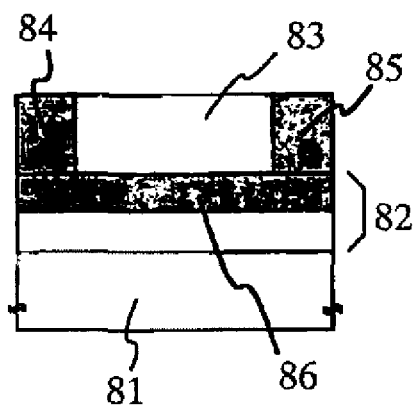 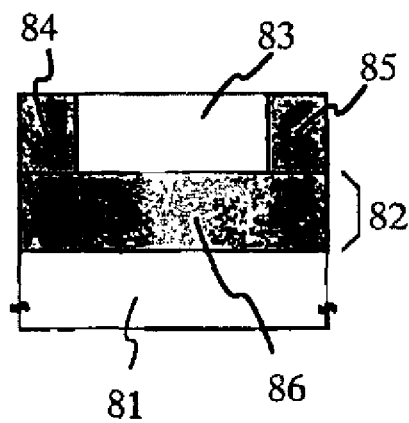
FIG. 17A   FIG. 17B
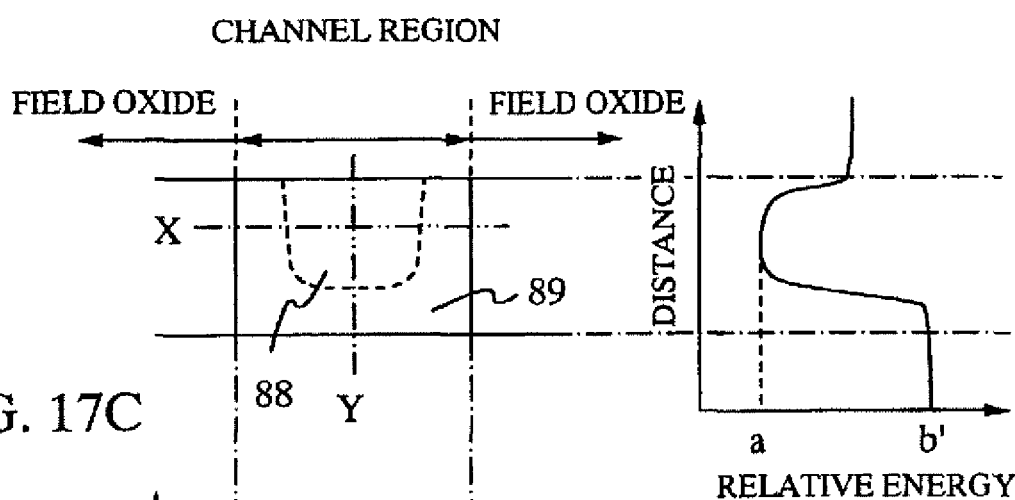
FIG. 17C
FIG. 17E
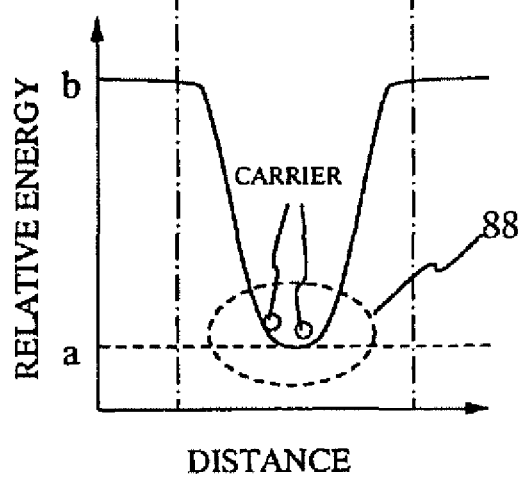
FIG. 17D

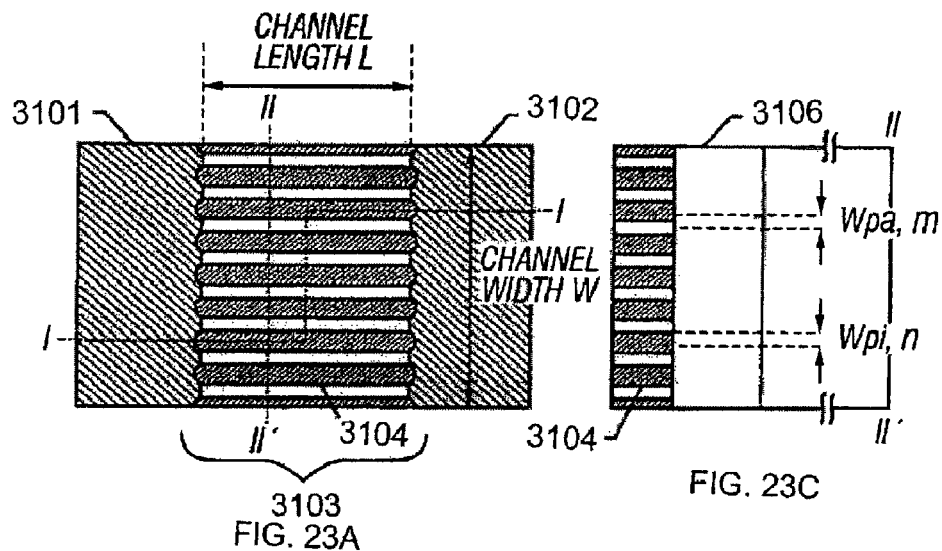
FIG. 23A
FIG. 23C
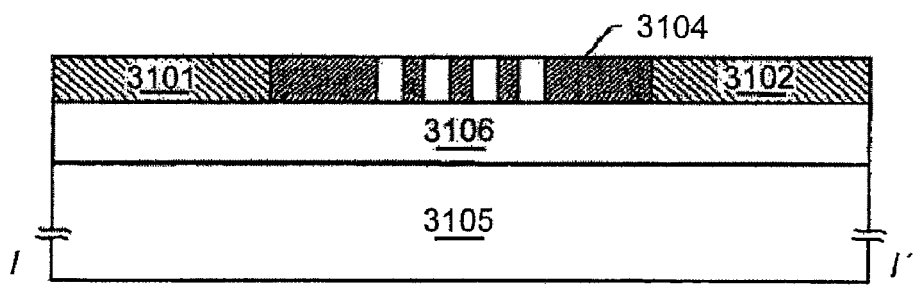
FIG. 23B
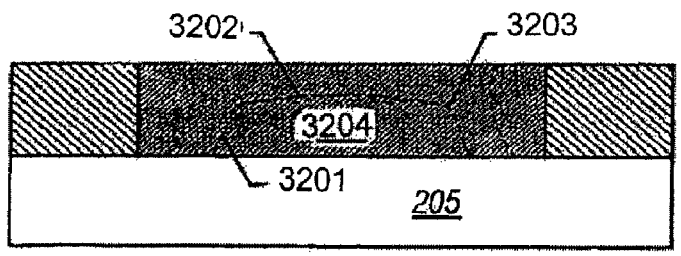
FIG. 24A
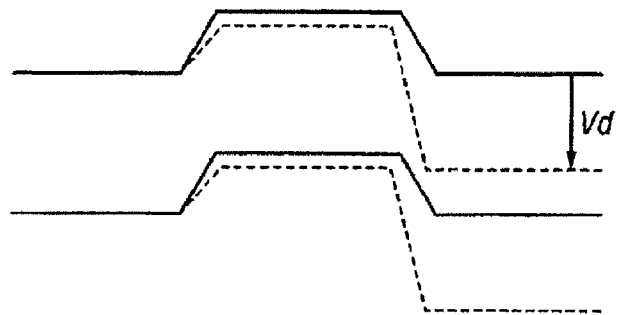
FIG. 24B

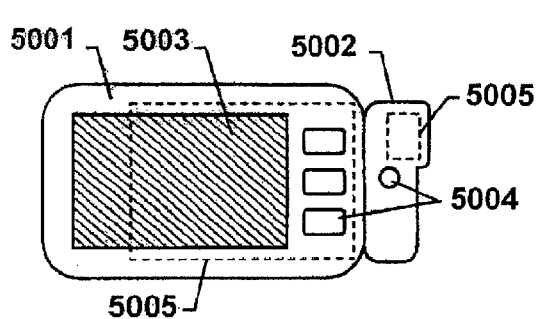
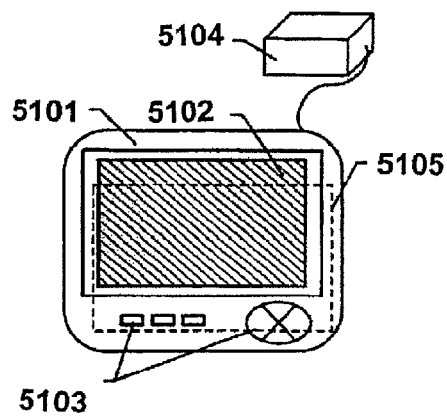
FIG. 39A  FIG. 39B
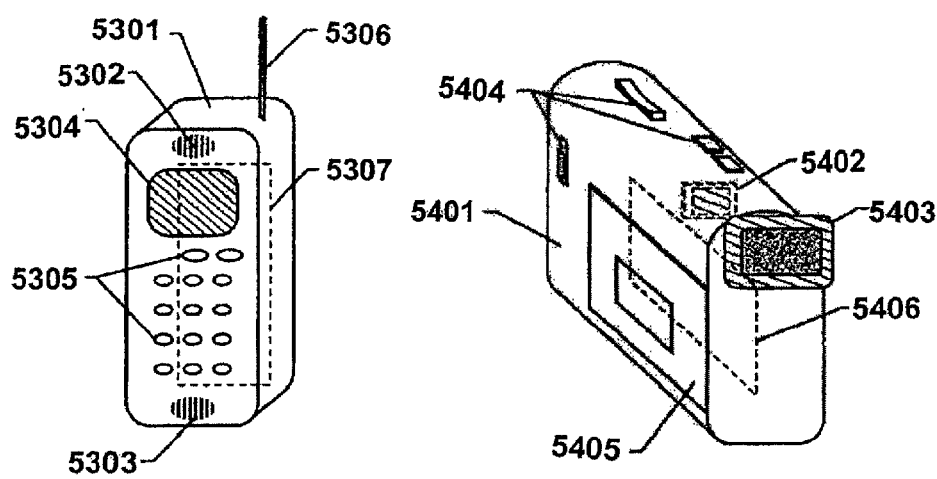
FIG. 39C  FIG. 39D

SEMICONDUCTOR DEVICE HAVING BURIED OXIDE FILM

CROSS-REFERENCE TO RELATED APPLICATIONS

This application is a continuation of U.S. application Ser. No. 10/694,477, filed Oct. 27, 2003, now allowed, which is a continuation of U.S. application Ser. No. 09/192,745, filed Nov. 16, 1998, now U.S. Pat. No. 6,686,623, which claims the benefit of foreign priority applications filed in Japan as Serial No. 9-333453 on Nov. 18, 1997, Serial No. 9-337710 on Nov. 21, 1997 and Serial No. 9-340754 on Nov. 26, 1997, all of which is incorporated by reference.

BACKGROUND OF THE INVENTION

1. Field of the Invention

The present invention relates to a structure and a manufacturing method of an insulated gate semiconductor device having an SOI (silicon-on-insulator) structure, particularly an insulated-gate field-effect transistor (hereinafter referred to simply as IG-FET). An example of the insulated-gate semiconductor device having a SOI structure is a semiconductor device formed on an SOS (silicon-on-sapphire) substrate or a SIMOX (separated-by-implanted oxygen) substrate.

In particular, the invention relates to a technique that is effective in forming a very small element having a channel length of less than 0.35 µm (particularly less than 0.1 µm). Thus, the invention can be applied to various semiconductor integrated circuits such as ICs, VLSIs, and ULSIs that are formed by integrating IG-FETs.

The term "semiconductor device" as used in this specification means a "device or apparatus that utilizes a semiconductor to operate for an intended purpose," and covers not only semiconductor elements such as an IG-FET but also integrated circuits formed by integrating semiconductor elements, and even electronic apparatuses incorporating such integrated circuits. In the specification, for convenience of description, various terms such as a semiconductor element, an integrated circuit, and an electronic apparatus are used where appropriate.

In another aspect, the present invention relates to the configuration of a nonvolatile memory formed by using a semiconductor. In particular, the invention for the nonvolatile memory in which the channel length is 2 µm or less or even 0.5 µm or less.

2. Description of the Related Art

In recent years, integrated circuits such as VLSIs are being miniaturized steadily, and the width of interconnections comes to decrease to 0.35-0.1 µm or less than 0.35 µm, or even to less than 0.01 µm (dimensions of a deep submicron processing range).

On the other hand, low power consumption is also required, which makes the lower power consumption characteristic of CMOS ICs indispensable. Where a CMOS IC is miniaturized, a problem of a latch-up phenomenon may occur between an n-type FET and a p-type FET. IG-FETs having an SOI structure solve this problem.

Because of complete insulation between a substrate and an element, IG-FETs having an SOI structure can greatly reduce a parasitic capacitance occurring there and hence allow pursuit of high-speed operation.

Thus, semiconductor devices having an SOI structure now attract much attention as next-generation high-speed elements and demand for those is expected to increase further in the future.

Such semiconductor elements have been miniaturized according to the scaling rule, and it is generally known that miniaturization of an integrated circuit leads to improvements in its characteristics. However, in microprocessing in a sub-micron range, problems may occur where the scaling rule does not apply in simple form.

A typical example of such problems is the short channel effects. The short channel effects are caused by a phenomenon that as the width of the gate electrode becomes shorter, that is, the channel forming region becomes shorter, the charge in the channel forming region, which should be controlled by the gate voltage, comes to be also influenced by the depletion layer charge and electric field and the potential profile in the source/drain region.

FIG. 19 shows the above phenomenon in a simplified manner. FIG. 19 shows a conventional semiconductor device formed on a SIMOX substrate in which reference numerals 3301 and 3302 denote a silicon substrate and a buried oxide layer formed by oxygen implantation, respectively. A crystalline semiconductor layer (single crystal silicon layer) is disposed on the buried oxide layer 3302, and a source region 303, a drain region 304, a channel region 3305, and a gate electrode 3306 are formed in or on the crystalline semiconductor layer. A broken line 3307 denotes a depletion layer that is formed when the drain voltage Vd is small.

Normally, the current flowing through the channel region 3305 is controlled only by the gate voltage Vg. In this case, the portion of the depletion layer (indicated by the broken line 3307) in the vicinity of the channel region 3305 is substantially parallel with the channel, to allow formation of a uniform electric field.

However, as the drain voltage Vd is increased, the depletion layer in the vicinity of the drain region 3304 extends toward the channel region 3305 and the source region 3303, so that the charge and the electric field in the drain depletion layer come to influence the depletion layer in the vicinity of the source region 3303 and the channel region 3305 as indicated by a solid line 3308. As a result, the on-current varies depending on a complex electric field profile and is hard to control only by the gate voltage Vg.

Referring to FIG. 20, a description will be made of an energy state in and around the channel forming region in a state that the short channel effects occur. In FIG. 20, solid lines represent an energy band diagram including a source region 3401, a channel forming region 3402, and a drain region 3403 in a state that the drain voltage Vd is 0 V.

When a sufficiently large drain voltage Vd is applied, the energy band diagram changes to one indicated by broken lines in FIG. 20. That is, the depletion layer charge and electric field in the drain region 3403 formed by the drain voltage Vd influence the depletion layer charge in the source region 3401 and the channel forming region 3402, and the energy (potential) profile varies continuously from the source region 3401 to the drain region 3403.

In semiconductor elements, say, IG-FETs, the short-channel effects typically appear as a reduction in threshold voltage Vth and a reduction in device breakdown voltage due to the punch-through phenomenon. It is known that if the degree of influence of the gate voltage on the drain current is lowered by the punch-through phenomenon, the subthreshold characteristic is deteriorated.

The reduction in threshold voltage occurs in both n-channel and p-channel FETs in similar manners. The degree of the threshold voltage reduction depends on not only the drain voltage but also other various parameters such as the substrate impurity concentration, the source/drain diffusion layer depth, the gate oxide film thickness, and the substrate bias voltage.

Although the reduction in threshold voltage is desirable for the purpose of reducing the power consumption, in general a resulting reduction in the drive voltage of an integrated circuit causes demerits such as a difficulty in improving the frequency characteristic.

Further, when the channel length is shortened, the drain-side depletion layer is connected to the source-side depletion layer to lower the diffusion potential in the vicinity of the source, which in turn causes a current flow between the source and the drain even if a channel is not formed there. This is called the punch-through phenomenon.

When the punch-through phenomenon occurs, the drain current is not saturated even in the saturation range. Since a large current comes to flow as the drain voltage is increased, the source-drain breakdown voltage is considerably reduced which is a problem.

The deterioration in subthreshold characteristic due to the punch-through phenomenon means an increase in subthreshold coefficient (S-value), which in turn means deterioration in the switching characteristic of a FET. FIG. 21 shows an influence of the short channel effects appearing in the subthreshold characteristic.

FIG. 21 is a graph in which the horizontal axis represents the gate voltage Vg and the vertical axis represents the drain current Id. The S-value is the reciprocal of the slope (i.e., subthreshold characteristic) in range 2501. FIG. 21 shows how the characteristic varies as the channel length is shortened gradually in the arrowed direction.

It is seen that the slope of the characteristic decreases (the S-value increases) as the channel length is shortened, which means that the switching characteristic of a FET is more deteriorated as the channel length is shortened.

Various techniques have been proposed as means for suppressing the above-described short channel effects. For example, it was reported that in an SOI structure in which a substrate and an element are insulated from each other by a buried oxide film (by using a bonding technique, ion implantation, or some other technique), thinning the buried oxide film is effective in suppressing the short channel effects. However, this technique does not provide a complete solution.

A semiconductor device having an SOI structure in which the channel length is very short, i.e., about 0.1 µm, has a feature that impurity elements exist in the channel region at an extremely low probability (from one to some). Even at the room temperature, a phenomenon was observed that electrons move faster than in the ordinary case (the velocity overshoot effect; see K. Ohuchi et al., Jpn. J. Appl. Phys., Vol. 35, p. 960, 1996).

A high-speed semiconductor device was proposed whose high-speed operation performance was improved by utilizing the above effect. However, in such a high-speed semiconductor device, at present, the problems such as the punch-through phenomenon as one of the short channel effects and the associated deterioration in breakdown voltage (described above) remain unsolved.

As a means for suppressing the reduction in threshold voltage as one of the short channel effects, a technique has been employed in which an impurity element imparting one type of conductivity is added uniformly to the overall channel forming region and the threshold voltage is controlled by its addition amount. However, this method has a problem of a reduction in carrier mobility because the added impurity scatters carriers.

A single crystal silicon substrate as a mother substrate of an SOI substrate is manufactured by a FZ method with a very low oxygen content or a CZ method which allows oxygen to be contained to a certain extent to reduce stress and prevent a warp. Usually, a single crystal silicon substrate by the CZ method is used for memory ICs and logic ICs.

However, in a single crystal silicon substrate manufactured by the CZ method, the amount of warp increases due to a heat history and other factors as the oxygen content is reduced. Conversely, if the oxygen content is increased to such a level (usually, about $1\text{-}2\times10^{18}$ atoms/cm$^3$) that the amount of warp becomes sufficiently small, there may occur a case that oxygen atoms prevent movement of carriers.

In the current semiconductor industry, semiconductor integrated circuits that are integrated to an extreme, and the key point for this purpose is to what extent each semiconductor element can be miniaturized. However, even if a technique for forming a fine pattern in the deep submicron range were developed, the above-described problems of the short channel effects would be fatal obstructions to the miniaturization of semiconductor elements.

The IC memories that perform data storage and holding in computers are generally classified into the RAM and the ROM. Examples of the RAM (random access memory) are the DRAM (dynamic RAM) and the SRAM (static RAM). If the power is turned off, data stored in the DRAM or the SRAM are lost.

On the other hand, examples of the ROM (read-only memory) are the mask ROM and the PROM (programmable ROM). The mask ROM and the PROM have an advantage that even if the power is turned off, data stored there are not lost. The PROM is classified into the EPROM (erasable PROM) in which data erasure is performed by using ultraviolet light, the EEPROM (electrically erasable PROM) in which data erasure is performed electrically, the flash memory (flash EEPROM) in which data erasure is performed en bloc electrically, and other types.

To fully utilize their marked advantage of permanent data holding, studies and developments on nonvolatile memories have been made energetically. At present, the possibility of using nonvolatile memories instead of magnetic memories is being discussed.

As for such IC memories, it is necessary to not only improve the reliability and performance but also increase the storage capacity. That is, as in the case of other types of ICs, such memory ICs are being developed according to the scaling law while miniaturization techniques are always adopted.

However, since basically nonvolatile memories store data according to the same principle of operation as field-effect transistors (hereinafter referred to as FETs), the short channel effect, which is known as causing serious problems in the FET operation, also causes serious problems in the operation of nonvolatile memories as the miniaturization advances.

In particular, the phenomenon called "punch-through" decreases the source-drain breakdown voltage and hence makes the current control with the gate electrode difficult. A SSW-DSA structure (Nikkei Microdevices, pp. 47-48, May issue, 1992) is a conventional example of increasing the punch-through resistance.

In the field of the FET, the SSW-DSA structure is a structure that utilizes a technique called a pocket structure in which an impurity region having the same conductivity type as the substrate is provided in the channel-drain junction portion. This structure can prevent the occurrence of a punch-through phenomenon by suppressing the expansion of the drain depletion layer.

However, in nonvolatile memories, electron-hole pairs are generated by positively causing impact ionization in the channel-drain junction portion. Therefore, a large amount of holes flow to the substrate side as electrons are injected into the floating gate.

However, in the SSW-DSA structure, a large amount of holes thus generated act in no other way than flow into the substrate terminal. This may cause a problem that a parasitic source-substrate-drain bipolar is formed to cause a kink phenomenon (an abnormal increase in drain current).

SUMMARY OF THE INVENTION

The present invention has been made to solve the above problems in the art, and an object of the invention is therefore to provide a technique for effectively suppressing the short channel effects due to miniaturization of semiconductor elements. The invention is intended to enable formation of very small elements in the deep submicron range which have been difficult to form conventionally due to the short channel effects.

According to the invention, there is provided an insulated-gate semiconductor device having a SOI structure, comprising a source region, a drain region, and a channel forming region that are formed by using a crystalline semiconductor formed on an insulative substrate or an insulating layer: and a gate insulating film and a gate electrode formed on the channel forming region, the channel forming region comprising carrier movement regions; and impurity regions formed artificially and locally for pinning of a depletion layer developing from the drain region toward the channel forming region and the source region, the impurity regions containing an impurity element for shifting an energy band in such a direction that movement of electrons is obstructed.

Further, there is provided an insulated-gate semiconductor device having a SOI structure, comprising a source region, a drain region, and a channel forming region that are formed by using a crystalline semiconductor formed on an insulative substrate or an insulating layer; and a gate insulating film and a gate electrode formed on the channel forming region, the channel forming region comprising carrier movement regions; and impurity regions formed artificially and locally for pinning of a depletion layer developing from the drain region toward the channel forming region and the source region, the impurity regions containing an impurity element for shifting an energy band in such a direction that movement of holes is obstructed.

Further, there is provided an insulated-gate semiconductor device having a SOI structure, comprising a source region, a drain region, and a channel forming region that are formed by using a crystalline semiconductor formed on an insulative substrate or an insulating layer; and a gate insulating film and a gate electrode formed on the channel forming region, the channel forming region comprising carrier movement regions; and impurity regions formed artificially and locally by adding an impurity element to control a threshold voltage to a given value, the impurity element shifting an energy band in such a direction that movement of electrons is obstructed.

Still further, there is provided an insulated-gate semiconductor device having a SOI structure, comprising a source region, a drain region, and a channel forming region that are formed by using a crystalline semiconductor formed on an insulative substrate or an insulating layer; and a gate insulating film and a gate electrode formed on the channel forming region, the channel forming region comprising carrier movement regions; and impurity regions formed artificially and locally by adding an impurity element to control a threshold voltage to a given value, the impurity element shifting an energy band in such a direction that movement of holes is obstructed.

According to another aspect of the invention, there is provided a manufacturing method of an insulated-gate semiconductor device having an SOI structure, comprising the steps of forming a crystalline semiconductor on an insulative substrate or an insulating layer; forming a source region, a drain region, and a channel forming region by using the crystalline semiconductor; forming impurity regions artificially and locally in the channel forming region so that the channel forming region includes carrier movement regions and the impurity regions by adding, to the channel forming region, an impurity element for shifting an energy band in such a direction that movement of electrons is obstructed; and forming a gate insulating film and a gate electrode on the channel forming region.

Further, there is provided a manufacturing method of an insulated-gate semiconductor device having an SOI structure, comprising the steps of forming a crystalline semiconductor on an insulative substrate or an insulating layer; forming a source region, a drain region, and a channel forming region by using the crystalline semiconductor; forming impurity regions artificially and locally in the channel forming region so that the channel forming region includes carrier movement regions and the impurity regions by adding, to the channel forming region, an impurity element for shifting an energy band in such a direction that movement of holes is obstructed; and forming a gate insulating film and a gate electrode on the channel forming region.

The main point of the invention is to effectively suppress a depletion layer developing from the drain region toward the channel forming region by the impurity regions that are formed artificially and locally in the channel forming region, to thereby prevent various problems of the short channel effects such as the punch-through phenomenon, deterioration of the subthreshold characteristic, and decrease in breakdown voltage.

The present inventors call a device according to the invention a "pinning semiconductor device" based on an analogy to formation of pins (corresponding to the impurity regions) in the channel forming regions. In this specification, "pinning" means "prevention" and the verb "to pin" is used to mean "to prevent."

That is, the impurity regions are formed locally in the channel forming region and utilized as energy barriers. By utilizing the impurity regions as energy barriers, the drain region side depletion layer is prevented, in terms of energy, from expanding toward the channel forming region side, whereby an electric field formed in the channel forming region is allowed to be controlled only by the gate voltage.

In the invention, the impurity regions are formed by using an impurity element that shifts the energy band in such a direction that the movement of carriers (electrons or holes) is obstructed. In the case of an n-channel FET, an element belonging to group 13 (typically, boron) may be used as such an impurity element. In the case of a p-channel FET, an element belonging to group 15 (typically, phosphorus or arsenic) may be used as such an impurity element.

The impurity regions formed by adding the above impurity element can shift the energy band of the channel forming region, and thereby change the threshold voltage to the positive or negative side. Therefore, the concentration of the added impurity element should be at least a level that enables threshold voltage control (typically $1 \times 10^{17}$ to $1 \times 10^{20}$ atoms/cm$^3$, and preferably $1 \times 10^{18}$ to $1 \times 10^{19}$ atoms/cm$^3$).

To enable the impurity regions to control the threshold voltage, the concentration of the impurity element should be at least about 100 times the substrate impurity concentration (in a typical single crystal silicon substrate, about $1\times10^{15}$ atoms/cm$^3$). Therefore, the lower limit of the concentration is set at $1\times10^{17}$ atoms/cm$^3$. Further, a concentration higher than $1\times10^{20}$ atoms/cm$^3$ is not preferable because of an increased load on a device.

The added impurity element causes formation of high energy barriers. For example, when boron (B) which an impurity element for imparting p-type conductivity is added to an n-channel FET, an energy band of a channel forming region shown in FIG. 22A is changed to one shown in FIG. 22B in which a barrier ΔE (called a diffusion potential difference or a built-in potential difference) is formed as a result of a shift of the Fermi level (Ef). The built-in potential difference shown in FIG. 22B serves as an energy barrier that obstructs movement of electrons, i.e., majority carriers of the n-channel FET.

Naturally, the shift of the Fermi level results in a shift of the energy band in the channel forming region. The impurity regions which are the feature of the invention have a conductivity type opposite to that of the other regions; although having low conductivity, they can sufficiently serve as energy barriers.

Similarly, when phosphorus (P) or arsenic (As) which is an impurity element for imparting p-type conductivity is added to a p-channel FET, an energy band of a channel forming region shown in FIG. 22C is changed to one shown in FIG. 22D. The built-in potential difference shown in FIG. 22D serves as an energy barrier that obstructs movement of holes, i.e., majority carriers of the p-channel FET.

In the invention, the fact that the "carrier movement regions" are intrinsic or substantially intrinsic is an important feature characteristic of a semiconductor device having a SOI structure. In this specification, the term "intrinsic region" means a region not containing any impurity elements such as a single crystal silicon layer epitaxially grown on a sapphire substrate, or a region to which neither an impurity element for imparting n-type or p-type conductivity nor an impurity element such as carbon, nitrogen, or oxygen is added intentionally.

The term "substantially intrinsic region" means a region in a crystalline semiconductor (typically single crystal silicon in this specification) in which region a conductivity type that occurs even without intentionally adding any impurity elements for imparting n-type or p-type conductivity is canceled out, or a region which exhibits the same conductivity type as the source and drain regions to such an extent that threshold voltage control is possible.

As for the substantially intrinsic region, in the vicinity of the surface of a crystalline semiconductor (crystalline silicon) the concentration of an impurity element (phosphorus or boron) for imparting one type of conductivity is less than $5\times10^{15}$ atoms/cm$^3$ (preferably less than $5\times10^{14}$ atoms/cm$^3$) and the oxygen concentration is less than $2\times10^{18}$ atoms/cm$^3$ (preferably less than $1\times10^{17}$ atoms/cm$^3$.

The term "in the vicinity of the surface of a crystalline semiconductor" means a region capable of functioning as part of a device, and is a single crystal layer of a SOI substrate or a region including at least a carrier moving region (inversion layer), for instance. Since naturally the impurity regions which are the feature of the invention contain a large number of impurity elements, as a matter of course the concentration thereof do not fall within the above-mentioned range.

In this specification, single crystal silicon is used as a typical example of a crystalline semiconductor. The term "single crystal silicon" covers not only single crystal silicon that is commonly used in current manufacture of Ies and LSIs but also single crystal silicon of a higher level (in an extreme case, an ideal one as manufactured in the outer space).

The SOI structure is generally classified into two structures: one structure in which a single crystal silicon layer is grown on an insulative substrate, as typified by a SOS substrate; and the other structure in which an insulating layer is formed in a single crystal silicon substrate, as typified by a SIMOX substrate and a wafer bonding SaI structure. In particular, the SIMOX substrate is the mainstream of the SOI structure after the year 1986.

The invention is applicable to all types of SOI substrates irrespective of their manufacturing methods. That is, in manufacturing a semiconductor device according to the invention, a manufacturer can determine, as desired, how to manufacture an SOI substrate or obtain a single crystal silicon layer.

The present invention has been made in view of the above problems, and another object of the invention is therefore to realize a high-performance memory by effectively preventing or weakening the short channel effect that occurs in miniaturizing nonvolatile memories.

According to a first aspect of the invention, there is provided a nonvolatile memory comprising a source region, a drain region, and an active region that are formed by using a single crystal semiconductor; impurity regions provided locally in the active region; and an intrinsic or substantially intrinsic channel forming region interposed between the impurity regions.

According to a second aspect of the invention, there is provided a nonvolatile memory comprising a substrate having an insulating surface; a source region, a drain region, and an active region that are formed over the substrate by using a semiconductor thin film that is a single crystal or is substantially regarded as a single crystal; impurity regions provided locally in the active region; and an intrinsic or substantially intrinsic channel forming region interposed between the impurity regions.

According to a third aspect of the invention, there is provided a nonvolatile memory comprising a source region, a drain region, and an active region that are formed by using a single crystal semiconductor; impurity regions provided locally in the active region by adding an impurity element that is a group-13 or group-15 element; and an intrinsic or substantially intrinsic channel forming region interposed between the impurity regions.

According to a fourth aspect of the invention, there is provided a nonvolatile memory comprising a source region, a drain region, and an active region that are formed by using a single crystal semiconductor; impurity regions provided locally in the active region by adding an impurity element that is a group-13 or group-15 element, the impurity regions serving to prevent a depletion layer from expanding from the drain region toward the source region; and an intrinsic or substantially intrinsic channel forming region interposed between the impurity regions.

According to a fifth aspect of the invention, there is provided a nonvolatile memory comprising a substrate having an insulating surface; a source region, a drain region, and an active region that are formed over the substrate by using a semiconductor thin film that is a single crystal or is substantially regarded as a single crystal; impurity regions provided locally in the active region by adding an impurity element that is a group-13 or group-15 element; and an intrinsic or substantially intrinsic channel forming region interposed between the impurity regions.

According to a sixth aspect of the invention, there is provided a nonvolatile memory comprising a substrate having an insulating surface; a source region, a drain region, and an active region that are formed over the substrate by using a semiconductor thin film that is a single crystal or is substantially regarded as a single crystal; impurity regions provided locally in the active region by adding an impurity element that is a group-13 or group-15 element, the impurity regions serving to prevent a depletion layer from expanding from the drain region toward the source region; and an intrinsic or substantially intrinsic channel forming region interposed between the impurity regions.

In the above nonvolatile memories, it is preferable that the impurity regions be provided in striped form so as to reach both of the source region and the drain region.

In the above nonvolatile memories, it is preferable that an impurity element contained in the impurity regions have a concentration that is $1 \times 10^{17}$ to $5 \times 10^{20}$ atoms/cm$^3$.

In the above nonvolatile memories, it is preferable that the substrate be a crystallized glass substrate provided with an insulating film on a surface thereof.

It is effective to use any of the above nonvolatile memories as a recording medium.

The main feature of the invention is that impurity regions are formed locally in the active region and the impurity regions prevent a depletion layer from expanding from the drain region toward the source region. In this specification, a region that is enclosed by a source region, a drain region, and field oxide films is called an active region and the active region is divided into striped impurity regions and channel forming regions.

Since the effect of preventing expansion of a depletion layer looks like pinning the depletion layer, the inventors define the term "pinning" as meaning "prevention" (or "suppression").

BRIEF DESCRIPTION OF THE DRAWINGS

FIGS. 17A-17E show an energy profile in a channel forming region and its vicinity according to a 13th embodiment of the present invention.

FIGS. 23A-23C show the structure of a channel forming region of an IG-FET according to the present invention;

FIGS. 24A and 24B illustrate the operation of the IG-FET of FIGS. 1A-1C,

FIGS. 39A-39D show examples of semiconductor devices to which the invention is applied (ninth embodiment)

DETAILED DESCRIPTION OF THE PREFERRED EMBODIMENTS

Figure 1A:
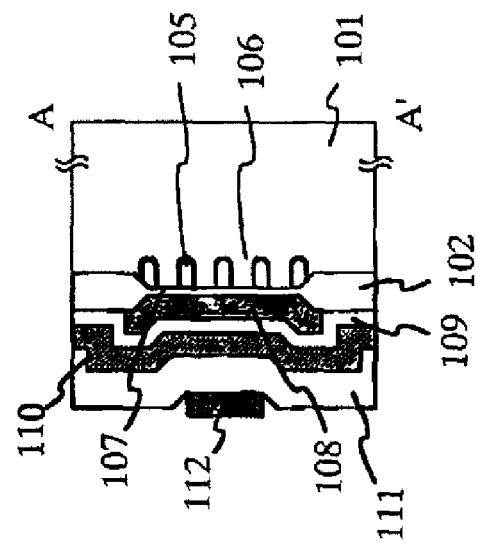
FIGS. 1A-1D show the structure of a nonvolatile memory according to a first embodiment of the present invention.
Figure 1B:
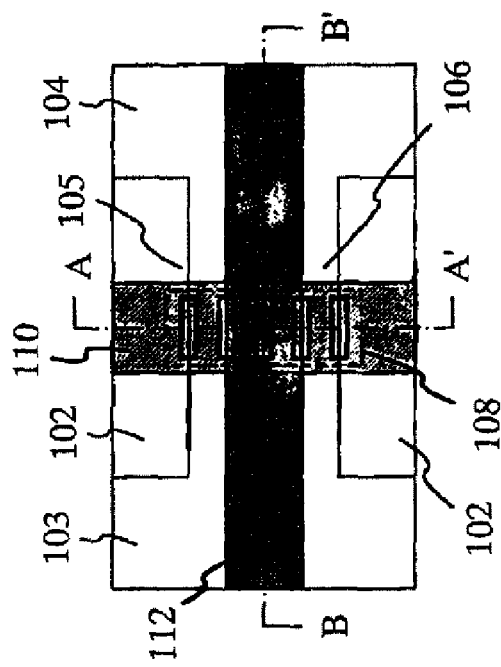

The present invention will be hereinafter described in detail by using embodiments.

Embodiment 1

This embodiment will be described with reference to FIGS. 1A-1D, which are a top view, sectional views, and a circuit representation of a non-volatile memory to which the invention is applied. This embodiment is directed to an EEPROM having a basic stacked structure.

In FIGS. 1A-1D, reference numeral 101 denotes a single crystal silicon (p-type silicon) substrate; 102, field oxide films formed by a LOCOS method; 103, a source region to which arsenic (or phosphorus) is added; and 104, a drain region. Although this is an example structure of an n-type EEPROM, it is also possible to construct a p-type EEPROM. A p-type EEPROM can be constructed by forming source and drain regions by adding boron to an n-type silicon substrate.

Reference numeral 105 denotes impurity regions (hereinafter referred to as pinning regions) that are the most important feature of the invention. The pinning regions 105 are formed by adding an impurity having the same conductivity type as the silicon substrate 101. In the example of FIGS. 1A-1D, since the p-type silicon substrate 101 is used, the pinning regions 105 are formed by adding an element selected from group-13 elements (typically boron). Naturally, where an n-type silicon substrate is used (a p-type EEPROM is to be manufactured), pinning regions may be formed by adding an element selected from group-15 elements.

The element selected from group-13 or group-15 elements shifts the energy band of single crystal silicon and thereby acts as an energy barrier to carriers (electrons or holes). In this sense, the pinning regions can also be called energy-banded-shifted regions. Elements other than the group-13 and group-15 elements can also be used as long as they have such an effect.

Figure 2A:
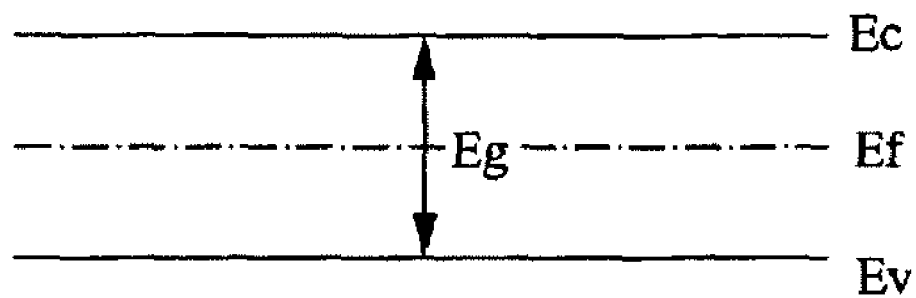
FIGS. 2A-2C illustrate changes of an energy band according to a first embodiment of the present invention.
Figure 2B:
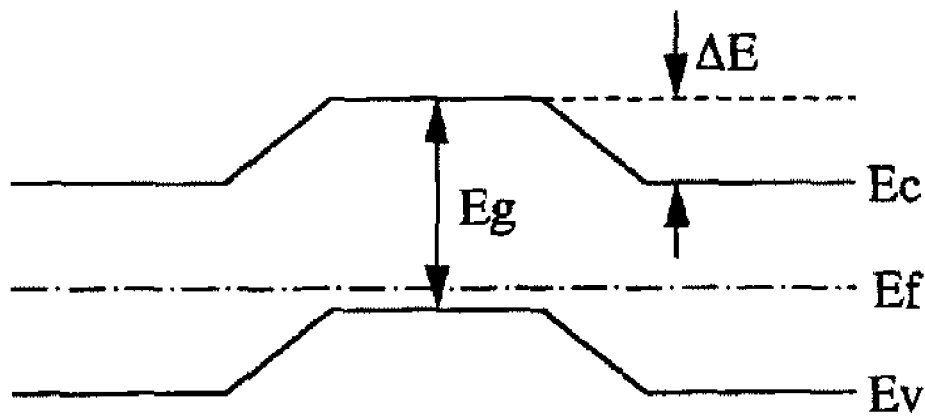

The effect of adding an energy-band-shifting element will be described below with reference to conceptual diagrams of FIGS. 2A-2C. FIG. 2A shows an energy band of single crystal silicon. If an impurity element (an element selected from group-13 elements) that shifts the energy band in such a direction as to obstruct the movement of electrons is added to single crystal silicon, the energy band is changed to a state as shown in FIG. 2B.

In the impurity-added region, although no change occurs in the energy band gap, the Fermi level (Ef) is moved to the valence band (Ev) side. As a result, the energy is shifted upward in appearance and hence an energy barrier having higher energy than the undoped regions by ΔE (for electrons) is formed.

Figure 2C:
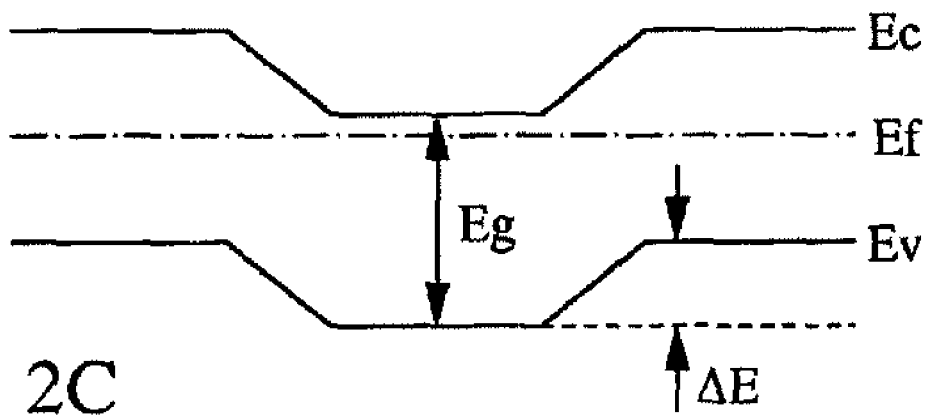

If an impurity element (an element selected from group-15 elements) that shifts the energy band in such a direction as to obstruct the movement of holes is added to single crystal silicon, the energy band is changed to a state as shown in FIG. 2C.

In the impurity-added region, the Fermi level is moved to the conduction band (Ec) side. As a result, the energy is shifted downward in appearance and hence an energy barrier having higher energy than the undoped regions by ΔE (for holes) is formed.

As described above, an energy difference of ΔE occurs between the undoped regions where the impurity is not added and the pinning regions 105. The height of the energy (i.e., potential) barrier depends on the concentration of the added impurity element. In the invention, the impurity element concentration is adjusted in a range of $1 \times 10^{17}$ to $5 \times 10^{20}$ atoms/cm$^3$ (preferably $1 \times 10^{18}$ to $5 \times 10^{19}$ atoms/cm$^3$).

Since the formation of the pinning regions 105 is enabled by microprocessing technology, it is necessary to use an impurity adding method suitable for microprocessing, such as ion implantation or an FIB (focused ion beam) method. Where an impurity adding method using a mask is employed, it is desirable to use microprocessing, for instance, forming a mask pattern by electron beam lithography.

Most typically, the pinning regions 105 are formed in such a manner that the pinning regions 105 are approximately parallel with channel forming regions 106 and the pinning regions 105 and the channel forming regions 106 are arranged alternately as shown in FIG. 1A. That is, it is preferable to form a plurality of striped pinning regions 105 in a region (active region) enclosed by the source region 103, the drain region 104, and the field oxide films 102.

It is effective to form pinning regions 105 at side end portions of the active region where the active region is in contact with the field oxide films 102. The formation of pinning regions 105 at the side end portions can reduce leak current that passes through the side end portions.

It is sufficient to form the pinning regions 105 so that they at least reach the junction portion of the active region and the drain region 104 (i.e., the drain junction portion). The intended effect can be obtained by preventing the expansion of the depletion layer at the drain junction portion because the depletion layer that causes the punch-through phenomenon develops from the drain junction portion. That is, the expansion of the depletion layer can be suppressed by forming dot-like or elliptical pinning regions 105 in the active region so that part of them exist in the drain junction portion.

Naturally, a more effective pinning effect can be obtained by forming the pinning regions 105 so that they reach both of the source region 103 and the drain region 104 as shown in FIG. 1A.

It is desirable that the implantation depth of the pinning regions 105 be greater than the junction depth of the source region 103 and the drain region 104. Therefore, it is necessary the implantation depth be 0.1-0.5 μm (preferably 0.2-0.3 μm).

Figure 3:
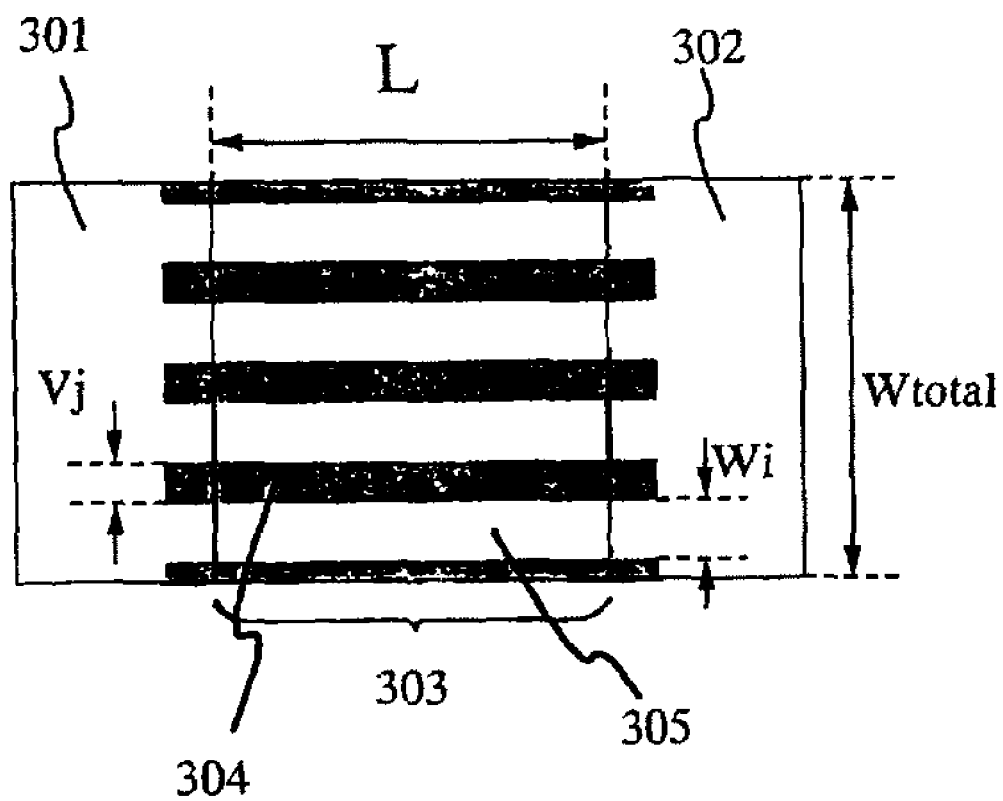
FIG. 3 illustrates definitions of a channel length and a channel width according to first and second embodiments of the present invention.

Now, the channel length and the channel width will be defined with reference to FIG. 3. In FIG. 3, the distance between a source region 301 and a drain region 302 (i.e., the length of an active region 303) is defined as a channel length L. The invention is effective in a case where the channel length L is 2 μm or less, typically 0.05-0.5 μm and preferably 0.1-0.3 μm. The direction along the channel length L is called a channel length direction.

The width of an arbitrary pinning region 304 is called a pinning width $v_j$. The pinning width $v_j$ may be set to 1 μm or less, typically 0.01-0.2 μm and preferably 0.05-0.1 μm. An effective pinning width V that is the sum of the widths of all pinning regions 304 existing in the active layer 303 is defined as $$V = \sum_{j=1}^{n} v_j$$

To obtain the pinning effect, it is necessary to form at least one pinning region 304 in the active region 303; that is, a condition n=1 or more needs to be satisfied. Where pinning regions 304 are formed at the side end portions (adjoining field oxide films) of the active region 303, a condition n=2 or more needs to be satisfied.

The width of a channel forming region 305 is called a channel width $w_i$. The channel width $w_i$ can be set to any value. For memories in which large current is not required, the channel width $w_i$ may be set to 1 μm or less, typically 0.05-0.5 μm and preferably 0.1-0.3 μm.

An effective channel width W that is the sum of all channel widths $w_i$ is defined as $$W = \sum_{i=1}^{m} w_i$$

Where the pinning regions 304 are formed only at the side end portions of the active region 303, m=1 is satisfied. A more effective pinning effect can be obtained by forming pinning regions 304 also in regions other than the side end portions of the active region 303. In such a case, m becomes 2 or more.

A total channel width $W_{total}$ that is the sum of the sum of the widths of all pinning regions 304 (i.e., the effective pinning width) and the sum of the widths of all channel forming regions 305 (i.e., the effective channel width) is defined as $$W_{total} = V + W$$

The total channel width $W_{total}$ corresponds to the width of the active region 303 (i.e., the length of the active region 303 in the direction perpendicular to the channel length direction). The direction along the total channel width $W_{total}$ is called a channel width direction.

Since the invention is intended to be applied to nonvolatile memories having an extremely short channel length as mentioned above, the pinning regions 304 and the channel forming regions 305 need to be formed so as to have extremely small dimensions.

Returning to FIGS. 1A-1D, it is preferable that the impurity element that has been added to the pinning region 105 be activated by furnace annealing, laser annealing, lamp annealing, or the like. The activation may be performed at the same time as annealing in a later step such as a step of forming a gate insulating film, or independently of such annealing.

The invention is characterized in that pinning regions are formed locally (i.e., in striped form) in a region of a conventional nonvolatile memory that serves as a channel forming region. Therefore, the other structures of the conventional nonvolatile memory can be employed as they are.

That is, a tunnel oxide film 107 is also formed on the single crystal silicon substrate 101 on which the source region 103, the drain region 104, and the pinning regions 105 are formed. The tunnel oxide film 107, which is formed by a thermal oxidation step, is required to have high film quality. In this embodiment, the thickness of the tunnel oxide film 107 is set to 11 nm. It goes without saying that the thickness of the tunnel oxide film 107 is not limited to this value.

In this embodiment, the pinning regions 105 may be formed even after the formation of the tunnel oxide film 107.

Figure 1C:
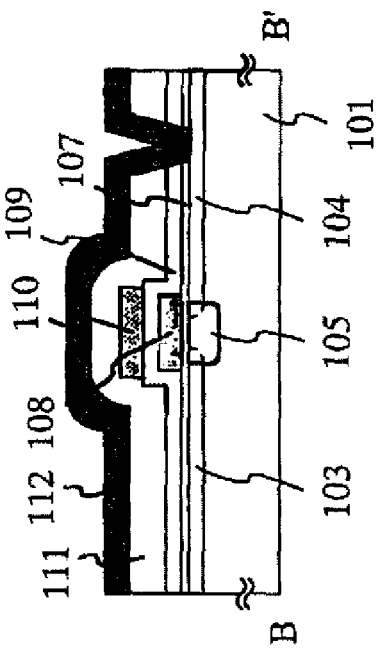

A first polysilicon layer as a floating gate 108 is formed on the tunnel oxide film 107. It is important to construct so that as shown in FIG. 1C the end portions of the floating gate 108 overlap the junction portions of the pinning portions 105 and the drain region 104.

A large amount of hot electrons are generated by concentrated electric fields at the above junction portions. Therefore, hot electrons can be injected at high efficiency by covering those junction portions with the floating gate 108.

After the formation of the floating gate 108, a first interlayer film 109, a second polysilicon layer as a control gate 110, a second interlayer film 111, and a bit line 112 are formed.

Naturally, a conductive layer such as a metal film can be used instead of the polysilicon layer. It is also effective to use, as the interlayer film, a laminated film as expressed by $SiO_2$/SIN/$SiO_2$ (commonly called an ONO film).

Figure 1D:
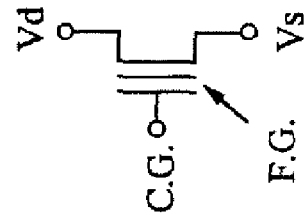

The two-layer polysilicon EEPROM of this embodiment is given a circuit representation shown in FIG. 1D, in which Vd denotes a drain voltage, Vs denotes a source voltage, C.G. denotes a control gate voltage, and F.G. denotes a potential of the floating gate 108.

In the EEPROM of this embodiment, the following voltages are applied at the time of data writing and erasure.

TABLE 1

| Mode | Vd | $V_{CG}$ | Vs | Mechanism |
|---|---|---|---|---|
| Writing | 6 | 12 | 0 | Hot electron injection |
| Erasure | — | 0 | 12 | F-N tunneling erasure |
| Reading | ~1 | 5 | 0 | — |

Naturally, the operation voltages are not limited to the values of Table 1. Further, the invention is not limited to the structure of the first embodiment and can be applied to any kinds of EEPROMs in which data is erased electrically.

FUNCTIONS AND ADVANTAGES OF THE INVENTION

A first advantage of the invention will be described below. In FIGS. 1A-1D, the pinning regions 105 that are formed in the active region serve as stoppers with respect to the depletion layer that develops from the drain side and effectively suppress expansion of the depletion layer. Therefore, the punch-through phenomenon that is caused by expansion of the depletion layer can be prevented. Further, since an increase of depletion layer charge due to expansion of the depletion layer is suppressed, a reduction in threshold voltage can be prevented.

Next, a second advantage will be described. In the invention, the narrow channel effect can be enhanced intentionally by the pinning regions. The narrow channel effect, which is a phenomenon observed when the channel width is extremely narrow, causes an increase in threshold voltage (refer to Koyanagi et al., "Submicron Devices I," pp. 88-138, Maruzen Co., Ltd., 1987).

Figure 4:
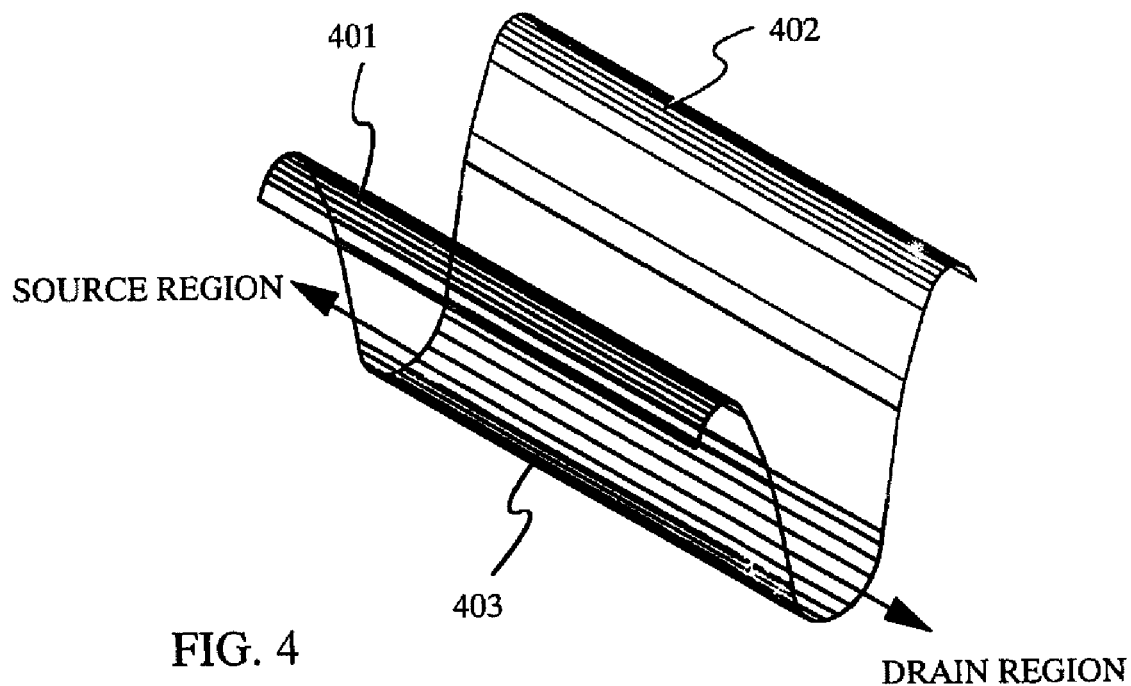
FIGS. 4 and 5 illustrate energy profiles in an active region according to a first embodiment of the present invention.

FIG. 4 shows an energy profile (potential profile) of the active region of the EEPROM of this embodiment operates. In FIG. 4, regions 401 and 402 represent the energy of pinning regions 105 and a region 403 represents the energy of a channel forming region 106.

As seen from FIG. 4, the pinning regions 105 form high-energy barriers and the channel forming regions 106 form low-energy regions. Therefore, carriers move through the channel forming regions 106 with priority where the energy is low.

In this manner, high-energy barriers are formed in the pinning regions 105 and the threshold voltage increases there. As a result, a threshold voltage that is observed as a value of the entire EEPROM also increases. This narrow channel effect becomes more remarkable as the effective channel width W decreases.

As described above, in the invention, since the concentration of an impurity that is added to the pinning regions 105 and the effective channel width W can be designed freely, the threshold voltage can be adjusted by controlling the degree of the narrow channel effect. That is, by properly controlling the pinning effect, the threshold voltage can be adjusted to a desired value by balancing a threshold voltage decrease due to the short channel effect with a threshold voltage increase due to the narrow channel effect.

Since a group-13 element is added to the pinning regions 105 in an n-type device and a group-15 element is added in a p-type device, the threshold voltage is shifted in the pinning regions 105 in a direction in which its absolute value increases (in the positive direction in an n-type device and in the negative direction in a p-type device). Since the threshold voltage increases locally, the threshold voltage of the entire device increases accordingly. Therefore, to adjust the threshold voltage to a desired value, it is important to set the concentration of an impurity that is added to the pinning regions 105 at a proper value.

Incidentally, in nonvolatile memories, discrimination between "0" and "1" is made by changing the threshold voltage by injecting charge (mainly electrons) into the floating gate and detecting whether current flows through the bit line when a certain voltage is applied. Therefore, if the threshold voltage is made unduly small by the short channel effect, it becomes necessary to discriminate between "0" and "1" by applying a very small voltage. In this case, the device becomes prone to be influenced by noise or the like and the possibility of occurrence of an erroneous operation increases.

In contrast, in the invention, since the threshold voltage can be controlled to have a desired value by decreasing a threshold voltage reduction, the ability of discriminating between "0" and "1" is increased. Therefore, the invention can realize a nonvolatile memory having very high reliability.

Next, a third advantage will be described. The nonvolatile memory according to the invention has an advantage that majority carriers (electrons in an n-type device and holes in a p-type device) move through the channel forming regions 106 that are substantially intrinsic regions.

The term "substantially intrinsic region" basically means an undoped single crystal semiconductor region, and includes a region where conductivity type compensation is made intentionally by adding an impurity element of the opposite conductivity type, and a region having one conductivity type in a range where the threshold voltage can be controlled.

For example, it can be said that a silicon wafer having a dopant concentration of $5\times10^{16}$ atoms/cm$^3$ or less (preferably $5\times10^{15}$ atoms/cm$^3$ or less) and carbon, nitrogen, and oxygen contents of $2\times10^{18}$ atoms/cm$^3$ or less (preferably $5\times10^{17}$ atoms/cm$^3$ or less) is substantially intrinsic. In this sense, silicon wafers commonly used are substantially intrinsic unless an impurity is added intentionally in a process.

Where a carrier movement region is substantially intrinsic, a mobility reduction due to the impurity scattering is extremely small and hence high carrier mobility is obtained. Therefore, the carrier movement is dominated by the influence of the lattice scattering and a state that is very close to the ideal state is obtained.

Where the straight pinning regions 105 are formed so as to reach both of the source region 103 and the drain region 104 as shown in FIG. 1A, an advantage is obtained that movement paths of majority carriers are defined by the pinning regions 105.

As described above, each channel forming region interposed between pinning regions has an energy profile as shown in FIG. 4. The structure of FIG. 1A is regarded as an arrangement of a plurality of slits each having the energy profile of FIG. 4.

Figure 5:
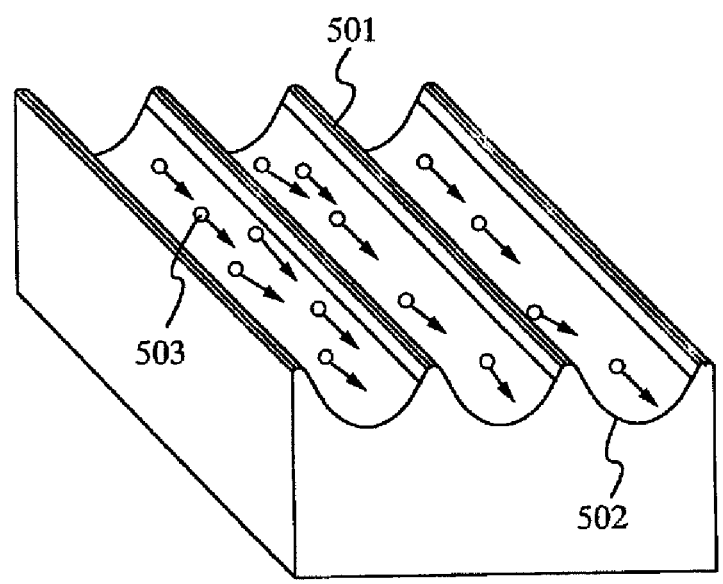

FIG. 5 schematically illustrates such a state. In FIG. 5, reference numerals 501 and 502 denote pinning regions and channel forming regions, respectively. As shown in FIG. 5, majority carriers (electrons or holes) 503 cannot go over the pinning regions 501 and hence move through the channel forming regions 502 with priority. That is, the movement paths of majority carriers 503 are defined by the pinning regions 501.

Defining the movement paths of majority carriers decreases the degree of scattering due to self-collision of carriers, which greatly contributes to mobility increase. Further, since only a very small amount of impurity elements exist in the substantially intrinsic channel forming regions, the velocity overshoot effect occurs, which is a phenomenon that the electron mobility becomes higher than usual even at room temperature (refer to K. Ohuchi et al., Jpn. J. Appl. Phys., Vol. 35, p. 960, 1996). Therefore, the mobility becomes extremely high.

High carrier mobility that is obtained as described above is effective in shortening the charge write time and the charge read time, thereby increasing the memory performance. High carrier mobility means presence of carriers having high energy, and hence the charge writing efficiency is greatly increased by channel hot electron (CHE) injection.

Next, a fourth advantage of the invention will be described. Where the structure of the invention is employed, an electric field is concentrated to a large extent at the junction portions (typically, a p$^+$/n$^{++}$ junction or an n$^+$/p$^{++}$ junction is formed) of the pinning regions and the drain region. Therefore, there occur a large amount of electrons that are given high energy through acceleration or generated by impact ionization (collectively called hot electrons).

Therefore, charge injection into the floating gate is performed very efficiently and hence the data write time can be shortened; specifically, it is reduced to 1/10 to 1/100 of that of conventional cases. By utilizing the invention, the data write time of a 256 Mbit stacked flash memory, which will be realized in the future, can be made 10 ns/byte or less, preferably 0.01-1 ns/byte.

Since this means realization of a data write operation faster than that of magnetic memories, it becomes possible to replace all kinds of current hard disks that are magnetic memories with flash memories. Since very small chips of flash memories will have functions equivalent to those of conventional magnetic memories, the miniaturization and the price reduction of devices will be accelerated.

The invention is also effective in decreasing the voltage necessary for data writing (i.e., the write voltage). Specifically, by virtue of accelerated hot electron injection due to concentrated electric fields at the pinning regions/drain junction portions, charge of the same amount as in conventional cases can be injected by a write voltage that is 1/2 to 1/10 of conventional values.

Therefore, while current stacked flash memories requires a write voltage of about 10 V, the invention can realize a write voltage of 5 V or less, preferably about 1-3 V.

As described above, the hot electron inject efficiency at the drain junction portions can be increased by forming the pinning regions. This is effective in reducing the power consumption and increasing the degree of freedom in circuit designing.

Next, a fifth advantage will be described. The fact that the pinning regions of the invention have the functions of preventing the short channel effect and controlling the threshold voltage has been described above. In addition, the pinning regions of the invention have a very important role in preventing a parasitic bipolar from being rendered conductive due to impact ionization.

Conventionally, electrons of electron-hole pairs generated by impact ionization are injected into the floating gate. On the other hand, holes flow into the substrate and cause a substrate current, which renders a parasitic bipolar conductive.

In contrast, in the invention, holes generated by impact ionization immediately move into the pinning regions and extracted to the source region via the pinning regions. Therefore, the holes do not render a parasitic bipolar conductive and hence do not lower the source-drain breakdown voltage.

It goes without saying that this effect is particularly remarkable when the pinning regions are formed so as to reach both of the source and drain regions. Holes can be extracted more efficiently if the pinning regions are in contact with a pickup electrode in the source region.

Embodiment 2

This embodiment will be described with reference to FIGS. 6A-6D, which are a top view, sectional views, and a circuit representation of a non-volatile memory according to the invention that uses a single crystal silicon substrate having a buried oxide film. This embodiment is directed to an EEPROM having a basic stacked structure.

In FIGS. 6A-6D, reference numeral 600 denotes a single crystal silicon (p-type silicon) substrate; 601, a buried oxide film; 602, field oxide films formed by a LOCOS method; 603, a source region to which arsenic (or phosphorus) is added; and 604, a drain region.

Although this is an example structure of an n-type EEPROM, it is also possible to construct a p-type EEPROM. A p-type EEPROM can be constructed by forming source and drain regions by adding boron to an n-type silicon substrate.

The single crystal silicon substrate having a buried oxide film may be a SIMOX substrate, a UNIBOND substrate (a smart cut method is used), or the like. Naturally, other types of known SOI substrates may also be used.

It is preferable that the thickness of a single crystal silicon thin film formed on the buried oxide film 601 be set to 10-100 nm (typically 30-50 nm). As the thickness decreases, the hot electron injection occurs more easily and hence the write voltage can be made smaller.

Reference numeral 605 denotes impurity regions (pinning regions) that are the most important feature of the invention. The pinning regions 605 are formed by adding an impurity having the same conductivity type as the silicon substrate 601 (i.e., the conductivity type opposite to that of the source region 603 and the drain region 604).

In this embodiment, since the p-type silicon substrate 601 is used (the single crystal silicon thin film is also p-type), the pinning regions 605 are formed by adding an element selected from group-13 elements (typically boron). Naturally, where an n-type silicon substrate is used (a p-type EEPROM is to be manufactured), pinning regions may be formed by adding an element selected from group-15 elements (phosphorus, arsenic, or the like).

The element selected from group-13 or group-15 elements shifts the energy band of single crystal silicon and thereby acts as an energy barrier to carriers (electrons or holes). In this sense, the pinning regions can also be called energy-banded-shifted regions. Elements other than the group-13 and group-15 elements can also be used as long as they have such an effect. In the invention, the impurity element concentration is adjusted in a range of $1 \times 10^{17}$ to $5 \times 10^{20}$ atoms/cm$^3$ (preferably $1 \times 10^{18}$ to $5 \times 10^{19}$ atoms/cm$^3$).

Since the formation of the pinning regions 605 is enabled by microprocessing technology, it is necessary to use an impurity adding method suitable for microprocessing, such as ion implantation or a FIB (focused ion beam) method. Where an impurity adding method using a mask is employed, it is desirable to use microprocessing, for instance, forming a mask pattern by electron beam lithography.

Figure 6B:
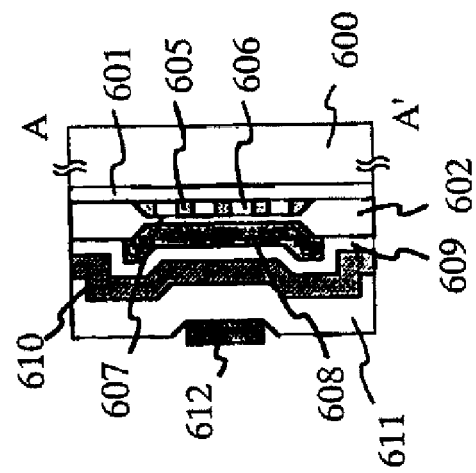
FIGS. 6A-6D show the structure of a nonvolatile memory according to a second embodiment of the invention.
Figure 6D:
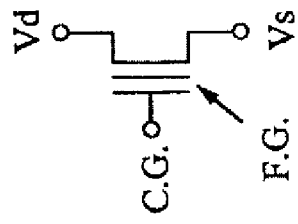
Figure 6A:
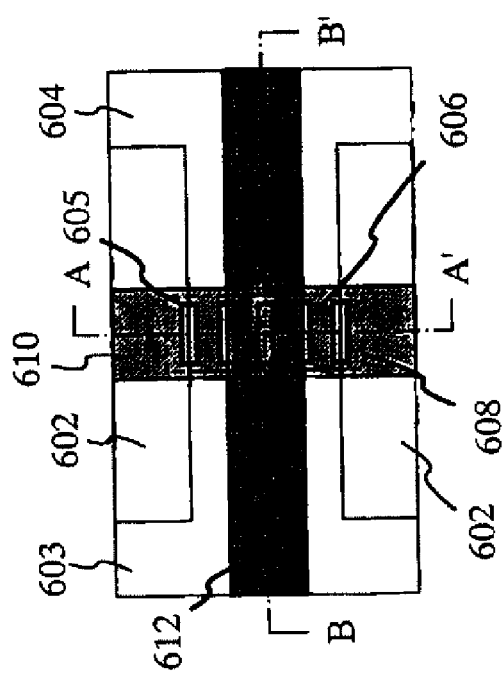

Most typically, the pinning regions 605 are formed in such a manner that the pinning regions 605 are approximately parallel with channel forming regions 606 and the pinning regions 605 and the channel forming regions 606 are arranged alternately as shown in FIG. 6A. That is, it is preferable to form a plurality of striped pinning regions 605 in a region (active region) enclosed by the source region 603, the drain region 604, and the field oxide films 602.

It is effective to form pinning regions 605 at side end portions of the active region where the active region joins to the field oxide films 602. The formation of pinning regions 605 at the side end portions can reduce leak current that passes through the side end portions.

It is sufficient to form the pinning regions 605 so that they at least reach the junction portion of the active region and the drain region 604 (i.e., the drain junction portion). The intended effect can be obtained by preventing the expansion of the depletion layer at the drain junction portion because the depletion layer that causes the punch-through phenomenon develops from the drain junction portion. That is, the expansion of the depletion layer can be suppressed by forming dot-like or elliptical pinning regions 605 in the active region so that part of them exist in the drain junction portion.

Naturally, a more effective pinning effect can be obtained by forming the pinning regions 605 so that they reach both of the source region 603 and the drain region 604 as shown in FIG. 6A.

It is desirable that the implantation depth of the pinning regions 605 be such that the pinning regions 605 reach or go into the buried oxide film 601. In this embodiment, since the thickness of the single crystal silicon thin film is set to 10-100 nm (typically 30-50 nm), the implantation depth of the pinning regions 605 may be adjusted in a range of 10-150 nm (typically 30-100 nm).

Now, the channel length and the channel width will be defined with reference to FIG. 3. In FIG. 3, the distance between a source region 301 and a drain region 302 (i.e., the length of an active region 303) is defined as a channel length L. The invention is effective in a case where the channel length L is 2 μm or less, typically 0.05-0.5 μm and preferably 0.1-0.3 μm. The direction along the channel length L is called a channel length direction.

The width of an arbitrary pinning region 304 is called a pinning width $v_j$. The pinning width $v_j$ may be set to 1 μm or less, typically 0.01-0.2 μm and preferably 0.05-0.1 μm. An effective pinning width V that is the sum of the widths of all pinning regions 304 existing in the active layer 303 is defined as $$V = \sum_{j=1}^{n} v_j$$

To obtain the pinning effect, it is necessary to form at least one pinning region 304 in the active region 303; that is, a condition n=1 or more needs to be satisfied. Where pinning regions 304 are formed at the side end portions (adjoining field oxide films) of the active region 303, a condition n=2 or more needs to be satisfied.

The width of a channel forming region 305 is called a channel width $w_i$. The channel width $w_i$ can be set to any value. For memories in which large current is not required, the channel width $w_i$ may be set to 3 μm or less, typically 0.1-2 μm and preferably 0.1-0.5 μm.

An effective channel width W that is the sum of all channel widths $w_i$ is defined as $$W = \sum_{i=1}^{m} w_i$$

Where the width of the active region 303 is extremely small, for instance, 0.3 μm or less, the number of pinning regions 304 that can be formed in the active region 303 is limited. In such a case, the pinning regions 304 may be formed only at the side end portions of the active region 303.

In such a case, the number m of channel forming regions 305 is equal to 1. A more effective pinning effect can be obtained by forming pinning regions 304 also in regions other than the side end portions of the active region 303. In such a case, m becomes 2 or more.

A total channel width $W_{total}$ that is the sum of the sum of the widths of all pinning regions 304 (i.e., the effective pinning width) and the sum of the widths of all channel forming regions 305 (i.e., the effective channel width) is defined as $$W_{total} = V + W$$

The total channel width $W_{total}$ corresponds to the width of the active region 303 (i.e., the length of the active region 303 in the direction perpendicular to the channel length direction). The direction along the total channel width $W_{total}$ is called a channel width direction.

Since the invention is intended to be applied to nonvolatile memories having an extremely short channel length as mentioned above, the pinning regions 304 and the channel forming regions 305 need to be formed so as to have extremely small dimensions.

Returning to FIGS. 6A-6D, it is preferable that the impurity element that has been added to the pinning region 605 be activated by furnace annealing, laser annealing, lamp annealing, or the like. The activation may be performed at the same time as annealing in a later step such as a step of forming a gate insulating film, or independently of such annealing.

The invention is characterized in that pinning regions are formed locally (preferably in striped form) in a region of a conventional nonvolatile memory that serves as a channel forming region. Therefore, the other structures of the conventional nonvolatile memory can be employed as they are.

That is, a tunnel oxide film 607 is also formed on the single crystal silicon thin film on which the source region 603, the drain region 604, and the pinning regions 605 are formed. The tunnel oxide film 607 is formed by a thermal oxidation step because it is required to have high film quality. In this embodiment, the thickness of the tunnel oxide film 607 is set to 11 nm. It goes without saying that the thickness of the tunnel oxide film 607 is not limited to this value.

In this embodiment, the pinning regions 605 may be formed even after the formation of the tunnel oxide film 607.

Figure 6C:
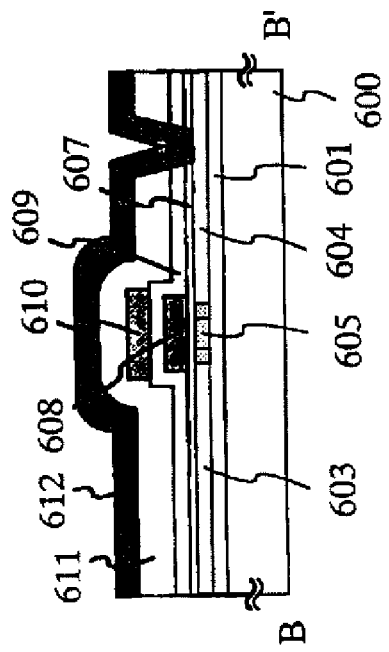

A first polysilicon layer as a floating gate 608 is formed on the tunnel oxide film 607. It is important to construct so that as shown in FIG. 6C the end portions of the floating gate 608 overlap the junction portions of the pinning portions 605 and the drain region 604.

A large amount of hot electrons are generated by concentrated electric fields at the above junction portions. Therefore, hot electrons can be injected at high efficiency by overlapping those junction portions with the floating gate 608.

After the formation of the floating gate 608, a first interlayer film 609, a second polysilicon layer as a control gate 610, a second interlayer film 611, and a bit line 612 are formed.

Naturally, a conductive layer such as a metal film can be used instead of the polysilicon layer. It is also effective to use, as the interlayer film, a laminated film as expressed by $SiO_2$/SIN/$SiO_2$ (commonly called an ONO film).

The two-layer polysilicon EEPROM of this embodiment is given a circuit representation shown in FIG. 6D, in which Vd denotes a drain voltage, Vs denotes a source voltage, C.G. denotes a control gate voltage, and F.G. denotes a potential of the floating gate 608.

In the EEPROM of this embodiment, the following voltages are applied at the time of data writing and erasure.

TABLE 1

| Mode | Vd | $V_{CG}$ | Vs | Mechanism |
| --- | --- | --- | --- | --- |
| Writing | 6 | 12 | 0 | Hot electron injection |
| Erasure | — | 0 | 12 | F-N tunneling erasure |
| Reading | ~1 | 5 | 0 | — |

Naturally, the operation voltages are not limited to the values of Table 1. Further, the invention is not limited to the structure of this embodiment and can be applied to any kinds of EEPROMs in which data is erased electrically.

Embodiment 3

The two-layer polysilicon EEPROMs of the first and second embodiments are classified into a byte erasure type (data erasure is performed on a unit memory element basis) and a flash type (data of collective memory elements are erased en bloc).

The flash EEPROM is also called the flash memory. The invention can be applied to either of the two types of EEPROMs.

There are various data erasing methods such as a source erasure type, a source/gate erasure type, and a substrate erasure type. The invention can be applied to any of those methods.

Embodiment 4

While the first and third embodiments were directed to the two-layer polysilicon EEPROM using a single crystal semiconductor, this embodiment is directed to a case where the invention is applied to a three-layer polysilicon EEPROM. This embodiment will be described below with reference to FIGS. 7A-7D.

Since an EEPROM of this embodiment has the same basic structure as the two-layer polysilicon EEPROM described in the first embodiment, the reference numerals used in FIGS. 1A-1D are also used in this embodiment. That is, for the parts shown in FIGS. 7A-7D that are given the same reference numerals as in FIGS. 1A-1D, reference is made to the descriptions that were made above in connection with FIGS. 1A-1D. In this embodiment, only the parts that are different than in the first embodiment will be given new reference numerals and described below.

Figure 7B:
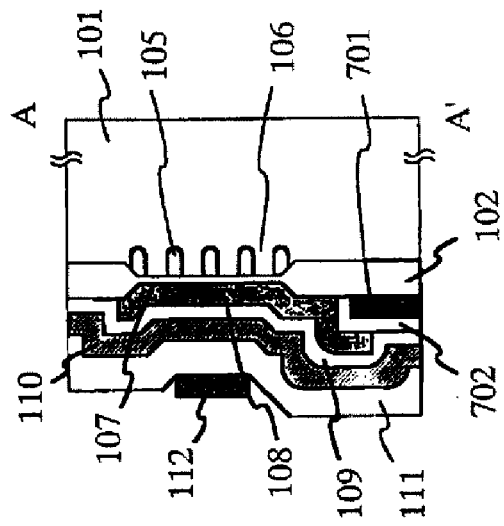
FIGS. 7A-7D show the structure of a nonvolatile memory according to a fourth embodiment of the invention.
Figure 7D:
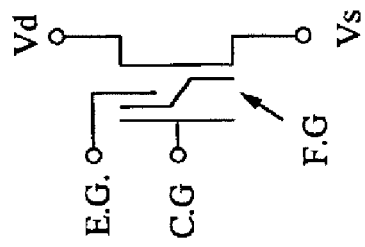
Figure 7A:
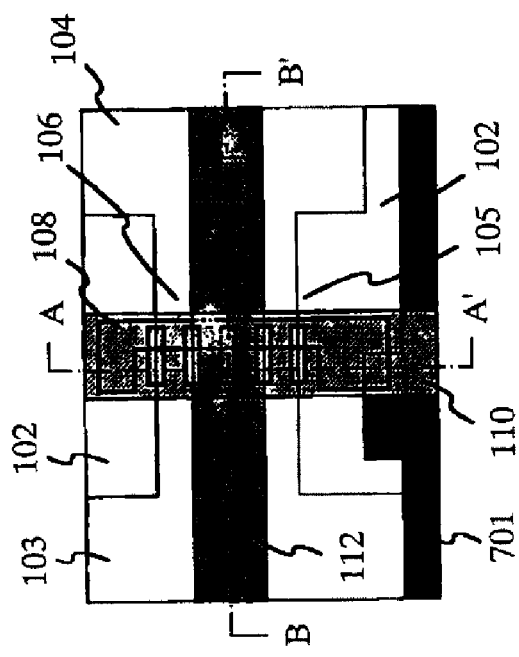
Figure 7C:
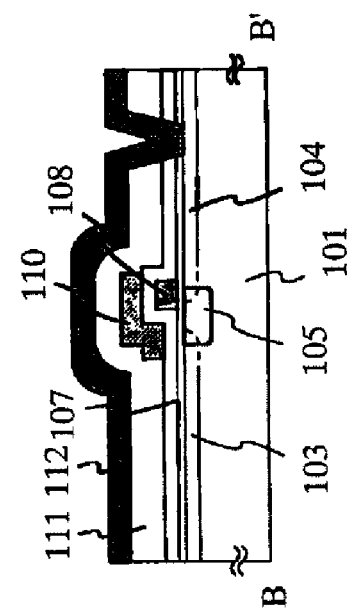

FIG. 7A is different from FIG. 1A in that an erasing gate 701 is newly provided. That is, a first polysilicon layer constitutes the erasing gate 701 and second and third polysilicon layers constitute the floating gate 108 and the control gate 110, respectively.

In the EEPROM that is configured according to the first embodiment, data erasure is performed by extracting, to the substrate side (the source region 103 or the bulk substrate 101), electrons that have been injected into the floating gate 108. In contrast, in the EEPROM that is configured according to this embodiment, data erasure is performed by extracting, to the erasing gate 701, electrons that have been injected into the floating gate 108.

Therefore, in FIG. 7B, an insulating film 702 for insulating the erasing gate 701 and the floating gate 108 from each other should be as thin as possible (preferably 8-12 nm) so as to allow a flow of tunnel current (Fowler-Nordheim current) as well as should be of such high quality as to be highly durable.

The EEPROM of this embodiment can be manufactured basically by the same process as that of the first embodiment with an exception that a step of forming the erasing gate 701 and the erasing gate insulating film 702 after formation of the pinning regions 105 is added.

An EEPROM having an erasing gate like the one of this embodiment is given a circuit representation shown in FIG. 7D, in which Vd denotes a drain voltage, Vs denotes a source voltage, E.G. denotes an erase gate voltage, C.G. denotes a control gate voltage, and F.G. denotes a floating gate potential.

In the EEPROM of this embodiment, the following voltages are applied at the time of data writing and erasure.

TABLE 2

| Mode | Vd | Vs | $V_{EG}$ | $V_{CG}$ | Mechanism |
|---|---|---|---|---|---|
| Writing | 8 | 0 | 3 | 12 | Hot electron injection into floating gate |
| Erasure | — | 0 | 20 | 0 | F-N tunneling erasure from floating gate |
| Reading | 1 | 0 | 0 | 5 | — |

Naturally, the operation voltages are not limited to the values of Table 2. Further, the invention is not limited to the structure of this embodiment and can be applied to any kinds of EEPROMs having an erasing gate structure.

Embodiment 5

While the second and third embodiments were directed to the two-layer polysilicon EEPROM using a single crystal silicon substrate having a buried oxide film, this embodiment is directed to a case where the invention is applied to a three-layer polysilicon EEPROM. This embodiment will be described below with reference to FIGS. 8A-8D.

Since an EEPROM of this embodiment has the same basic structure as the two-layer polysilicon EEPROM described in the second embodiment, the reference numerals used in FIGS. 6A-6D are also used in this embodiment. That is, for the parts shown in FIGS. 8A-8D that are given the same reference numerals as in FIGS. 6A-6D, reference is made to the descriptions that were made above in connection with FIGS. 6A-6D. In this embodiment, only the parts that are different than in the second embodiment will be given new reference numerals and described below.

Figure 8B:
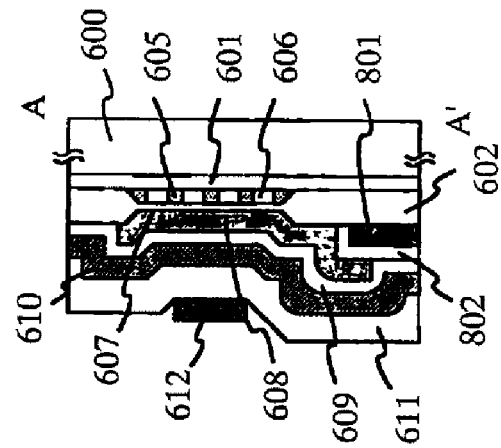
FIGS. 8A-8D show the structure of a nonvolatile memory according to a fifth embodiment of the invention.
Figure 8D:
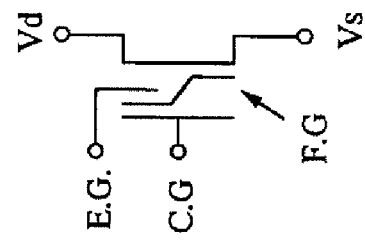
Figure 8A:
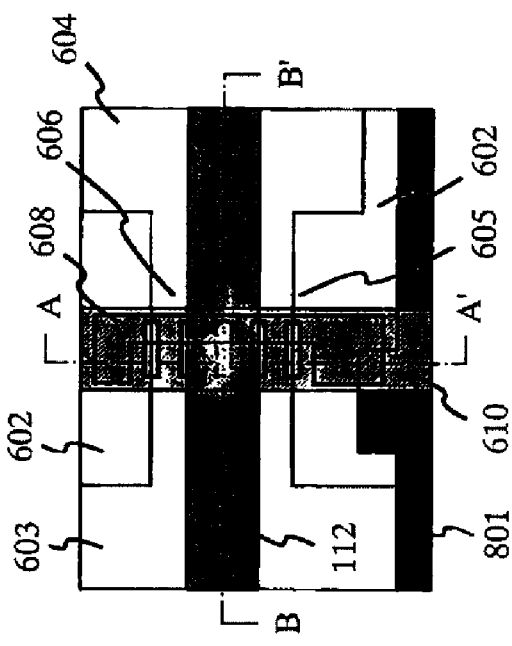
Figure 8C:
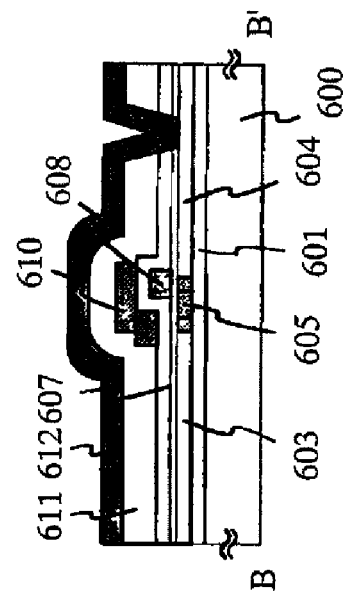

FIG. 8A is different from FIG. 6A in that an erasing gate 801 is newly provided. That is, a first polysilicon layer constitutes the erasing gate 801 and second and third polysilicon layers constitute the floating gate 608 and the control gate 610, respectively.

In the EEPROM that is configured according to the second embodiment, data erasure is performed by extracting, to the source region, electrons that have been injected into the floating gate 608. In contrast, in the EEPROM that is configured according to this embodiment, data erasure is performed by extracting, to the erasing gate 801, electrons that have been injected into the floating gate 608.

Therefore, in FIG. 8B, an insulating film 802 for insulating the erasing gate 801 and the floating gate 808 from each other should be as thin as possible (preferably 8-12 nm) so as to allow a flow of tunnel current (Fowler-Nordheim current) as well as should be of such high quality as to be highly durable.

The EEPROM of this embodiment can be manufactured basically by the same process as that of the second embodiment with an exception that a step of forming the erasing gate 801 and the erasing gate insulating film 802 after formation of the pinning regions 605 is added.

An EEPROM having an erasing gate like the one of this embodiment is given a circuit representation shown in FIG. 8D, in which Vd denotes a drain voltage, Vs denotes a source voltage, E.G. denotes an erase gate voltage, C.G. denotes a control gate voltage, and F.G. denotes a floating gate potential.

In the EEPROM of this embodiment, the following voltages are applied at the time of data writing and erasure.

TABLE 2

| Mode | Vd | Vs | $V_{EG}$ | $V_{CG}$ | Mechanism |
|---|---|---|---|---|---|
| Writing | 8 | 0 | 3 | 12 | Hot electron injection into floating gate |
| Erasure | — | 0 | 20 | 0 | F-N tunneling erasure from floating gate |
| Reading | 1 | 0 | 0 | 5 | — |

Naturally, the operation voltages are not limited to the values of Table 2. Further, the invention is not limited to the structure of this embodiment and can be applied to any kinds of EEPROMs having an erasing gate structure.

Embodiment 6

The nonvolatile memories according to the first to fifth embodiments utilize hot electron injection and Fowler-Nordheim current for data writing and erasure, respectively. This type of operation mode is called a stack mode.

The invention can also be applied to nonvolatile memories using Fowler-Nordheim current also for data writing. This type of operation mode is classified into a NAND type, an AND type, and a DINOR type.

In particular, in manufacturing a large-capacity memory of 256 Mbits or more, to improve the reliability (i.e., to elongate the life by decreasing the rate of deterioration) it is preferable to write data by using Fowler-Nordheim current.

Embodiment 7

The first embodiment was directed to the two-layer polysilicon EEPROM in which data erasure is performed electrically. On the other hand, the nonvolatile memory in which electrons that have been injected into the floating gate are extracted to the source or the substrate by exciting those by ultraviolet illumination or heating is called an EPROM. The invention can also be applied to the EPROM.

Among various kinds of EPROMs is a nonvolatile memory not using a floating gate in which a two-layer gate insulating film is provided between a control gate and a silicon substrate and hot electrons are captured by interface states of the two-layer gate insulating film. For example, a nonvolatile memory in which hot carriers are captured at the interface between a silicon oxide film and a silicon nitride film is called an NMOS nonvolatile memory.

Further, there are nonvolatile memories in which hot carriers are captured by metal clusters, silicon clusters, or the like that are formed intentionally at an interface between insulating films.

The invention can be applied to all kinds of EPROMs as exemplified above.

Embodiment 8

Since the invention is applicable to all kinds of conventional nonvolatile memories, it can be applied to all the known circuit configurations. This embodiment is directed to a case where the invention is applied to flash memories that are designed according to the NAND and NOR type architectures, respectively.

First, a description will be made of the configuration of a NAND-type memory circuit shown in FIGS. 9A and 9B, which is composed of eight memory transistors and two selection transistors.

Figure 9A:
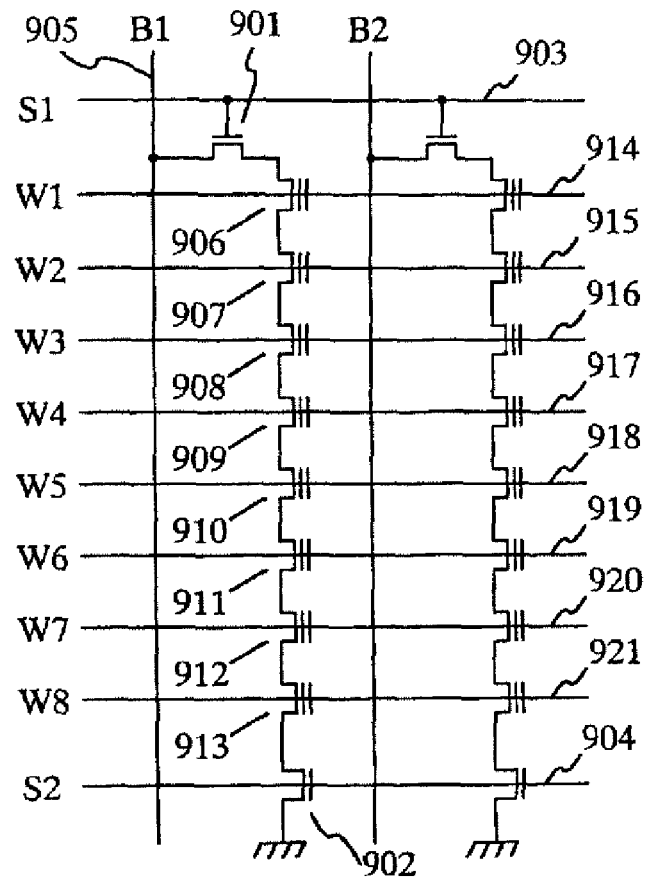
FIGS. 9A and 9B show a circuit using nonvolatile memory cells according to an eighth embodiment of the invention.

As shown in FIG. 9A, selection transistors 901 and 902 have selection lines S1 and S2 (903 and 904) as gate electrodes, respectively. The selection transistor 901 connects a bit line B1 (or B2; 905) to eight memory transistors 906-913.

Although this embodiment is directed to a case where eight memory transistors are connected to each other in series, the number of memory transistors is not limited to 8.

The selection transistor 902 is connected to a final-stage memory transistor 913. The other terminal of the selection transistor 902 is grounded. Even if it is connected to a power supply line, the memory circuit still operates properly.

The memory transistors 906-913 use word lines W1-W8 (914-921) as control gates, respectively.

Figure 9B:
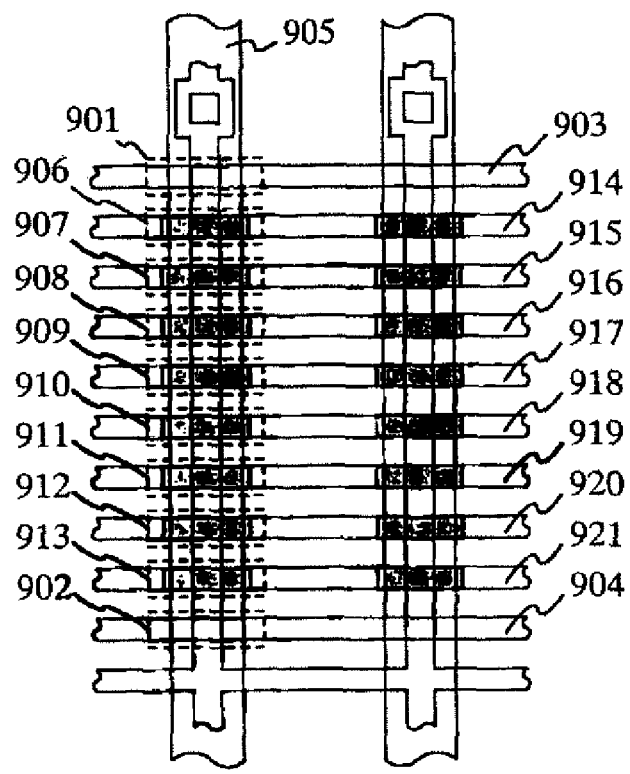

FIG. 9B is a schematic circuit pattern of the NAND-type memory circuit of FIG. 9A. In the memory transistors 906-913, hatched regions are floating gates that are provided under the respective control gates 914-921.

Next, a description will be made of the configuration of a NOR-type memory circuit shown in FIGS. 10A and 10B, which is composed of four memory transistors.

Figure 10A:
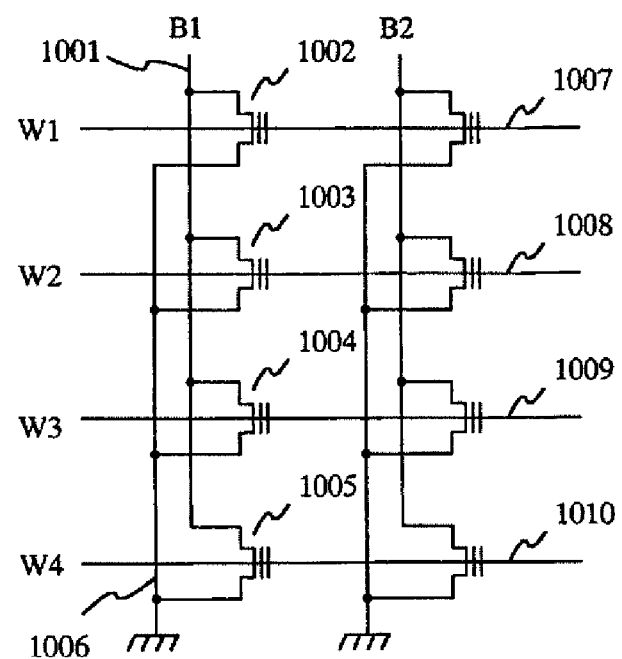
FIGS. 10A and 10B show another circuit using nonvolatile memory cells according to the eighth embodiment of the invention.

As shown in FIG. 10A, four memory transistors 1002-1005 are individually connected to a bit line B1 (1001). Those terminals (source regions) of the respective memory transistors 1002-1005 which are not connected to the bit line 1001 are connected to a ground line 1006.

The memory transistors 1002-1005 use word lines W1-W4 (1007-1010) as control gates, respectively.

Figure 10B:
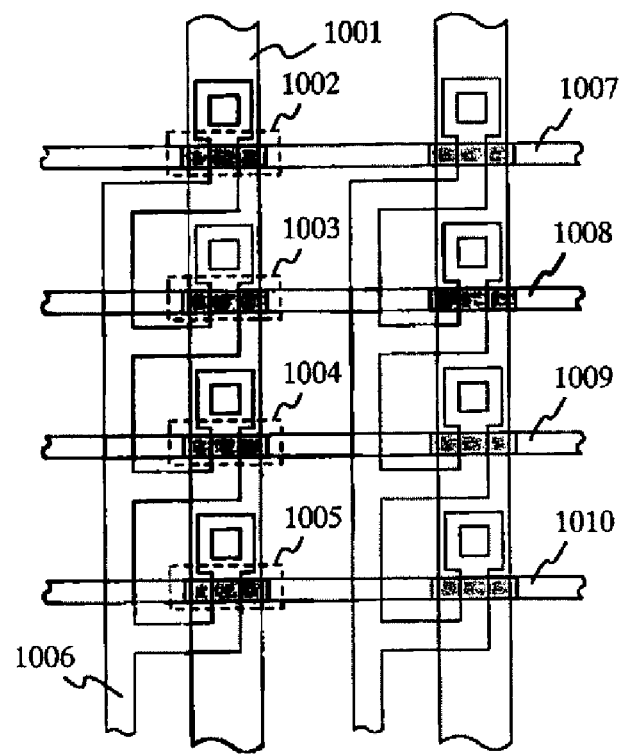

FIG. 10B is a schematic circuit pattern of the NOR-type memory circuit of FIG. 10A. In the memory transistors 1002-1005, hatched regions are floating gates that are provided under the control gates 1007-1010, respectively.

Although NAND-type circuits as shown in FIGS. 9A and 9B have disadvantages that the order of writing is fixed and the read access time is long, they have an advantage that the integration density can greatly be increased.

The configuration of the NOR-type circuit shown in FIGS. 10A and 10B is effective in injecting electrons precisely into the floating gates and reading out charge amounts precisely. This is the feature of the NOR architecture in which individual memory transistors are directly connected to a source-drain bus line.

Although this embodiment is directed to the circuits that use nonvolatile memory cells having a two-layer electrode structure (polysilicon or the like), the same circuits can be configured by using nonvolatile memory cells having the three-layer electrode structure (including the erasing gate) as described above in the fourth or fifth embodiment.

Embodiment 9

This embodiment is directed to a case where a nonvolatile memory according to the invention is applied to a microprocessor that is integrated on one chip, such as a RISC processor or an ASIC processor.

Figure 11:
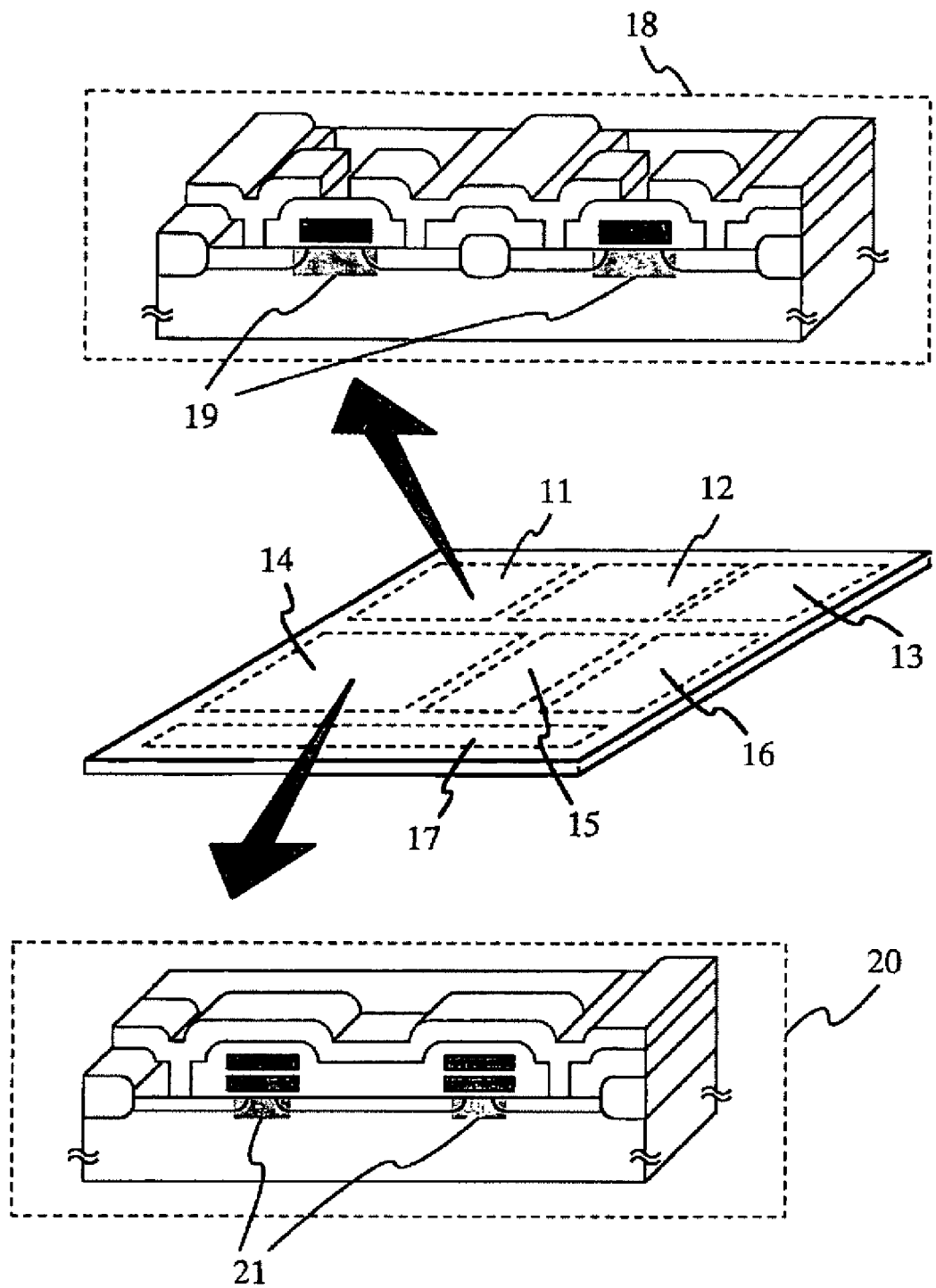
FIGS. 11 and 12 show microprocessors according to a ninth embodiment of the invention to which a nonvolatile memory of the invention is applied.

FIG. 11 shows an example of a microprocessor, which is typically composed of a CPU core 11, a flash memory 14 (or a RAM), a clock controller 13, a cache memory 12, a cache controller 15, a serial interface 16, an I/O port 17, and other components.

The microprocessor of FIG. 11 is a simplified example. Naturally, a variety of circuit designs are employed in actual microprocessors in accordance with their uses.

In the microprocessor of FIG. 11, the CPU core 11, the clock controller 13, the cache controller 15, the serial interface 16, and the I/O port 17 are constituted of CMOS circuits 18. Pinning regions 19 according to the invention are formed in the CMOS circuits 18.

In this manner, the basic concept of the invention can be applied to MOSFETs as well as nonvolatile memories, as disclosed in detail in Japanese Patent Laid-Open No. Hei. 10-65163. Japanese Patent Laid-Open No. Hei. 10-65163 has a corresponding U.S. patent application Ser. No. 08/912,979, which is herein incorporated by reference.

The flash memory 14 uses nonvolatile memory cells according to the invention that form a memory circuit 20. Every memory cell that constitutes the memory circuit 20 is formed with pinning regions 21. It is possible to use nonvolatile memory cells according to the invention also in the cache memory 12.

As described above, in the example of FIG. 11, the pinning technology of the invention is utilized in all of the memory sections and the logic sections.

Figure 12:
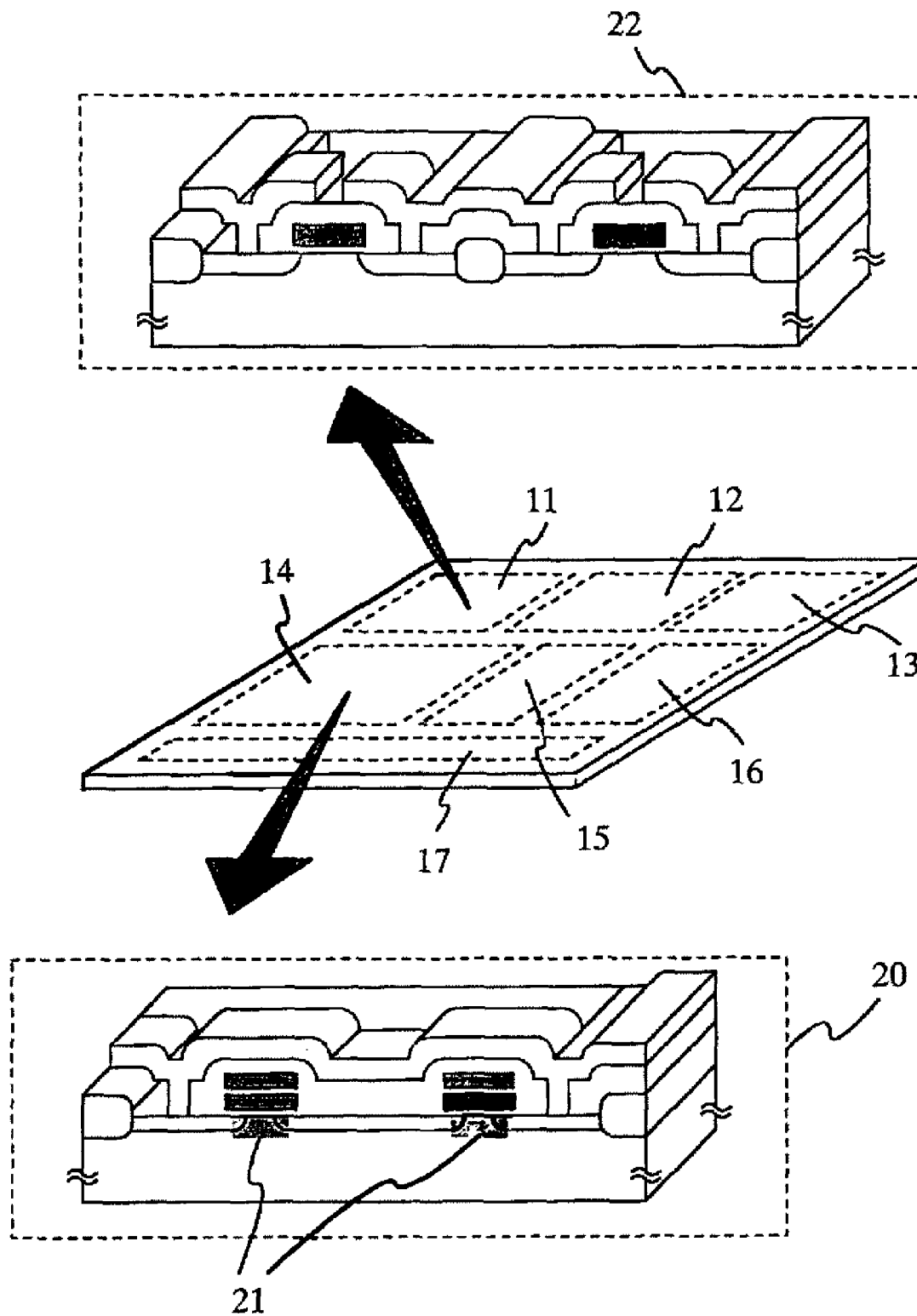

As occasion demands, a configuration shown in FIG. 12 may be employed. FIG. 12 shows a case where the logic sections (excluding the memory sections) are formed by ordinary CMOS circuits 22. This configuration is implemented by not forming pinning regions only in the logic sections.

In this manner, it is possible to determine, at the circuit designing stage, sections where pinning regions should be formed; a party who practices the invention may determine at will whether to form pinning regions in the entire circuit or only part of it. Where the invention is applied to a hybrid IC in which various functions are combined, such a high degree of freedom in circuit design is very effective.

Embodiment 10

This embodiment is directed to a case where a nonvolatile memory according to the invention that uses a single crystal silicon substrate having a buried oxide film is applied to a microprocessor such as a RISC processor or an ASIC processor that is integrated on one chip.

Figure 13:
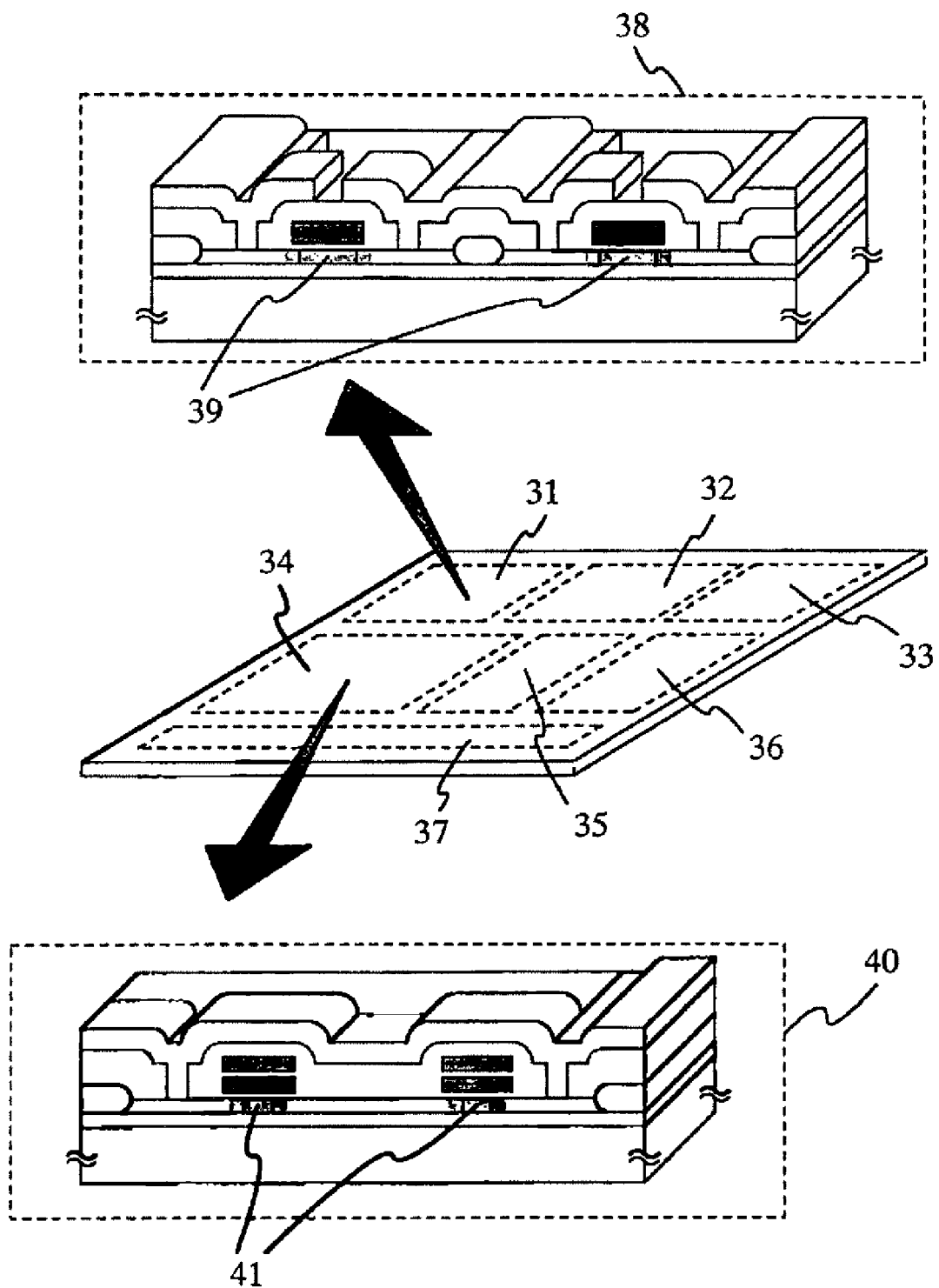
FIGS. 13 and 14 show microprocessors according to a 10th embodiment of the invention to which a nonvolatile memory of the invention is applied.

FIG. 13 shows an example of a microprocessor, which is typically composed of a CPU core 31, a flash memory 34 (or a RAM), a clock controller 33, a cache memory 32, a cache controller 35, a serial interface 36, an I/O port 37, and other components.

The microprocessor of FIG. 13 is a simplified example. Naturally, a variety of circuit designs are employed in actual microprocessors in accordance with their uses.

In the microprocessor of FIG. 13, the CPU core 31, the clock controller 33, the cache controller 35, the serial interface 36, and the I/O port 37 are constituted of CMOS circuits 38. Pinning regions 39 according to the invention are formed in the CMOS circuits 38.

In this manner, the basic concept of the invention can be applied to SOIFETs as well as nonvolatile memories, as disclosed in detail in Japanese Patent Laid-Open No. Hei. 10-93100. Japanese Patent Laid-Open No. Hei. 10-93100 has a corresponding U.S. patent application Ser. No. 08/931,697, which is herein incorporated by reference.

The flash memory 34 uses nonvolatile memory cells according to the invention that form a memory circuit 40. Every memory cell that constitutes the memory circuit 40 is formed with pinning regions 41. It is possible to use nonvolatile memory cells according to the invention also in the cache memory 32.

As described above, in the example of FIG. 13, the pinning technology of the invention is utilized in all of the memory sections and the logic sections.

Figure 14:
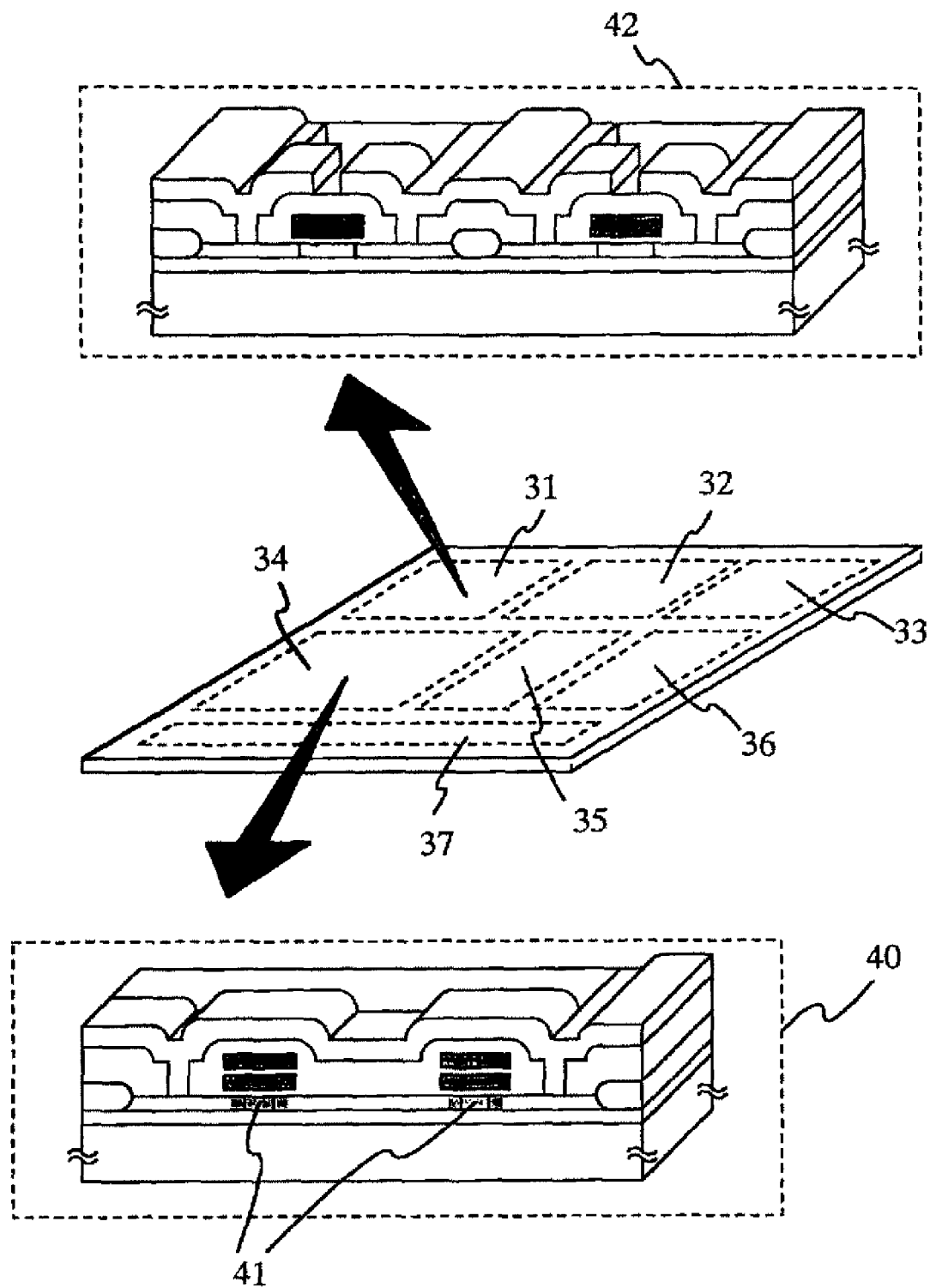

As occasion demands, a configuration shown in FIG. 14 may be employed. FIG. 14 shows a case where the logic sections (excluding the memory sections) are formed by ordinary CMOS circuits 42. This configuration is implemented by not forming pinning regions only in the logic sections.

In this manner, it is possible to determine, at the circuit designing stage, sections where pinning regions should be formed; a party who practices the invention may determine at will whether to form pinning regions in the entire circuit or only part of it. Where the invention is applied to a hybrid IC in which various functions are combined, such a high degree of freedom in circuit design is very effective.

Embodiment 11

The second embodiment was directed to the case (typically a SIMOX substrate) where a buried oxide film is provided in a single crystal silicon substrate and a single crystal silicon thin film is formed on the buried oxide film. On the other hand, a single crystal silicon thin film can be formed on crystallized glass, quartz, or ceramics by utilizing a technique called a smart cut method.

Where crystallized glass is used, it is effective to cover the entire surfaces (front, back, and side surfaces) with insulating silicon films. This measure makes it possible to prevent pollution due to glass constituent substances even when a high-temperature heat treatment is performed.

Since it is possible to use a kind of crystallized glass having approximately the same thermal expansion coefficient as a silicon film, stress occurring in a silicon thin film can be minimized. This is very important in manufacturing a highly reliable device.

For example, in a case of manufacturing a LCD (liquid crystal display) that is constituted of TFTs and nonvolatile memory cells using a single crystal silicon thin film, no stress-induced warp occurs even if an inexpensive glass substrate is used as an opposed substrate as long as crystallized glass is used as a device-side substrate. (A warp may occur due to a difference in thermal expansion coefficient if quartz used as a device-side substrate, in which case it is necessary to use an expensive quartz substrate as an opposed substrate.)

As described above, constructing a nonvolatile memory in which crystallized glass is used as a substrate and a single crystal silicon thin film is formed on an insulating film that covers the substrate is very effective in manufacturing a low-price product. The invention can easily be applied to such a case.

Embodiment 12

Although the second, third, fifth to eighth, 10th, and 11th embodiments were directed to the SOI structure in which a single crystal silicon thin film is used as a semiconductor layer, the single crystal silicon thin film used in each of those embodiments may be replaced by a polysilicon film.

A nonvolatile memory according to this embodiment will be described with reference to FIGS. 15A-15D. FIG. 15A is a top view of a nonvolatile memory of this embodiment, and FIGS. 15B and 15C are sectional views taken along lines A-A' and B-B' in FIG. 15A, respectively.

Figure 15B:
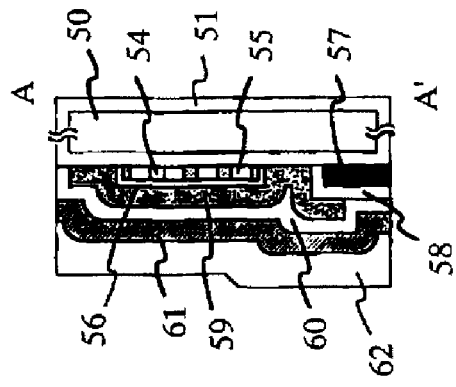
FIGS. 15A-15D show the structure of a nonvolatile memory according to a 12th embodiment of the invention.
Figure 15D:
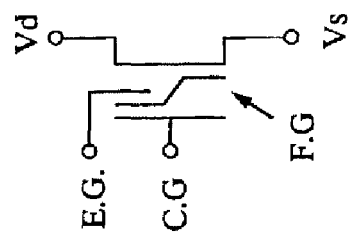
Figure 15A:
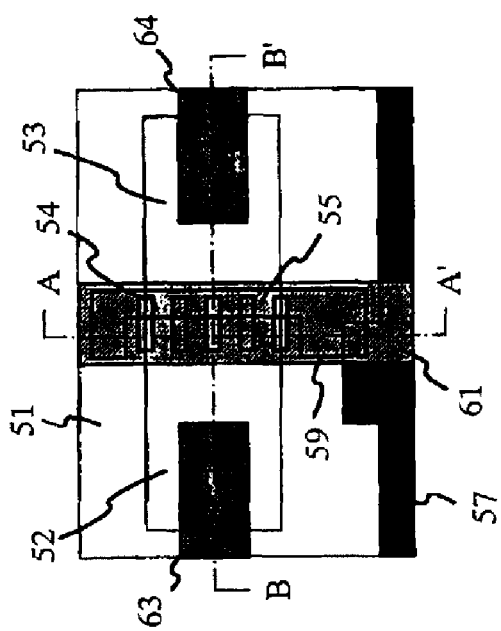
Figure 15C:
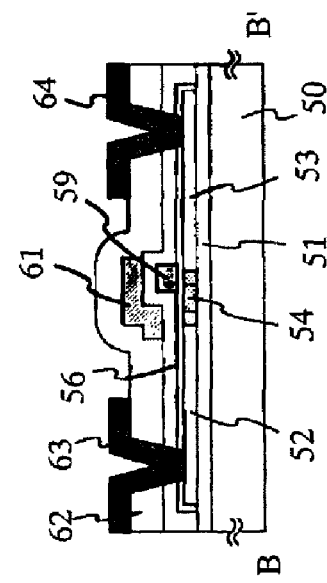

In FIGS. 15A-15C, reference numeral 50 denotes a crystallized glass (glass ceramics) substrate. A substrate made of a material having high heat resistance is used because a heat treatment at 700° C. or more is needed to form a polysilicon film used in this embodiment.

Although quartz may be used as a material having high heat resistance, an inexpensive crystallized glass substrate is used in this embodiment rather than an expensive quartz substrate. To prevent an escape of glass components, the crystallized glass substrate 50 is covered with a protective film 51 that is an insulating silicon film (a silicon oxide film, a silicon nitride film, a silicon oxynitride film, or the like).

An active layer that is a polysilicon thin film having a unique crystal structure is formed on the protective film 51, and a source region 52, a drain region 53, pinning regions 54, and channel forming regions 55 are formed in the active layer by adding an impurity to it. A method for forming the polysilicon thin film will be described later.

Then, a gate insulating film 56 is formed on the surface of the active layer (polysilicon thin film). Subsequently, an erasing gate 57 and a tunnel oxide film 58 are formed and then a floating gate 59 is formed.

After a first interlayer film 60 is formed so as to cover the floating gate 59, a control gate 61, a second interlayer film 62, a ground line 63, and a bit line 64 are sequentially formed to complete a stacked nonvolatile memory (EEPROM).

In this embodiment, as described above, a polysilicon thin film having a unique crystal structure that has been developed by the present assignee is used as the active layer (including the source region, the channel forming region, and the drain region).

Although naturally a polysilicon thin film formed by a known method may be used, to increase the operation speed of the memory itself and decrease the write voltage, it is desirable to use a polysilicon thin film having the above-mentioned unique crystal structure.

A technique for forming a polysilicon thin film having the unique crystal structure will be described below with reference to FIGS. 16A-16C.

Figure 16A:
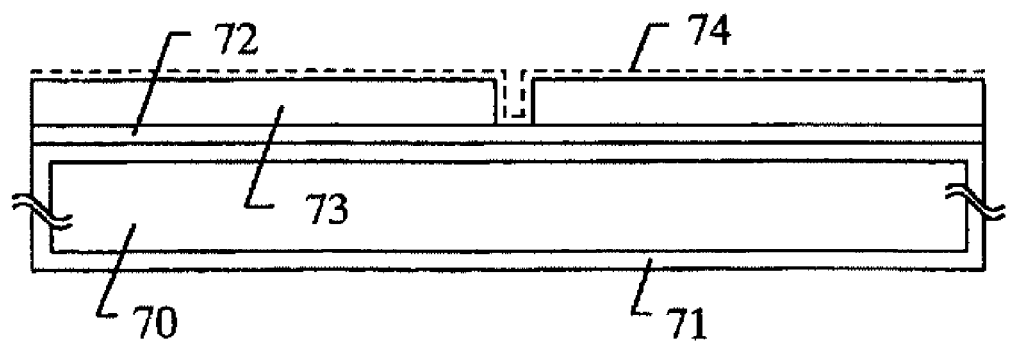
FIGS. 16A-16C show a manufacturing process of a polysilicon thin film according to the 12th embodiment of the invention.
Figure 16B:
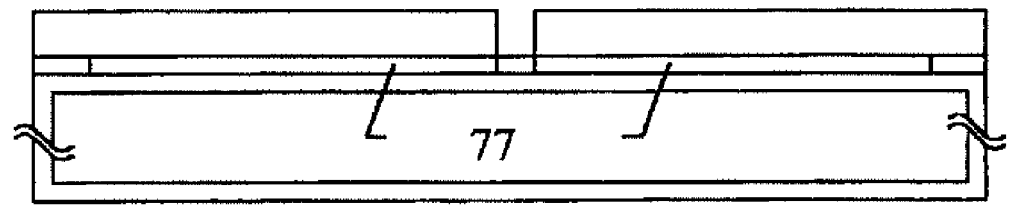
Figure 16C:
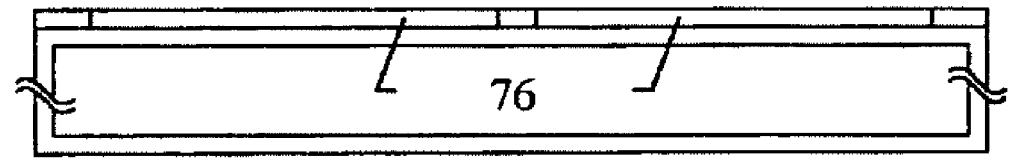

In FIG. 16A, reference numeral 70 denotes a crystallized glass substrate and numeral 71 denotes a protective film for preventing an escape of constituent substances from the crystallized glass substrate 70. An amorphous silicon film 72 is formed on the protective film 71 by low-pressure CVD, plasma CVD, or sputtering.

Where the amorphous silicon film 72 is formed by low-pressure CVD, it is preferable to remove films formed on the back and side surfaces before a later crystallization step. According to experiences of the inventors, the crystal state appears to be deteriorated if the crystallization step is executed with amorphous silicon films left on the back and side surfaces (the reason is unknown).

It is possible to use other semiconductor thin films such as a thin film of a silicon-germanium compound $Si_xGe_{1-x}$ (0<x<1). The thickness of the amorphous silicon film 73 may be set to 25-100 nm (preferably 30-60 nm).

Then, the step of crystallizing the amorphous silicon film 72 is executed by using a technique that is disclosed in Japanese Patent Laid-Open No. Hei. 7-130652 of the present inventors. Although either of the techniques described in the first and second embodiments of this publication, in this invention it is preferable to use the technique of the second embodiment of this publication (described in more detail in Japanese Patent Laid-Open No. Hei. 8-78329).

In the technique disclosed in the publication No. Hei. 8-78329, a mask insulating film 73 for selecting a catalyst element adding region is formed first. A catalyst element containing layer 74 is formed by applying a solution containing a catalyst element for accelerating crystallization of the amorphous silicon film 72 by spin coating (see FIG. 16A).

The catalyst element may be one or a plurality of elements selected from nickel (Ni), cobalt (Co), iron (Fe), palladium (Pd), platinum (Pt), copper (Cu), gold (Au), germanium (Ge), and lead (Pb). It is desirable to use nickel that has a good lattice matching relationship with silicon.

The above step of adding the catalyst element may be executed by ion implantation or plasma doping each of which uses a mask, rather than spin coating. Since the use of ion implantation or plasma doping facilitates reduction of the area occupied by the catalyst element adding region and control of the growth length of a lateral growth region, it is a technique effective in constructing a miniaturized circuit.

After the completion of the catalyst element adding step, hydrogen removal is performed at 500° C. for 2 hours. Then, the amorphous silicon film 72 is crystallized by performing a heat treatment at 500°-700° C. (typically 550°-650° C., preferably 570° C.) for 4-24 hours in an inert atmosphere, a hydrogen atmosphere, or an oxygen atmosphere (see FIG. 16B).

In this step, the crystallization of the amorphous silicon film 72 proceeds with priority from nuclei that are generated in the region where the catalyst element is added, whereby crystal regions 76 are formed in which the crystallization has proceeded approximately parallel with the surface of the crystallized glass substrate 70. The inventors call the crystal regions 76 lateral growth regions. The lateral growth region has an advantage that it has superior crystallinity as a whole because individual crystals are combined together so as to be arranged relatively uniformly.

After the completion of the heat treatment for crystallization, the mask insulating film 73 is removed. Then, a heat treatment for removing the catalyst element (catalyst element gettering step) is performed. In this heat treatment, a halogen element is mixed into a processing atmosphere to utilize the metal element gettering effect of the halogen element.

To fully effectuate the gettering effect of the halogen element, it is preferable to perform the heat treatment at a temperature higher than 700° C. At a temperature lower than 700° C., there is a possibility that a halogen compound in the processing atmosphere is hard to decompose and resultantly the gettering effect is not obtained. It is preferable to set the heat treatment temperature and time at 800°-1,000° C. (typically 950° C.) and 0.1-6 hours (typically 0.5-1 hour), respectively.

Typically, the heat treatment may be performed at 950° C. for 30 minutes in an oxygen atmosphere containing a hydrogen chloride (HCl) gas at 0.5-10 vol % (preferably 3 vol %). A HCl density higher than the above range is not preferable because asperities whose heights are on the order of the film thickness will occur on the silicon surface.

Other than HCl, the compound containing a halogen element may be one or a plurality of compounds selected from $HF$, $NF_3$, $HBr$, $Cl_2$, $ClF_3$, $BCl_3$, $F_2$, and $Br_2$.

In this step, the catalyst element in the lateral growth regions 76 are gettered by the action of chlorine and removed into the air in the form of a volatile chloride. After the execution of this step, the concentration of the catalyst element in lateral growth regions 76 is reduced to $5 \times 10^{17}$ atoms/cm$^3$ or less (typically $2 \times 10^{17}$ atoms/cm$^3$ or less).

Although in this embodiment the catalyst element is gettered by the gettering ability of a halogen element, it is also possible to utilize the gettering ability of the element of phosphorus. In such a case, there may be employed a gettering step in which a layer containing phosphorus at a high concentration is provided adjacent to the lateral growth regions 76 and a heat treatment is performed to cause the phosphorus-containing layer to getter the catalyst element.

The resulting lateral growth regions 76 has a unique crystal structure that is a collected body of rod-like or flat-rod-like crystals. In the nonvolatile memory of this embodiment, a polysilicon thin film constituted of only a lateral growth region 76 is used as the active layer.

Specifically, the unique crystal structure is a structure in which rod-like crystals are arranged approximately parallel with each other and have particular directivity macroscopically. Further, individual crystals are connected to each other with extremely high continuity at their grain boundaries.

Detailed observation results of such a crystal structure are described in Japanese Patent Application Serial Nos. Hei. 9-55633, Hei. 9-165216, and Hei. 9-212428.

A polysilicon thin film formed by the above steps has grain boundaries where individual crystals are connected to each other with extremely high continuity (with a high level of matching), and the grain boundaries cause almost no obstruction to carrier movements. That is, this polysilicon thin film can be regarded as a silicon thin film having substantially no grain boundaries and hence can substantially be regarded as a single crystal (as a matter of fact, this polysilicon thin film exhibits an electron beam diffraction pattern that is very close to that of a single crystal).

The above polysilicon thin film is intrinsic or substantially intrinsic unless no impurity is added intentionally. The term "intrinsic" as used here means a state that impurities (i.e., atoms other than silicon atoms) are eliminated as much as possible and the polarity is almost negligible.

The invention can be applied to all kinds of nonvolatile memories using a semiconductor thin film that can substantially be regarded as a single crystal (i.e., a polycrystalline semiconductor thin film having the crystal structure described in this embodiment).

Embodiment 13

This embodiment is directed to a case where an impurity element for imparting the same conductivity type as the conductivity type of the pinning regions is added to the insulating layer (buried oxide film or the like) that underlies the semiconductor layer in the nonvolatile memory using the single crystal silicon substrate having the buried oxide film that was described in any of the second, third, fifth to eighth, and 10th to 12th embodiments.

In this embodiment, boron is used as an impurity that is added to the pinning regions. FIGS. 17A and 17B are sectional views that are focused on a channel forming region of a nonvolatile memory according to this embodiment. That is, FIGS. 17A and 17B are sectional views taken along the channel width direction of a channel forming region.

In FIG. 17A, reference numeral 81 denotes a single crystal silicon substrate; 82, a buried oxide film; 83, a channel forming region; and 84 and 85, pinning regions. This embodiment is characterized in that a boron-added region 86 is provided in the buried oxide film 82 in the vicinity of its surface.

The structure of FIG. 17B is the same as that of FIG. 17A except that boron is added to the entire buried oxide film 82.

FIG. 17C schematically shows an energy-related structure of the channel forming region 83 shown in FIG. 17A. In FIG. 17C, the energy is low in a region 88 and hence the region 88 serves as a channel forming region. High-energy regions 89 are formed in the vicinity of the pinning regions 84 and 85 and the buried oxide film 82 to which boron has been added intentionally due to leakage of the impurity element.

FIGS. 17D and 17E show energy profiles of the channel forming region 83. That is, FIG. 17D is an energy profile taken along a two-dot chain line X in FIG. 17C and the horizontal and vertical axes represent the distance in the channel width direction and the relative energy, respectively. FIG. 17E is an energy profile taken along a two-dot chain line Y in FIG. 17C and the horizontal and vertical axes represent the relative energy and the distance in the depth direction, respectively.

The energy profiles of FIGS. 17D and 17E are so drawn as to correspond, in position, to the energy-related structure of FIG. 17C.

As shown in FIG. 17D, the relative energy has a large value b in the pinning regions 84 and 85 and their vicinities. On the other hand, in a central portion (i.e., a portion farthest from the pinning regions 84 and 85) of a carrier movement region 88, the relative energy has the minimum value a.

On the other hand, as shown in FIG. 17E, the energy profile taken along the two-dot chain line Y is such that the relative energy is relatively high in the vicinity of the gate insulating film (not shown) and has the minimum value a in a central portion of the carrier movement region 88. The relative energy gradually increases as the position approaches the interface with the buried oxide film 82 and reaches a value b'.

If the concentration of the impurity added to the pinning regions 84 and 85 and that of the impurity added to the buried oxide film 82 are the same, b is equal to b'. If they are different from each other, b is not equal to b'. The invention may be of either case.

In the invention, it is preferable that the relative energy value b or b' be three times or more (ever preferably 10 times or more) larger than the relative energy value a. This provides a structure in which carriers (electrons or holes) move through the low-energy region 88 with priority.

Since a high energy barrier is formed at the interfaces between the channel forming region 83 and the buried oxide film 82 and its vicinity and keeps carriers away from itself, carrier scattering can be prevented from occurring in the vicinity of the surface of the underlying film (buried oxide film 82).

The above structure makes it possible to effectively suppress expansion of the depletion layer and to further increase the resistance to the short channel effect. In addition, by reducing the degree of carrier scattering in the vicinity of the surface of the underlying film, the hot electron injection can be made more efficient.

Embodiment 14

A semiconductor circuit (memory circuit) formed by nonvolatile memory cells according to the invention can be incorporated, as a recording medium for data storage and readout, in electronic apparatuses of every field. In this embodiment, examples of those electronic apparatuses will be described with reference to FIGS. 18A-18F.

Examples of electronic apparatuses which can use a nonvolatile memory of this embodiment are a video camera, an electronic still camera, a projector, a head-mounted display, a car navigation apparatus, a personal computer, portable information terminals (a mobile computer, a cellular telephone, a PHS, etc.).

Figure 18A:
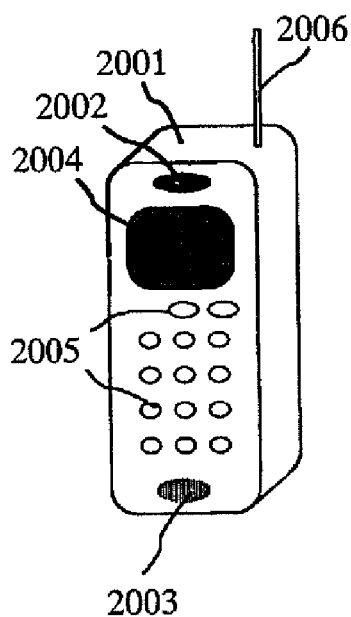
FIGS. 18A-18F show electronic apparatuses according to a 14th embodiment of the invention each of which uses a nonvolatile memory of the invention.

FIG. 18A shows a cellular telephone, which is composed of a main body 2001, a voice output section 2002, a voice input section 2003, a display device 2004, manipulation switches 2005, and an antenna 2006. A nonvolatile memory of this invention is incorporated in an LSI board and used to add an address function for recording telephone numbers.

Figure 18B:
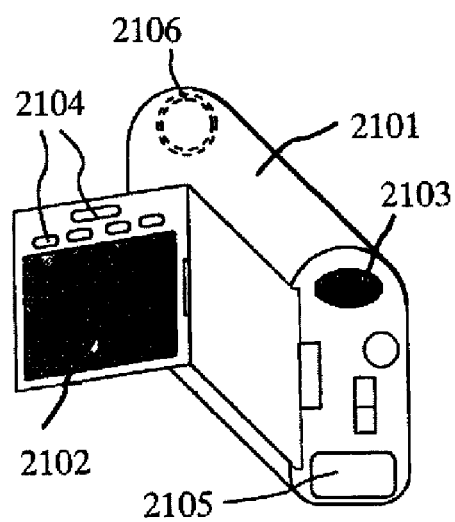

FIG. 18B shows a video camera, which is composed of a main body 2101, a display device 2102, a sound input section 2103, manipulation switches 2104, a battery 2105, and an image receiving section 2106. A nonvolatile memory of this embodiment is incorporated in an LSI board and used for such a function as storage of image data.

Figure 18C:
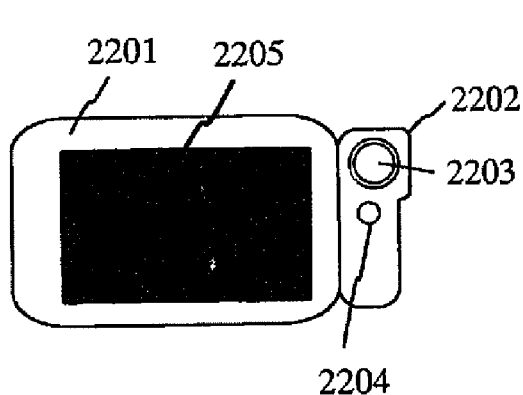

FIG. 18C shows a mobile computer, which is composed of a main body 2201, a camera section 2202, an image receiving section 2203, a manipulation switch 2204, and a display device 2205. A nonvolatile memory of this embodiment is incorporated in an LSI board and used for storage of processed data and image data.

Figure 18D:
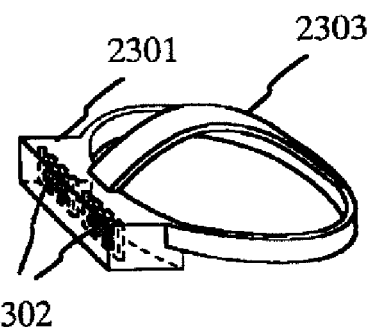

FIG. 18D shows a head-mounted display, which is composed of a main body 2301, display devices 2302, and a band section 2303. A nonvolatile memory of this embodiment is used in an image signal correction circuit that is connected to the display devices 2302.

Figure 18E:
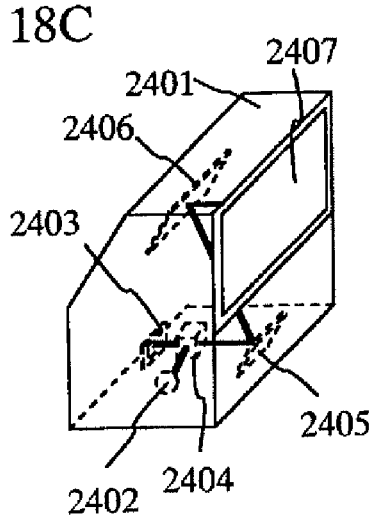

FIG. 18E shows a rear type projector, which is composed of a main body 2401, a light source 2302, a display device 2403, a polarizing beam splitter 2404, reflectors 2405 and 2406, and a screen 2407. A nonvolatile memory of this invention is used as a storage circuit for storing data to be supplied to a γ-correction circuit.

Figure 18F:
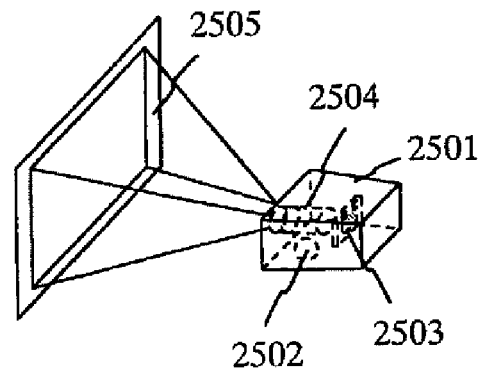

FIG. 18F shows a front type projector, which is composed of a main body 2501, a light source 2502, a display device 2503, an optical system 2504, and a screen 2505. A nonvolatile memory of this invention is used as a storage circuit for storing data to be supplied to a γ-correction circuit.

As described above, the application range of the invention is extremely wide and the invention can be applied to electronic apparatuses of every field. In addition to the above examples, a nonvolatile memory of the invention can be used as a storage medium that is indispensable in various control circuits and information processing circuits.

The invention makes it possible to minimize influences of the miniaturization effects as typified by the short channel effect and to further advance the miniaturization of nonvolatile memories.

The invention also makes it possible to realize small-area, large-capacity nonvolatile memories while securing their high reliability.

With reference to FIGS. 23A-23C, a description will be made of a case where the present invention is applied to an n-channel semiconductor device on a SIMOX substrate.

FIG. 23A is a schematic top view of a source region 3101, a drain region 3102, and a channel forming region 3103 of an IG-FET according to the invention.

The invention is characterized in that impurity regions 3104 are formed artificially and locally in the channel forming region 3103. Although in this example the impurity regions 3104 are formed in linear patterns, it is possible to form impurity regions in dot patterns.

It is desirable to form the impurity regions 3104 in linear patterns that are generally parallel with the channel direction (i.e., the direction connecting the source and the drain or the carrier movement direction). This is because in such a case the impurity regions 3104 serve as side walls to form energy rails that define movement of carriers, so that the probability of occurrence of scattering due to collision between carriers is reduced, resulting in an advantage of an increase in mobility.

The inventors call the carrier moving paths (i.e., the regions between the impurity regions 3104) potential slit regions or lane regions.

The following description is directed to a case where the linearly patterned impurity regions 3104 are formed generally parallel with the channel direction from one end to the other of the channel forming region 3103 (for instance, from the source region 3101 to the drain region 3102). and boron is employed as an impurity to be added.

As described above, a built-in potential difference that serves as a sufficiently high energy barrier for movement electrons is formed in the impurity regions in which the energy band is shifted by the addition of boron to such a direction that the movement of electrons (majority carriers) is obstructed. Therefore, carriers (in this case, electrons) do not travel through the impurity regions 3104.

In particular, it is desirable that the impurity regions 3104 be disposed at the junction portion between the drain region 3102 and the channel forming region 3103 as shown in FIG. 23A, because the electric field varies the most there. Where an electric field generated by the gate voltage encompasses the drain region 3102, it is preferred that the impurity regions 3104 be formed so as to extend to the inside of the drain region 3102. Conversely, it is preferred that the impurity regions 3104 be formed so as not to extend to the inside of the source region 3101.

The invention is very effective in forming a very small element that requires microprocessing in a deep submicron range of less than 0.35 um (particularly less than 0.1 um) or even less than 0.01 μm. Since the length of the channel forming region (channel length or source-drain distance) is as short as 0.01-0.35 um, the impurity regions should be patterned to have even smaller dimensions.

For example, where a resist mask is used to form impurity regions in linear patterns, ordinary exposing methods cannot be used to pattern a resist mask, i.e., form openings in a resist film because of their insufficient resolution. In such a case, fine patterns in a deep submicron range may be realized by an exposing method using an excimer laser of KrF, ArF, or the like, an electron beam drawing method, a FIB (focused ion beam) method, or the like.

Since the impurity regions are arranged artificially by patterning, they can be arranged not only in the manner shown in FIG. 23A but also in other various, arbitrary manners.

Next, a description will be made of how the short channel effects can be suppressed when the insulated-gate semiconductor device (IG-FET) having the structure of FIG. 23A which includes the source region 3101, the channel forming region 3103, and the drain region 3102.

FIG. 23B is a sectional view taken along line A-A' in FIG. 23A. Reference numerals 3105 and 3106 denote a silicon substrate and a buried oxide film, respectively. Since the impurity regions 3104 are formed so as to connect the source region 3101 and the drain region 3102, the impurity regions 3104 assume an A-A' cross-section shown in FIG. 23B.

FIG. 23C is a cross-section taken along line B-B' in FIG. 23A, in which the channel forming region 3103 is cut perpendicularly to the channel direction.

The width of an n-th impurity region 3104 in the channel forming region 3103 is represented by $W_{pi,n}$ and the interval between adjacent impurity regions (i.e. the width of an m-th potential slit region (carrier movement path) in the channel forming region 3103) is represented by $W_{pa,m}$.

The above description is merely directed to the structure, and the operation of the IG-FET will be described below. FIG. 24A is a schematic drawing in which attention is paid to only the channel forming region 3103 of the IG-FET.

When a gate voltage and a drain voltage are applied to the semiconductor device having the structure of FIG. 23B, a source-side depletion layer 3201, a channel-side depletion layer 3202, and a drain-side depletion layer 3203 are formed as shown in FIG. 24A. That is, the drain-side depletion layer 3203 is prevented from being extending toward the source side due to the existence of the impurity region 3204 serving as barriers. Reference numeral 3205 denotes part of the buried oxide film.

Although it is difficult to understand the arrangement of the impurity regions 3204 from FIG. 23B, they are arranged as shown in FIG. 23A, or as shown in FIG. 23C when viewed along the channel direction. Therefore, it would be easier to understand if a model is used in which the expansion of the drain-side depletion layer 3203 is suppressed by a grid-like filter that blocks the channel forming region 3103.

Thus, in the semiconductor device having the structure of the invention, the depletion layers are separated from each other and do not interfere with each other as shown in FIG. 24A. Since the source-side depletion layer 3201 and the channel-side depletion layer 3202 are distributed without being influenced by the drain-side depletion layer 3203, an energy state as shown in FIG. 24B is established.

Figure 20:
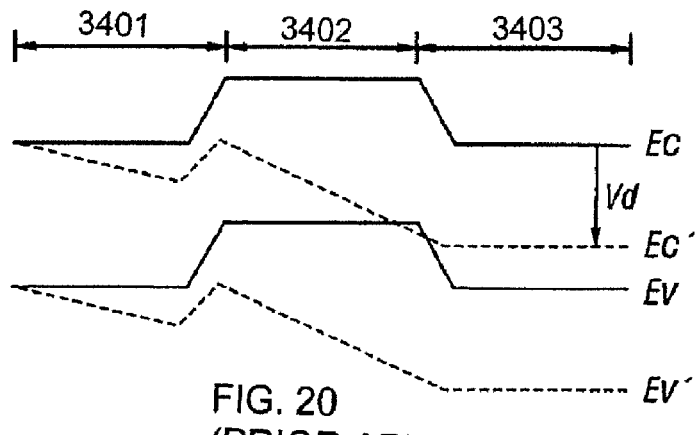
FIG. 20 is an energy band diagram in and around a channel forming region in the short channel effect.

That is, in contrast to the conventional energy state shown in FIG. 20, the energy state of the channel region is controlled almost only by the electric field generated by the gate voltage, the channel-side depletion layer 3202 becomes generally parallel with the channel region. Therefore, there do not occur such problems as caused by the short channel effects, for instance, the punch-through phenomenon, and it becomes possible to manufacture semiconductor devices having high drain breakdown voltages.

Figure 19:
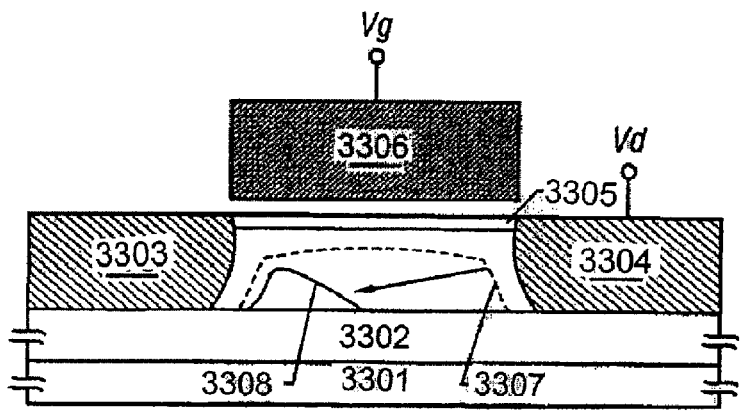
FIG. 19 shows how the short channel effects occur in a conventional semiconductor device.

Further, in the invention, as shown in FIG. 24A, the volume of the depletion layer is smaller than in the conventional case shown in FIG. 19 even with a high drain voltage. Therefore, the invention has a feature that the depletion layer charge and hence the depletion layer capacitance are smaller than in the conventional case.

The S-value is given by a following equation.

$$S \approx d(Vg)(\log Id).$$

Figure 21:
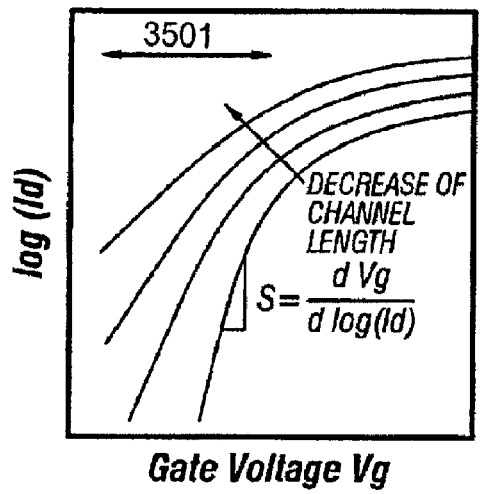
FIG. 21 shows a subthreshold characteristic of a conventional semiconductor device.
Figure 22A:
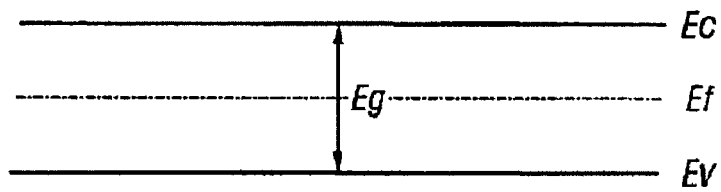
FIGS. 22A-22D are energy band diagrams of a channel forming region.
Figure 22B:
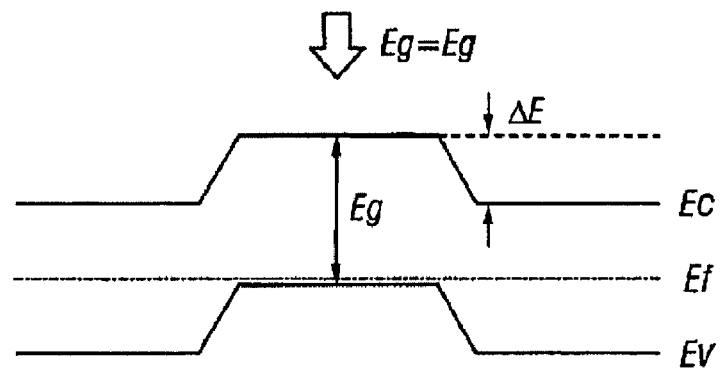
Figure 22C:
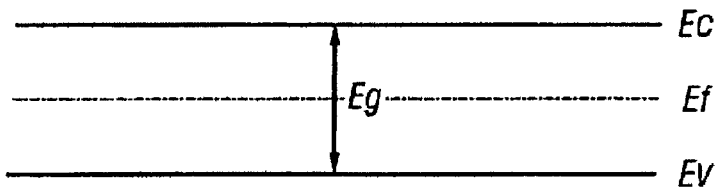
Figure 22D:
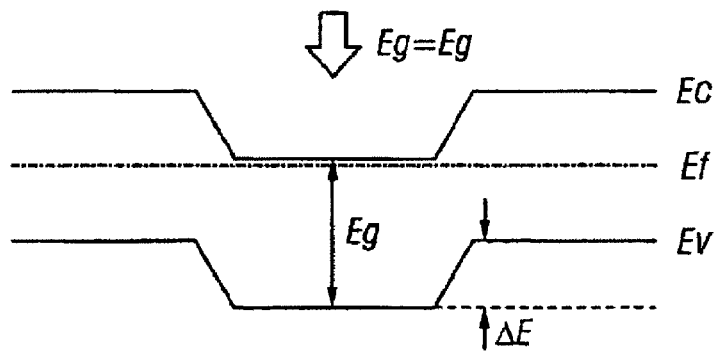

It is seen that, as described above, the S-value represents the reciprocal of the slope in range 3501 in the graph of FIG. 21. The above equation is approximated as $$S \approx \ln 10(kT/q)\{1+(Cd+Cit)/Cox\}$$

where k is the Boltzmann constant, T is the absolute temperature, q is the magnitude of electronic charge, Cd is the depletion layer capacitance, Cit is the equivalent capacitance of interface states, and Cox is the gate oxide film capacitance. In the invention, since the depletion layer capacitance Cd is sufficiently smaller than in the conventional case, the S-value can be made as small as less than 85 mV/decade (preferably less than 70 mV/decade), to provide a superior subthreshold characteristic.

The invention aims to make the depletion layer capacitance Cd and the equivalent capacitance of interface states Cit as close to 0 as possible, that is, to make the S-value as close to the value (60 mV/decade) of the ideal state (Cd=Cit=O) as possible.

Further, the fact that the channel forming region has the structure shown in FIG. 23C is very important in reducing the decrease in threshold voltage (short channel effect), because the structure of FIG. 23C is necessary to produce the narrow channel effect intentionally.

The narrow channel effect, which was originally observed in a MOSFET formed on bulk silicon, is a phenomenon in which the threshold voltage increases being influenced by a bird's beak of a device isolation field oxide film, impurity diffusion from a channel stopper, and other factors when the channel width is narrowed.

One of the important concepts of the invention is to intentionally cause the narrow channel effect by artificially forming and arranging the impurity regions in the channel forming region. According to this concept, the threshold voltage is controlled by precisely controlling the distance between adjacent impurity regions ($W_{pa,m}$ in FIG. 23C) in a range of 30-3,000 Å (preferably 30-1.000 Å).

For example, when attention is paid to a certain cross-section as in the case of FIG. 23C, the channel width W is divided by the impurity regions 3104, so that the channel forming region can substantially be regarded as a collection of a plurality of channel forming regions having a narrow channel width $W_{pa,m}$.

It is considered that the narrow channel effect is obtained in each of the plurality of regions having a narrow channel width $W_{pa,m}$. Macroscopically, the regions that exhibit the narrow channel effect exist over the entire channel forming region as shown in FIG. 23A. It is therefore considered that the entire channel forming region also exhibits the narrow channel effect and hence the threshold voltage is increased.

Therefore, threshold voltage control can be effected such that an increase in threshold voltage due to the above-described narrow channel effect compensates for a decrease in threshold voltage (short channel effect) caused by shortening of the channel length. As a result, a variation in threshold voltage can be reduced.

The invention as summarized above will be described in detail in the following embodiments. The following embodiments are merely examples of the invention, and can be modified in various manners in accordance with the needs of semiconductor device manufacturers.

Therefore, the claims should cover any changes and modifications of the following embodiments as long as they are made without departing from the spirit and scope of the invention.

Embodiment 15

In this embodiment, with reference to FIGS. 25A through 30B, a description will be made of a case where insulated-gate field-effect transistors, more specifically, a CMOS circuit as a complementary combination of n-channel and p-channel PETs, are formed on a SIMOX substrate by using the invention.

First, a single crystal silicon substrate 3701 having weak n-type or p-type conductivity is prepared. A buried oxide film 3702 is formed by implanting oxygen ions at a dose of $1 \times 10^{18}$ atoms/cm$^2$ and then performing a heat treatment in a temperature range of 800°-1,300° C. Thus, a buried oxide film 3702 of 0.05-0.5 urn in thickness and a single crystal silicon layer 3703 of 100-2,000 Å in thickness (Preferably 200-600 Å) are obtained.

As one of the most remarkable features of the SOI technology, the single crystal silicon layer 3703 has almost no, i.e., only one to several, impurity elements (already contained in the mother substrate 3701), and is therefore extremely pure and intrinsic or substantially intrinsic.

Naturally the thicknesses of the buried oxide film 3702 and the single crystal silicon layer 3703 are not limited to the ranges of this embodiment, and may be adjusted properly when necessary. For a detailed description of the SIMOX substrate, reference is made to, for instance, Fumio Shimura, "Semiconductor Silicon Crystallographic Engineering," published by Maruzen Co., Ltd. on Sep. 30, 1993, pp. 217 onward.

Figure 25A:
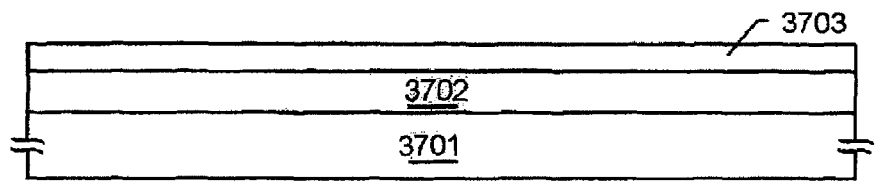
FIGS. 25A-25D and 26A-26C show a manufacturing process of an IG-FET according to a first embodiment of the invention.

Thus, a SIMOX substrate is obtained as shown in FIG. 25A. Naturally other types of SOI substrates may be used such as an SOI substrate formed by using the wafer bonding technique, an SOS substrate formed by growing a single crystal silicon layer on an insulative substrate such as a sapphire substrate, and a PIPOS (full isolation by porous oxidized silicon) substrate formed by utilizing oxidation of porous silicon.

In the state of FIG. 25A, a thin thermal oxidation film (not shown) is formed by subjecting the substrate to a thermal oxidation treatment, and mask patterns 3704 and 3705 of silicon nitride films are formed thereon. The mask patterns 3704 and 3705 are placed on regions where n-channel and p-channel PETs are to be formed, respectively.

Then, a device isolation field oxide film 3706 is formed by performing thermal oxidation at a high temperature of 1,000-1,2000° C., to obtain regions 3707 and 3708 to become active layers of the n-channel and p-channel FETs, respectively.

Figure 25B:
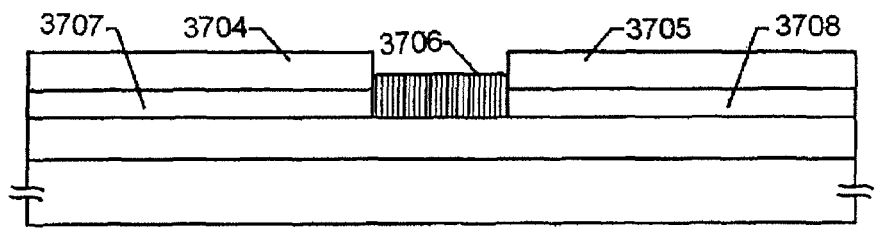

In the state of FIG. 25B, the mask patterns 3704 and 3705 and the thermal oxidation film (not shown) are removed. A source region 3709 and a drain region 3710 of the n-channel FET are formed by adding P (phosphorus), and then a source region 3711 and a drain region 3712 of the p-channel FET are formed by adding B (boron).

The regions for phosphorus implantation and those for boron implantation may be determined by using resist masks. The regions to which no impurity has been added remain intrinsic or substantially intrinsic and constitute channel forming regions 3713 and 3714 of the n-channel and p-channel FETs, respectively (see FIG. 25C).

Where the channel forming region is an intrinsic or substantially intrinsic region as in the above case, the active layer of a semiconductor device, say, an n-channel FET, has a configuration of n$^+$(source region)/i(channel forming region)/n$^+$(drain region), where n$^+$ means strong n-type conductivity and i means intrinsic or substantially intrinsic.

Example of other possible configurations are n$^+$(source region)/n$^-$(channel forming region)/n$^+$(drain region) and p$^+$(source region)/p$^-$(channel forming region)/p$^+$(drain region), where n$^-$ means very weak n-type conductivity and p$^-$ means very weak p-type conductivity.

Conventionally, the above configuration has a problem of a reduction in breakdown voltage though it has an advantage of an increased mobility. According to the invention, which enables formation of a semiconductor device having a high breakdown voltage, requirements of a high mobility and a high breakdown voltage can be satisfied at the same time.

Figure 25C:
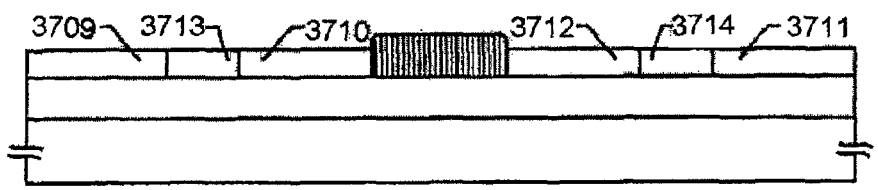
Figure 25D:
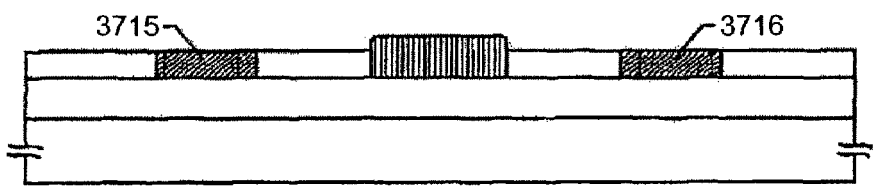

In the state of FIG. 25C, boron (B) is added to the channel forming region 3713 of the n-channel FET and phosphorus (P) or arsenic (As) is added to the channel forming region 3714 of the p-channel FET, to form impurity regions 3715 and 3716 as depletion layer stoppers (see FIG. 25D). In this embodiment, oxygen is used as the impurity element, and the regions 3715 and 3716 to add oxygen are selected by using a resist mask (not shown) obtained by forming openings in a resist film by patterning.

Since the impurity regions 3715 and 3716 need to be formed at extremely small dimensions, an accurate lithography technique is required for that purpose. To this end, exposure may be performed in linear patterns by a technique using an electron beam (electron beam drawing method), a technique using an ion beam (FIB method), a technique using an excimer laser, or a like technique. To form the fine impurity regions 3715 and 3716 with high accuracy, it is preferred to add the impurity element by an ion implantation method.

It is preferred to activate the impurity element that is added to the impurity regions 3715 and 3716 by furnace annealing, laser annealing, lamp annealing, or the like. Care should be taken so as to minimize the thermal diffusion. For example, if furnace annealing is conducted at about 500°-800° C. (Preferably 600°-700° C.), sufficient activation can be effected while thermal diffusion of the impurity element is suppressed.

Alternatively, the impurity element may be activated at the same time as its implantation by heating the substrate during the ion implantation. The impurity element activation efficiency at the time of the ion implantation is improved by increasing the RF power of the ion implantation. The impurity element may be activated either by one of the above-mentioned annealing processes or by a combination of those.

In forming the impurity regions 3715 and 3716, the width $W_{pa,m}$ of each potential slit region is controlled so as to fall within a range of 30-3,000 Å (preferably 30-1,000 Å). All the widths $W_{pa,m}$ are controlled so as to fall within a variation range of ±20% (preferably ±5%). It is important to precisely control the widths $W_{pa,m}$ of the potential slit regions because they directly influence the narrow channel effect.

The lower limit width 30 Å of the potential slit regions is determined as a limit value above which no quantum effect occurs. In the invention, care should be taken so that the widths of the potential slit regions are controlled so as to fall within the range where no quantum effect occurs.

Thus, the impurity regions 3715 and 3716, which are arranged as shown in the top view of FIG. 23A, are formed so as to equalize the widths $W_{pa,m}$ of all the potential slit regions. As a result, it becomes possible to effectively suppress a variation in threshold voltage (caused by a variation in narrow channel effect) and a variation in heat generation (caused by a variation in the density of current flowing through the potential slit regions).

To increase the breakdown voltage of the semiconductor device, it is effective to form the impurity regions 3715 and 3716 so that they go into the drain regions 3710 and 3712, respectively, as shown in FIG. 25D. Although the impurity regions 3715 and 3716 may either go into the source regions 3709 and 3711 or does not, it is preferred that they not go into the source regions 3709 and 3711. (To clarify the boundary of the channel forming regions 3713 and 3714, in this embodiment the impurity regions 3715 and 3716 also go into the source regions 3709 and 3711.)

Where LDD regions are provided between the channel forming region 3713 or 3714 and the source and drain regions 3709 and 3710 or 3711 and 3712, it is preferred that the impurity regions 3715 or 3716 be formed so as to go into the LDD region or go into the drain region 3710 or 3712 past the LDD region. The above configurations are effective in increasing the breakdown voltage of the semiconductor device.

In the state of FIG. 25D, a thermal oxidation treatment is performed in a temperature range of 800°-1,200° C. to form thermal oxidation films 3717 and 3718 of 100-500 Å in thickness, which serve as gate insulating films as they are. Each active layer/gate insulating film interface has good quality with a small number of interface states.

It is preferred that the above thermal oxidation treatment be conducted in a halogen atmosphere. In such a case, heavy metals such as Ni (nickel) and Cu (copper) that segregate at the interfaces between the impurity regions 3715 and 3716 and the potential slit regions can be removed by gettering.

The above heavy metals are ones that are left inside in not a small amount, for instance, in the process of forming single crystal silicon, and act as carrier recombination centers to possibly lower the mobility. By conducting the thermal oxidation treatment in a halogen atmosphere, it is expected that a halogen element (for instance, chlorine or fluorine) exhibits a gettering effect on the metal elements.

Figure 26A:
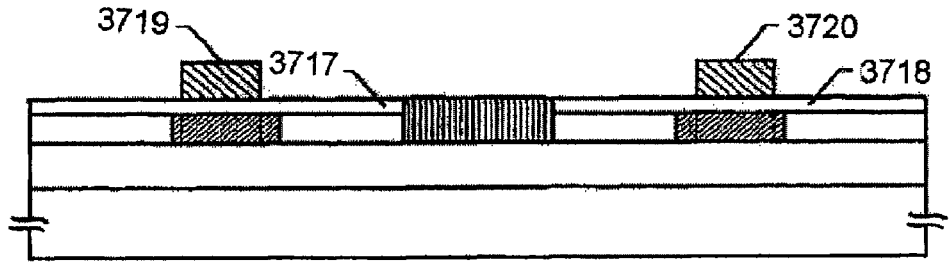

Polysilicon films 3719 and 3720 as gate electrodes are further formed on the thermal oxidation films 3717 and 3718 over the channel forming regions 3713 and 3714, respectively. The gate electrodes 3719 and 3720 may be rendered conductive by adding an impurity element during their formation. Thus, the state of FIG. 26A is obtained.

Figure 26B:
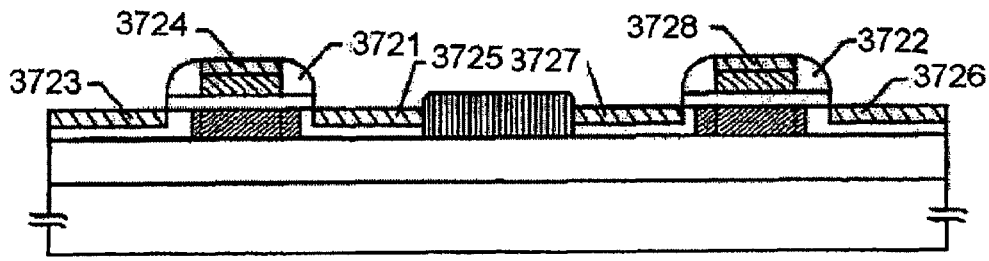

Then, as shown in FIG. 26B, a 3,000-Å-thick silicon nitride film is formed so as to cover the gate electrodes 3719 and 3720, and then etched back to leave sidewalls 3721 and 3722 only on the side faces of the gate electrodes 3719 and 3720. Part of the gate insulating films 3717 and 3718 that are located on the source regions 3709 and 3711 and the drain regions 3710 and 3712 are removed at the same time.

In this state, a titanium film (not shown) is formed over the entire surface by sputtering, and then silicified by heating, laser annealing, or lamp annealing. As a result, titanium silicide layers 3723-3725 are formed on the surfaces of the source region 3709, drain region 3710, and gate electrode 3719 of the n-channel FET, and titanium silicide layers 3726-3728 are formed on the surfaces of the source region 3711, drain region 3712, and gate electrode 3720 of the p-channel FET (see FIG. 26B).

The formation of the titanium silicide layers 3713-3728 is favorable for taking ohmic contact to later formed interconnections because the titanium silicide layers 3713-3728 have extremely low resistivity.

In this state, a silicon nitride film 3729 is formed as an interlayer insulating film. After contact holes are formed through the silicon nitride film 3729, source electrodes 3730 and 3731 for the n-channel and p-channel FETs, respectively, and a drain electrode 3732 for both n-channel and p-channel FETs are formed. Thus, CMOS IG-FETs are completed as shown in FIG. 26C.

Figure 26C:
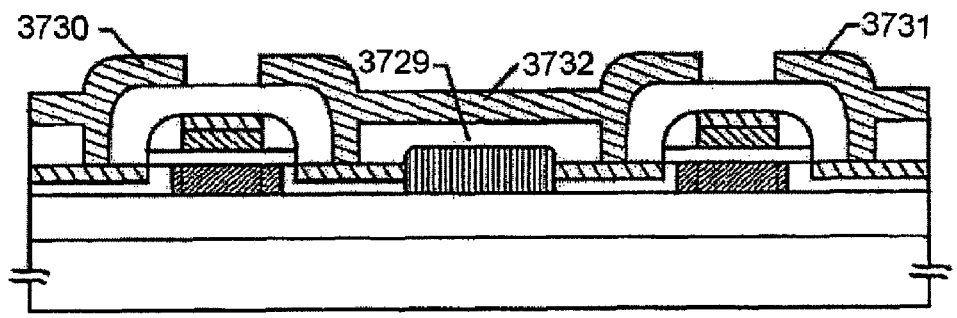

Capable of being miniaturized without causing any problems of the short channel effects by virtue of the invention, the CMOS circuit having the structure of FIG. 26C can provide integrated circuits of an extremely high degree of integration.

Although the embodiment is directed to a single gate IG-FET, the invention can also be applied to a case of manufacturing a double gate FET having channels on both top and bottom surface sides of an active layer because of the SOI structure. It goes without saying that the invention can also be applied to a power MOSFET, a MESFET, a MISFET, etc.

This embodiment is characterized in that the impurity regions are formed in linear patterns in the channel forming region of an IG-FET. Certain conditions (in ranges of parameters) need to be satisfied in forming the linear patterns, as described below with reference to FIGS. 27A and 27B.

Figure 27A:
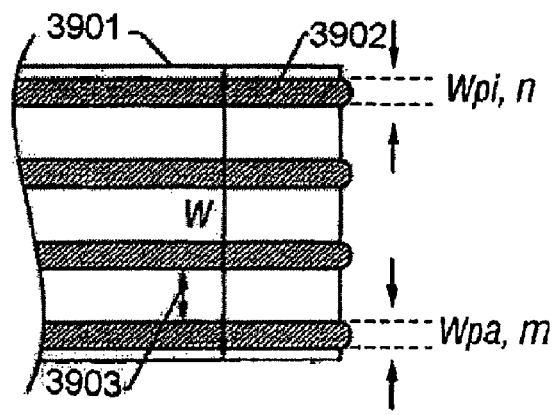
FIGS. 27A-27C illustrate a shape and an arrangement of the impurity regions according to a first embodiment of the invention.
Figure 27B:
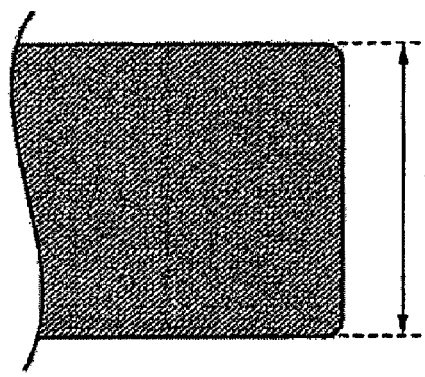
Figure 27C:
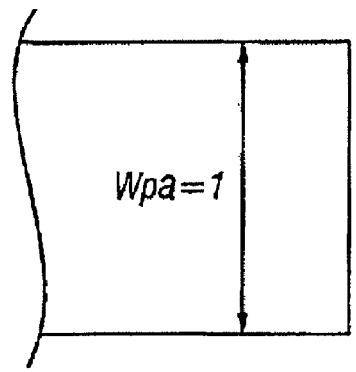

In FIGS. 27A and 27B, reference numeral 3901 denotes part of a channel forming region. Of a channel width W, the total width of linear patterns 3902 is represented by $W_{pi}$. It suffices that the total width $W_{pi}$ be 10-100 Å, for instance. Let the widths of the respective linear patterns 3902 be represented by $W_{pi,1}, W_{pi,2}, \ldots, W_{pi,n}, \ldots, W_{pi,N}, \ldots$; then $W_{pi}$ is given by $$W_{pi} = \sum_{n=1}^{N} W_{pi,n}$$

Since to realize the invention at least one impurity region needs to be formed at a position excluding both side ends of the channel forming region, N is an integer greater than or equal to 1.

Of the channel width W, the total width of potential slit regions (carrier movement paths) 3903 is represented by $W_{pa}$, which is set in a range where the quantum effect does not appear, that is, 30-3,000 Å (preferably 30-1,000 Å). According to the invention, threshold voltages $V_{th,n}$ and $V_{th,p}$ can be adjusted so as to fall within a range of 0 to ±0.3 V by making $W_{pa}$ about ⅓ to 1/1 of the channel length (0.01-0.35 μm). Let the widths of the respective linear patterns 3902 be represented by $W_{pa,1}, W_{pa,2}, \ldots, W_{pa,m}, \ldots, W_{p1,M}$; then $W_{pa}$ is given by is given by $$W_{pa} = \sum_{m=1}^{M} W_{pa,m}$$

Since as mentioned above at least one impurity region needs to be formed at a position other than both sides of the channel forming region, M is an integer greater than or equal to 2.

Thus, relationships the channel width $W=W_{pi}+W_{pa}$ and $N+M \geqq 3$ hold. It is desirable that the following conditions be satisfied simultaneously with respect to relationships between W and $W_{pi}$, between W and $W_{pa}$, and $W_{pi}$, and $W_{pa}$:

$W_{pi}/W$=0.1 to 0.9

$W_{pa}/W$=0.1 to 0.9

$W_{pi}/W_{pa}$=⅑ to 9

The above equations mean that $W_{pa}/W$ and $W_{pi}/W$ should not be 0 or 1. For example, if $W_{pa}/W$=0(i.e., $W_{pi}/W$=1), the channel forming region is completely filled with the impurity region as shown in FIG. 27B and hence there is no current flowing path.

Conversely, $W_{pa}/W$=0(i.e., $W_{pi}/W$=0), there exists no impurity region in the channel forming region and hence the expansion of the drain-side depletion layer cannot be suppressed.

For the above reasons, it is desirable that $W_{pa}/W$ and $W_{pi}/W$ fall within the range of 0.1-0.9 (preferably 0.2-0.8) and, at the same time, $W_{pi}/W_{pa}$=⅑ to 9 be satisfied.

In the invention, for the reasons described below, arranging the linearly patterned impurity regions as shown in FIG. 23A has an important meaning for increase of the mobility, which is a typical parameter representing the performance of a FET.

The mobility is determined by scattering of carriers in a semiconductor (in this embodiment, a silicon substrate), and scattering in a silicon substrate is generally classified into lattice scattering and impurity scattering. The lattice scattering is dominant when the impurity concentration in a silicon substrate is low and the temperature is relatively high, and the impurity scattering is dominant when the impurity concentration is high and the temperature is relatively low. The total mobility p, which reflects both factors, is given by $$\mu = (1/\mu_l + 1/\lambda_i)^{-1} \quad (5)$$

The above equation means that the total mobility II is in inverse proportion to the sum of reciprocals of mobility μ (suffix "1" is for lattice) that reflects influence of the lattice scattering and mobility μ (suffix "i" is for impurity) that reflects influence of the impurity scattering.

As for the lattice scattering, acoustic phonons play an important role if the drift electric field is not strong and the mobility μ in such a state is in proportion to the (−3/2)th power of the temperature as given by Formula (6). Thus, the mobility μ is determined by only the effective mass m* of carriers and the temperature T.

$$\mu_l \propto (m^*)^{-5/2} T^{-3/2} \quad (6)$$

On the other hand, the mobility $\lambda_i$ which relates to the impurity scattering is in proportion to the (3/2)th power of the temperature and in inverse proportion to a concentration Ni of ionized impurities as given by Formula (7), and can be varied by adjusting a concentration Ni of ionized impurities.

$$\mu_i \propto (m^*)^{-5/2} T^{-3/2} \quad (7)$$

Formulae (6) and (7) indicate that the conventional channel doping of adding an impurity to the entire channel forming region cannot improve the mobility because of the influence of the impurity scattering. In contrast, in the invention, the impurity regions are formed locally and therefore no impurity is added to the potential slit regions whose total width is $W_{pa}$.

Theoretically, the concentration Ni of ionized impurities in Formula (7) is made infinitely close to 0 and hence the mobility $\mu_i$ approaches infinity. In Equation (5). it is meant that the impurity concentration is reduced to such an extent that the term $1/\mu_i$ is disregarded, and hence the total mobility p becomes infinitely close to the mobility $\mu_1$.

It is theoretically possible to further increase the mobility 4, by decreasing the carrier effective mass m*. This can be done by utilizing the fact that in a very low temperature range the effective mass of carriers (particularly electrons) varies depending on the crystal axis orientation.

According to the literature, the minimum effective mass is obtained when the channel direction (carrier movement direction) connecting the source and the drain is set coincident with the [100] axis direction of single crystal silicon.

Figure 28:
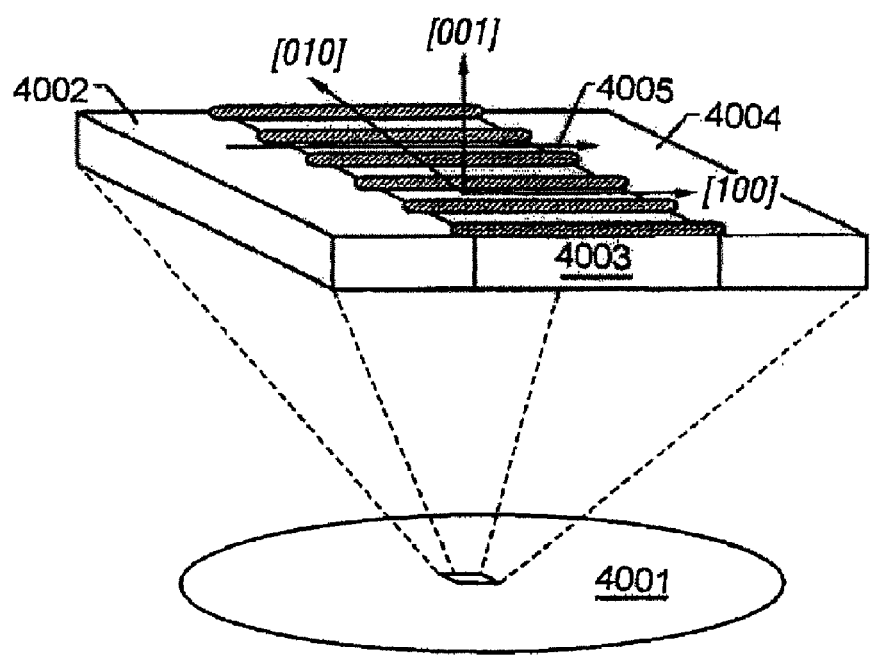
FIG. 28 illustrates a proper orientation of the channel direction according to a first embodiment of the invention.

For example, assume that a source region 4002, a channel forming region 4003, and a drain region 4004 are formed on a single crystal silicon substrate 4001 having the [100] plane as shown in FIG. 28. The above orientation corresponds to a case where a channel direction 4005 is set coincident with the [100] direction. However, in this example the intended result is obtained at a very low temperature of 4° K.

Further, to allow carriers to "slip through" crystal lattices, it is desirable that the channel direction and the longitudinal axis direction of the impurity regions be generally parallel with the crystal lattice axial direction (the deviation be made within) ±10°. In the case of a single crystal where silicon atoms are arranged regularly, carriers moving parallel with a crystal lattice arrangement direction are scarcely influenced by the lattice scattering.

For example, if the rotation axis in the above-mentioned direction is defined as 0° in a single crystal silicon substrate, the same effects can be obtained with other rotation axes of 90°, 180°, and 270°.

As described above, in the channel forming regions carriers go through the regions other than the impurity regions. This will be described briefly with reference to schematic drawings of FIGS. 29A-29C.

Figure 29A:
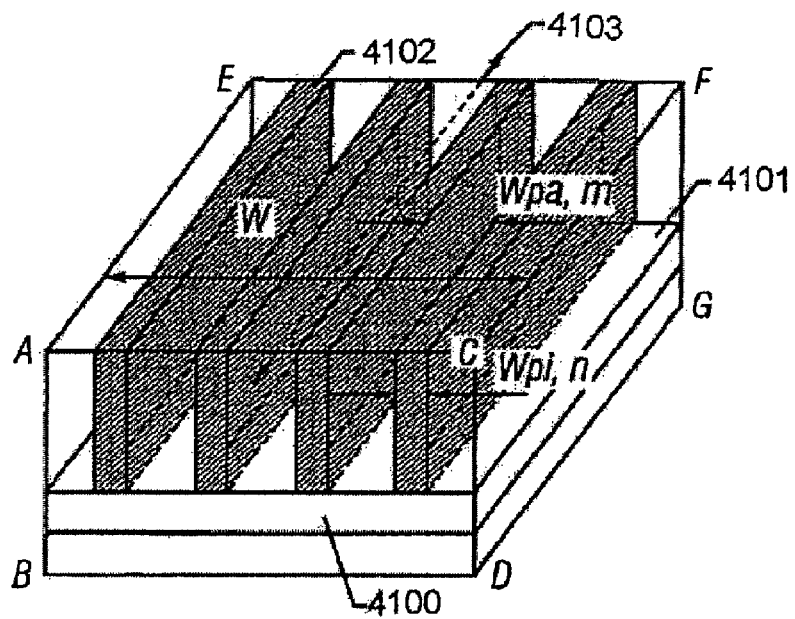
FIGS. 29A-29C shows a configuration of the channel forming region according to a first embodiment of the invention.

In FIG. 29A, reference numeral 4101 denotes a channel forming region. That is, FIG. 29A is a perspective view in which the channel forming region 4101 is viewed from a top right position. In this embodiment, impurity regions 4102 are formed, three-dimensionally, as shown in FIG. 29A.

In FIG. 29A, arrow 4103 indicates a carrier (electrons or holes) traveling direction. As shown in FIG. 29A, a plurality of impurity regions 4102 are arranged in the channel forming region 4101 and carriers go through the regions other than the impurity regions 4102.

Figure 29B:
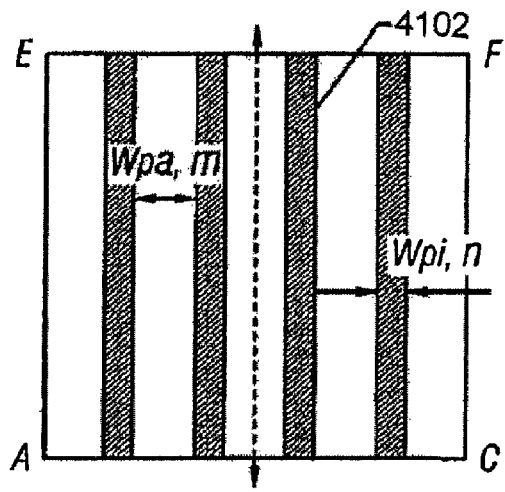

FIG. 29B is a top view of the channel forming region 4101 and shows plane ACEF in FIG. 29A. As shown in FIG. 29B, carriers go through the regions that are free of impurity scattering while avoiding the impurity regions 4102.

Most of carriers move between the source and the drain through the regions between the impurity regions 4102 as indicated by the arrow. The invention naturally includes a case where impurity regions are provided in dot patterns and carriers move in a zigzag so as to avoid the impurity regions.

Figure 29C:
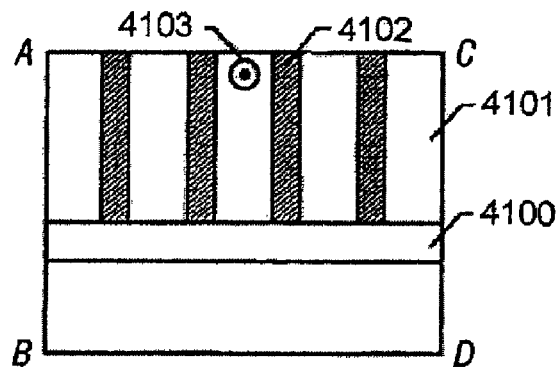

FIG. 29C is a side view of the channel forming region 4101 and shows plane ABCD in FIG. 29A. Arrow 4103 is directed to the viewer's side. FIG. 29C also indicates that carriers go through the regions between the impurity regions 4102.

Figure 30A:
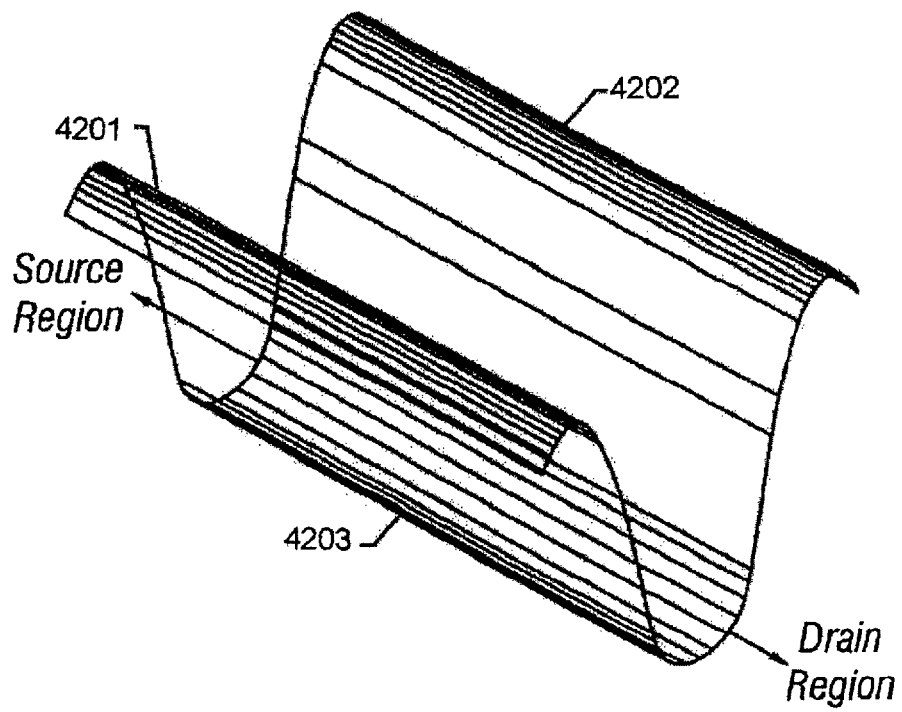
FIGS. 30A and 30B illustrate an energy profile of the channel forming region according to a first embodiment of the invention.

In a potential slit region that is interposed between linearly patterned impurity regions, it is the energy state (potential state) is believed to have a profile as schematically shown in FIG. 30A.

In FIG. 30A, reference numerals 4201 and 4202 denote energy states in impurity regions, which are high energy barriers. As the position goes away from the impurity regions, the energy gradually decreases, and reference numeral 4203 denotes a low energy region. In the channel region, carriers (in this example, electrons) move, with preference, through the low energy region 4203 while the energy barriers (impurity regions) 4201 and 4202 act like walls.

Figure 30B:
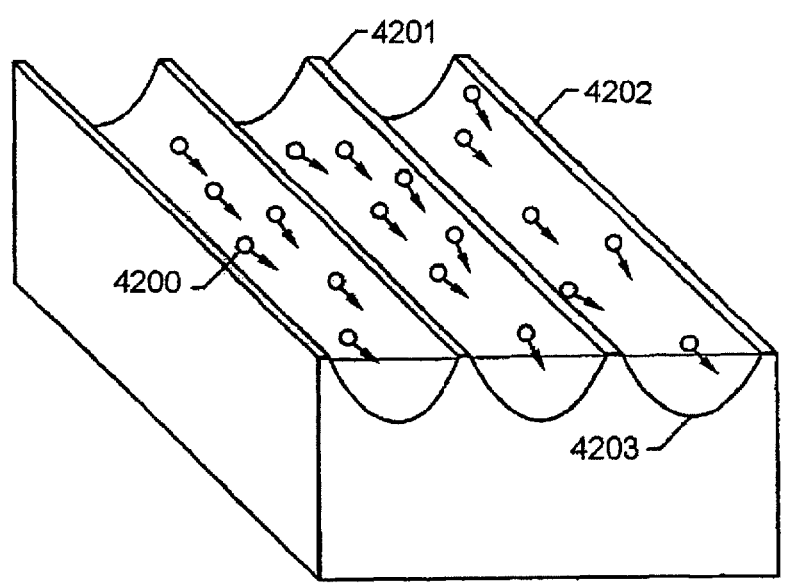

FIG. 30B schematically illustrates carriers (electrons) moving through the channel region. As shown in FIG. 30B, stated in images, the directivity of carriers 4200 moving through the channel regions is defined like that of balls rolling down a trough; carriers 4200 approximately go along the shortest route from the source region to the drain region.

The inventors recognizes the energy profile of FIG. 30A as an electrical slit and call it a potential slit region. The inventors also call it a lane region, imagining balls rolling on a lane based on the model as shown in FIG. 30B.

Although in FIG. 30B the channel forming region consists of a plurality of potential slit regions like the one shown in FIG. 30A are arranged parallel with each other, carriers do not go over the barrier regions 4201 and 4202, that is, there is no carrier movement between adjacent potential slit regions.

For the reasons described above, the probability that a carrier collides with other carriers is very much reduced and hence the mobility is greatly increased. That is, according to the invention, the mobility can be greatly increased not only by reducing the impurity scattering but also by reducing the scattering due to self-collision of carriers.

The concept of the invention is entirely novel in which energy barriers such as grain boundaries, which are conventionally believed to cause only adverse effects, are formed intentionally and utilized.

Embodiment 16

In the invention, impurity regions may be formed in a channel forming region by utilizing segregation of an impurity. In this embodiment, with reference to FIGS. 31A-31B and 32A-32C, a description will be made of an example of such a method, that is, a method which utilizes segregation of boron (B) or phosphorus (P) in the vicinity of a thermal oxidation film.

This embodiment is a technique which utilizes a phenomenon that an impurity element (boron or phosphorus) that is contained around the impurity regions (i.e., in the potential slit regions) segregates in the impurity regions. Now, referring to FIGS. 31A and 31B, a description will be made of a boron or phosphorus concentration profile in the vicinity of a thermal oxidation film/silicon interface after execution of a thermal oxidation process.

Figure 31A:
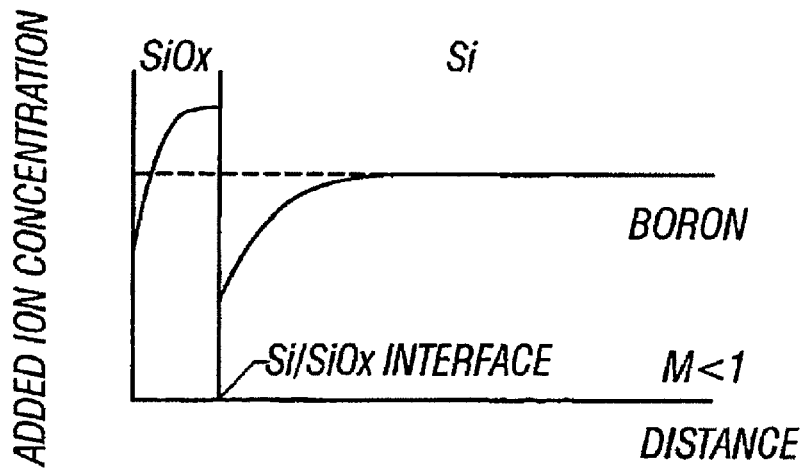
FIGS. 31A and 31B show impurity concentration profiles in the vicinity of a thermal oxidation film/silicon interface according to a second embodiment of the invention.
Figure 31B:
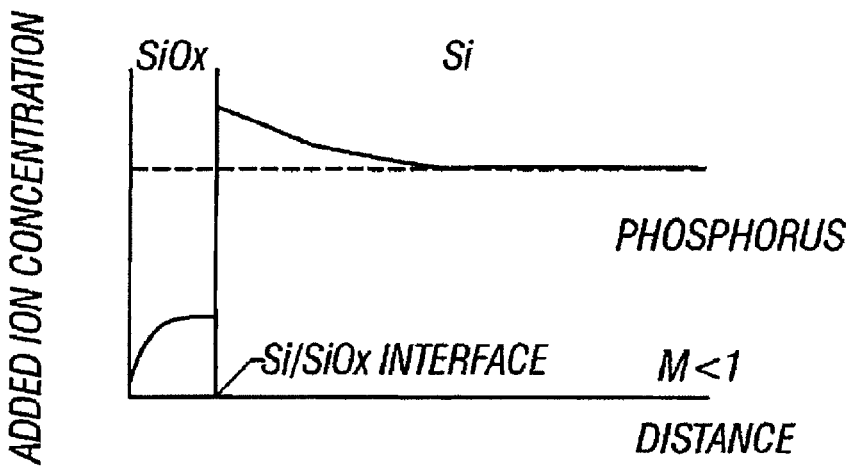

As shown in FIGS. 31A and 31B, added ions (B or P) existing in Si are redistributed when an oxide film is formed. This phenomenon is caused by differences in the solubility and diffusion rate of added ions between silicon (Si) and the thermal oxidation film ($SiO_x$). Let $[C]_{Si}$ and $[C]$ $SiO_x$ represent solubilities of an impurity in (Si) and ($SiO_x$), respectively; then, an equilibrium segregation coefficient m is defined as $$m=[C]_{Si}/[C]_{SiOx}$$

The segregation of the impurity in the vicinity of the Si/$SiO_x$ interface is governed by the value of m. Usually, with an assumption that diffusion coefficient of the impurity in Si is sufficiently large, the impurity in Si is taken into $SiO_x$ if m<1 (see FIG. 31A). If m>1, $SiO_x$ rejects the impurity, so that the impurity concentration increases in the vicinity of the Si/$SiO_x$ interface (see FIG. 31B).

According to the literature, the coefficient m is about 0.3 for boron and about 10 for phosphorus. Therefore, a boron concentration profile after execution of the thermal oxidation treatment of this embodiment. becomes as shown in FIG. 31A. Boron is taken into the thermal oxidation film and the boron concentration is extremely low at the side surfaces (in the vicinity of the Si/$SiO_x$ interfaces) of the impurity regions. On the other hand, the thermal oxidation film formed contain a large amount of boron.

Although the phenomenon that boron is taken into a thermal oxidation film was known, the concept of the invention in which this phenomenon is utilized to form energy barriers (impurity regions) is entirely novel.

Where phosphorus is used as an impurity element, it segregates (piles up) at the interface between a thermal oxidation film and silicon as shown in FIG. 31B. This phenomenon can also be utilized to form impurity regions in a p-channel FET.

Figure 32A:
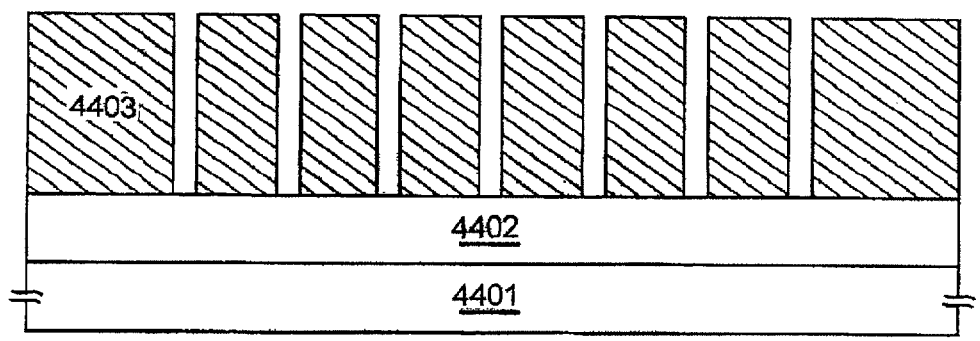
FIGS. 32A-32C show a process of forming impurity regions according to a second embodiment of the invention.

Next, with reference to FIGS. 32A-32C, a description will be made of an example of actual formation of impurity regions. FIG. 32A shows a single crystal silicon layer of a SOI substrate. Reference numerals 4401 and 4402 denote an insulating layer and a single crystal silicon layer, respectively. Examples of the SOI substrate are a SOS substrate, a SIMOX substrate, and a FIPOS substrate.

A resist pattern 4403 for formation of impurity regions is formed on a channel forming region by using a fine lithography technique such as an electron beam method, a FIB method, or an excimer laser method.

Figure 32B:
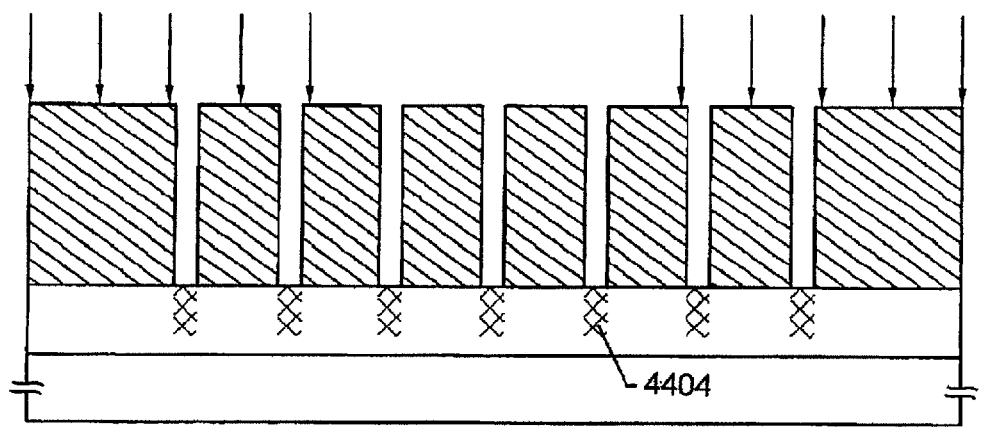

In the state of FIG. 32A, Ar (argon) is implanted by ion implantation (see FIG. 32B). Although Ar is used in this embodiment, other rare gases such as He (helium) and Ne (neon) may also be used.

The above ion implantation is performed by using an electrically inactive element because it aims at damaging the single crystal silicon layer 4402. This is because this embodiment utilizes a tendency that when single crystal silicon is thermally oxidized, damaged regions are oxidized with preference given thereto.

Thus, Ar-added regions 4404 in FIG. 32B are damaged and disordered in crystal arrangement as compared to the other regions.

Figure 32C:
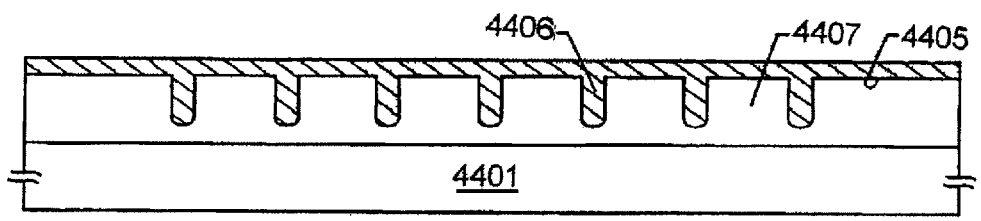

After the resist pattern 4403 is removed, a heat treatment is performed in a temperature range of 800°-1,200° C. as shown in FIG. 32C. In this embodiment. a heat treatment at 1,000° C. is continued for 60 minutes such that an oxidizing atmosphere is used in the first 30 minutes and then switched to a halogen atmosphere including nitrogen $N_2$; 90%), oxygen ($O_2$; 9%), and hydrogen chloride (HCl; 1%) in the last 30 minutes.

The heat treatment in the first 30 minutes is for thermal oxidation and that in the last 30 minutes is for gettering of metal elements. The reason why the last heat treatment is performed in an atmosphere containing a large amount of nitrogen is to prevent excessive oxidation of the single crystal silicon layer 4402.

Thus, a thermal oxidation film 4405 is formed in the single crystal silicon layer 4402 as shown in FIG. 32C. At the same time, the oxidizing reaction proceeds in the regions 3404 with preference given thereto, so that impurity regions (made of silicon oxide in this case) 3406 are formed so as to go into the single crystal silicon layer 3402. Although in FIG. 32C the impurity regions 3406 do not reach the underlying insulating layer 3401, there may be a case that the impurity regions 3406 are formed so as to reach the insulating layer 3401 by properly adjusting the Ar implantation conditions.

Alternatively, the embodiment may be practiced by damaging the single crystal silicon layer 3402 by directly applying, for instance, an electron beam or a focused ion beam to the single crystal silicon layer 3402.

In the process that the impurity regions 3406 are formed by oxidation in the above manner, an impurity element contained in the adjacent potential slit regions is segregated.

Therefore, if an impurity element for imparting one type of conductivity to the channel forming region is added to it, the impurity element segregates in the impurity regions 3406 (in the case of boron) or on the side surfaces of the impurity regions 3406 (in the case of phosphorus). The configuration of the first embodiment of the invention can be obtained by causing boron to segregate in oxide regions to manufacture an n-channel PET and causing phosphorus to segregate on the side surface of oxide regions to manufacture a p-channel PET.

Since this embodiment utilizes both of the metal element gettering effect of a halogen element and the segregation of boron or phosphorus in or on a thermal oxidation film, there exist neither causes of impurity scattering nor impurity elements as recombination centers in the carrier movement regions (particularly in the vicinity of the impurity regions 3406) which are intrinsic or substantially intrinsic.

As described above, this corresponds to increase of $\mu_l$ in Equation (5), in which case the total mobility $\mu$ approaches the ideal case of $\mu=\mu_l$. This indicates that an extremely high mobility can be realized which is determined substantially only by the lattice scattering. Thus, this embodiment enables formation of a semiconductor device having an extremely high mobility.

Embodiment 17

This embodiment is directed to a case of forming dot-patterned impurity regions in a channel forming region. This embodiment will be described with reference to FIGS. 33A-33C in which the same reference numerals as in FIGS. 23A-23C are used for convenience of description.

Figure 33A:
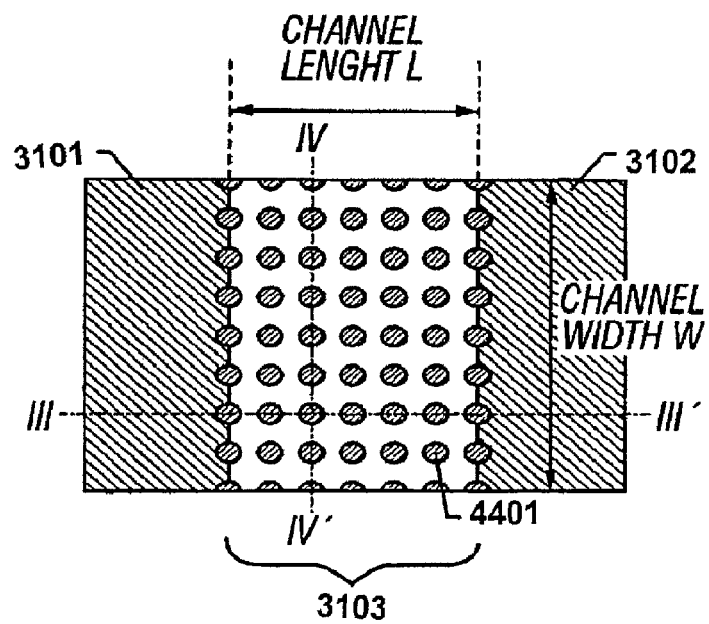
FIGS. 33A-33C show a configuration of a channel forming region according to a third embodiment of the invention.
Figure 33B:
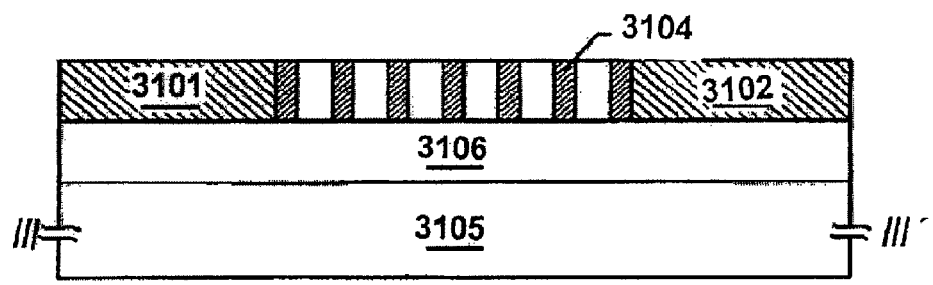
Figure 33C:
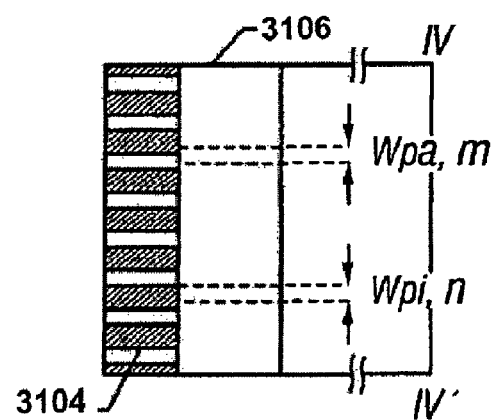

A semiconductor device of FIGS. 33A-33C are configured such that the linearly patterned impurity regions in FIGS. 23A-23C are replaced by dot-patterned ones. That is, impurity regions 4501 are arranged as shown in FIG. 33A.

FIGS. 33B and 33C are sectional views taken along lines A-A' and B-B' in FIG. 33A, respectively.

Although this embodiment employs circular impurity regions as the dot-patterned impurity regions, the dot-patterned impurity may have an elliptical shape, a square shape, a rectangular shape, or the like.

The dot-patterned impurity regions do not provide the role of the lane regions of the first embodiment. However, since the effective channel area (carrier movable area) is larger than in the case of the linearly patterned impurity regions, the dot-patterned impurity regions can increase the amount of current that is allowed to flow through a semiconductor device.

Embodiment 18

In the first and third embodiments, the impurity regions have the simplest forms, i.e., linear patterns and dot patterns, respectively. This embodiment is directed to variations of the shape of the impurity regions.

Figure 34A:
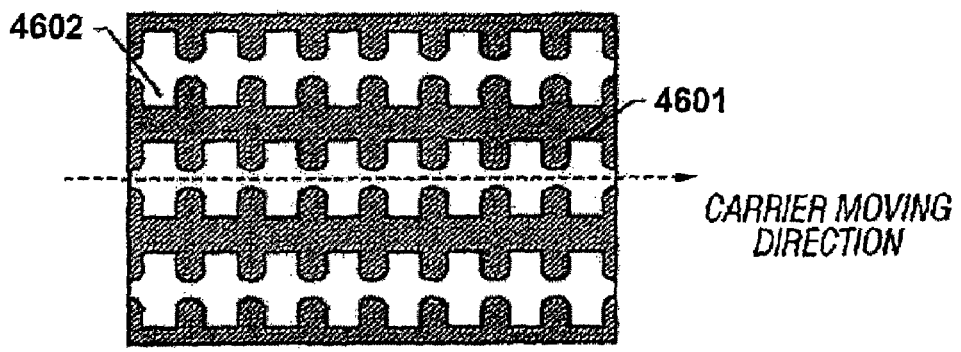
FIGS. 34A-34D show structures of impurity regions according to a fourth embodiment of the invention.

FIG. 34A shows a variation of the linearly patterned impurity regions. In this structure, the first priority is given to prevention of the punch-through phenomenon as one of the short channel effects by enhancing the invention's effect of "pinning" (preventing) expansion of a depletion layer from the drain region side to the channel forming region side.

As seen from FIG. 34A, impurity regions 4601 is characterized in that the side surfaces of linearly patterned impurity regions are formed with protrusions and recesses 4602 when viewed from above, to assume what is called a fishbone shape. The protrusions and recesses 4602 on the side surfaces effectively prevent expansion of the depletion layer.

Figure 34B:
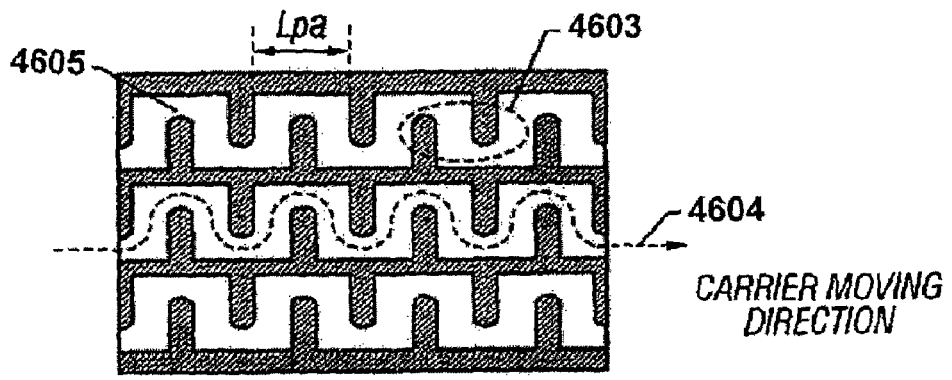

FIG. 34B shows a structure as an advanced version of the structure of FIG. 34A, which further enhances the pinning effect. Because of fishbone shapes conforming to each other, the impurity regions are opposed to a depletion layer in a larger area, whereby the expansion of the depletion layer can be prevented more effectively.

It is desirable that as shown in FIG. 34B the protrusions and recesses 4602 (corresponding to a bone portion of the fishbone shape) are formed such that the protrusions of one impurity region overlap with those of the adjacent impurity region (see portion 4603 in FIG. 34B).

However, in this structure, it is unavoidable that the movement distance of carriers is increased because they move along a path indicated by a broken line 4604. The increased movement distance would increase the carrier scattering probability, which may in turn reduce the mobility.

However, in very fine semiconductor devices for which the invention is effective, a small increase in movement distance would not much increase the influence of the impurity scattering as long as the channel forming region is intrinsic or substantially intrinsic. Suppressing the influences of the short channel effects (particularly the punch-through phenomenon) due to the miniaturization is more important than the above issue.

As for each impurity region, it is necessary to control the distance (represented by Lpa in FIG. 36B) between adjacent protrusions. The distance Lpa should be shortened to enhance the pinning effect, and should be elongated if increase in mobility is considered more important. In the invention, the distance Lpa is controlled so as to fall within a range of 70-3,000 Å. (preferably 100-1,000 Å).

In the structure of FIG. 34B, the width and the length of the regions (carrier movement regions, potential slit regions) 4605 other than the impurity regions influence the carrier mobility.

Figure 34C:
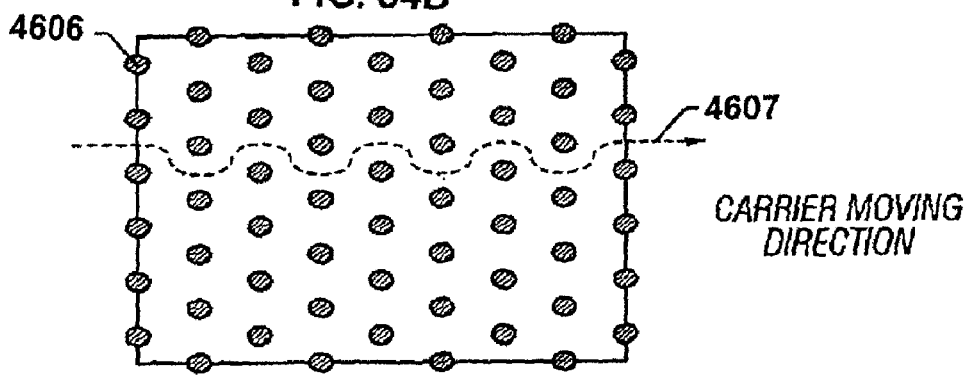

The invention may have variations in the case of the dot-patterned impurity regions as well as the linearly patterned ones. For example, impurity regions 4606 may be arranged alternately as shown in FIG. 34C.

In this structure, since the dot-shaped impurity regions 4606 on one column are located on lines connecting the gaps of the dot-shaped impurity regions 4606 on the adjacent columns, the effect of preventing the expansion of a depletion layer is enhanced. Although the carrier movement path is increased as indicated by a broken line 4607, it is not a serious problem in fine semiconductor devices as described above.

Figure 34D:
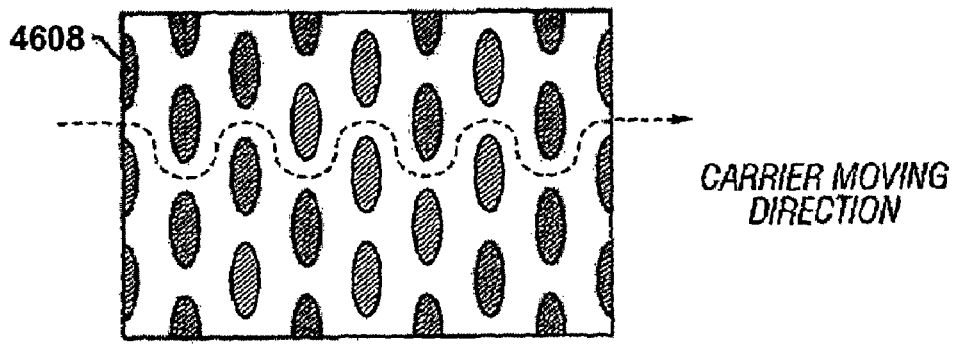

FIG. 34D shows a structure in which dot-patterned impurity regions 4608 have an elliptical shape (or a rectangular shape) whose major axis is perpendicular to the channel direction. This structure is effective in a case where preventing the expansion of a depletion layer is most important.

As described above, the punch-through phenomenon as one of the short channel effects can be prevented effectively by properly shaping the impurity regions. Since the impurity regions are formed artificially, their shape can be designed freely as a manufacturer desires.

In particular, the shapes of this embodiment shown in FIGS. 34A-34D are effective in manufacturing extremely fine semiconductor devices having a channel length of less than 0.1 μm. This is because the reduction in breakdown voltage due to the punch-through phenomenon is fatal to such fine devices and hence weight should be given to increase in breakdown voltage rather than increase in mobility.

Embodiment 19

This embodiment relates to structures of impurity regions that are different from those of Embodiment 4. This embodiment will be described with reference to FIGS. 35A-35D.

Figure 35A:
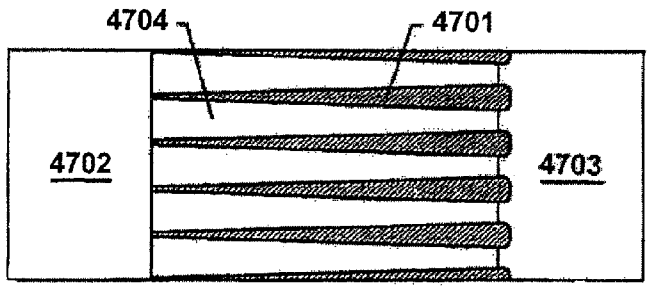
FIGS. 35A-35D show structures of impurity regions according to a fifth embodiment of the invention.

FIG. 35A shows a structure in which the total width $W_{pi}$ of impurity regions 4701 in the vicinity of a source region 4702 is different from that in the vicinity of a drain region 4703. More specifically, the total width $W_{pi}$ is gradually increased as the position approaches the drain region 4703.

With the structure of FIG. 35A, the expansion of the drain-side depletion layer, which is a case of the punch-through phenomenon as one of the short channel effects, can be suppressed effectively. On the source region side, carriers move smoothly because the total width $W_{pa}$ of potential slit region 4704 is sufficiently large.

Figure 35B:
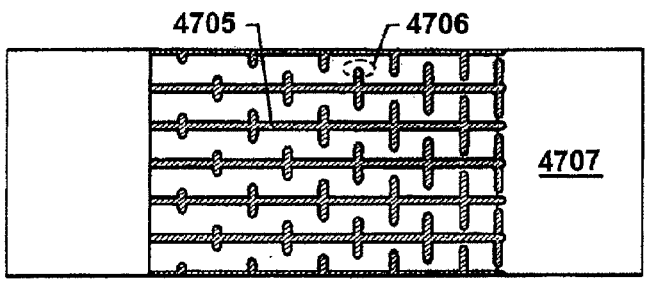

This type of structure can also be realized by forming fishbone-shaped impurity regions 4705 such that protrusions and recesses 4706 become longer as the position approaches a drain region 4707 as shown in FIG. 35B.

Figure 35C:
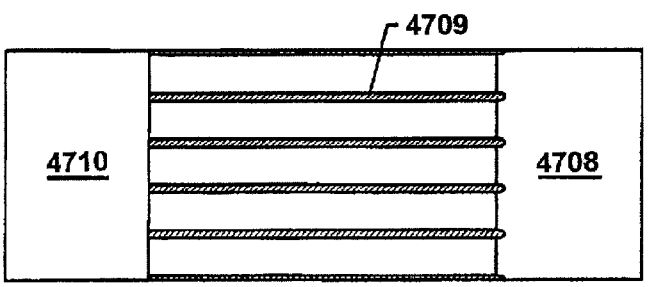

FIG. 35C shows a structure in which the concentration of an impurity element for constituting impurity regions 4709 is set high in the vicinity of a drain region 4708. As shown in FIG. 35C, the impurity regions 4709 are formed in linear patterns from a source region 4710 to the drain region 4708.

Figure 35D:
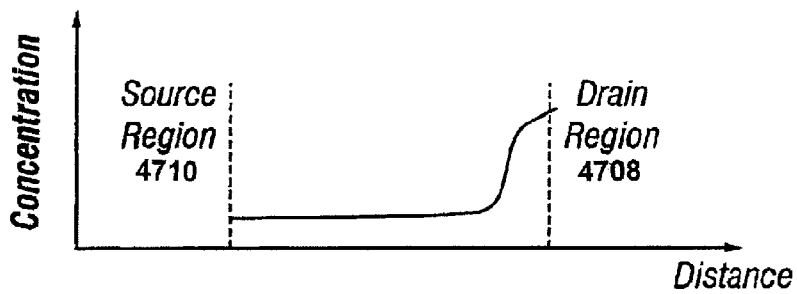

FIG. 35D is a graph showing a variation of the impurity element concentration in the impurity regions 4709 in which the horizontal axis represents the distance and the vertical axis represents the concentration. As seen from FIG. 35D, the concentration of an impurity element for constituting the impurity regions 4709 is set higher than in the vicinity of the source region 4710 than in the vicinity of the drain region 4708.

To provide a concentration profile shown in FIG. 35D in which the concentration in the vicinity of the source region 4710 is different from in the vicinity of the drain region 4708, the concentration of the impurity element may be adjusted properly in forming the impurity regions 4709.

A manufacturer need not stick to the impurity element concentration profile of FIG. 35D, but may determine a concentration profile by properly adapting an impurity adding process when necessary.

The structure of this embodiment are effective in a case where the source and drain regions are fixed. For example, this embodiment is not necessarily effective for a semiconductor device for driving a pixel of a liquid crystal display device in which case the source and the drain are reversed in accordance with a charging/discharging operation. Where the semiconductor device of this embodiment is applied to liquid crystal display device, it should be used in a circuit in which the source and the drain are fixed, such as an invertor circuit that constitutes a peripheral driver circuit.

Although this embodiment is directed to the impurity regions as variations of the linearly patterned impurity regions that are generally parallel with the channel direction, the concept of this embodiment can easily be applied to the dot-pattered impurity regions. As so exemplified, this embodiment is just an example and a manufacturer would employ other various conceivable structures when necessary.

Embodiment 20

The invention is characterized in that the impurity regions are provided in the channel forming region artificially and locally. An impurity element (one or a plurality of elements selected from carbon, nitrogen, and oxygen) locally added to the channel forming region is effective in the case of using a low oxygen concentration silicon substrate that has been subjected to hydrogen annealing.

As described in the background section, semiconductor devices (excluding a thyristor) for constituting ordinary LSI circuits are manufactured by using a silicon substrate that is formed by the CZ method and such a silicon substrate contains a given amount of oxygen for reduction of stress. However, in recent years, as increase in the breakdown voltage of oxide films and reduction of micro detects are required increasingly, substrates in which the oxygen concentration is reduced to less than $1\times10_{17}$ atoms/cm$^3$ in a surface layer of about 5 μm in thickness by annealing in a hydrogen atmosphere come to be used many cases.

On the other hand, in such silicon substrates that have been subjected to a low oxygen concentration treatment, there is a possibility that the surface layer becomes too weak to withstand stress and a crack and a warp tend to occur more easily in a manufacturing process of semiconductor devices.

In contrast, if a silicon substrate that has been subjected to a low oxygen concentration treatment is used in practicing the invention, stress concentrates at the impurity regions formed in the channel forming region. Thus, the impurity regions serve as buffer regions for buffering stress that occurs in a crystalline semiconductor.

The effect that the impurity regions serve as stress buffering regions is one of the invention's advantages worthy of mention. This effect is particularly remarkable when oxygen is used as an impurity element.

Thus, when semiconductor devices are manufactured by using a silicon substrate that has been subjected to a low oxygen concentration treatment, the influence of stress occurring in the manufacturing process can be reduced, as a result of which the manufacturing yield can be increased greatly.

In addition to increase in the breakdown voltage of an oxide film and reduction of microdefects, reduction in the influence of impurity scattering of carriers is expected in the above type of silicon substrate. That is, reducing the oxygen concentration means that the potential slit regions are made closer to intrinsic or substantially intrinsic regions, and therefore the carrier mobility can be made extremely high.

Embodiment 21

In this embodiment, examples of integrated circuits (covered by the term "semiconductor device" as used in this specification) that use semiconductor devices (or elements) according to the invention. This embodiment will be described with reference to FIGS. 36A-36B and 37A-37B.

Figure 36A:
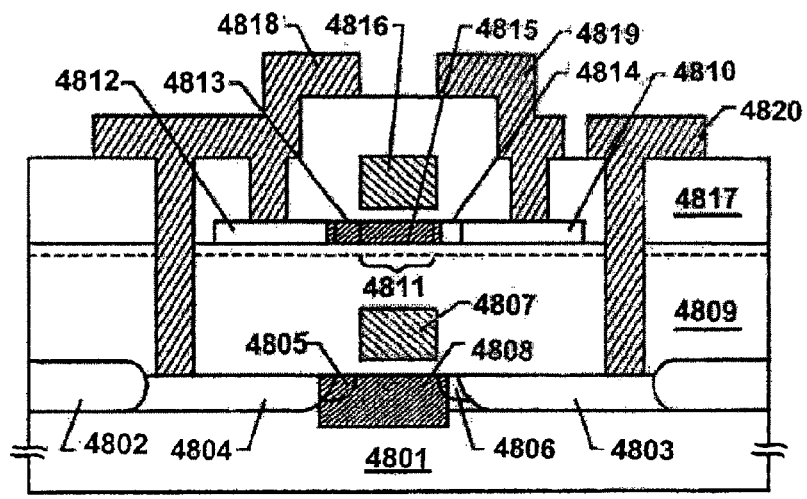
FIGS. 36A-36B and 37A-37B show configurations of semiconductor devices according to a seventh embodiment of the invention.

FIG. 36A shows an example in which the invention is applied to a stacked CMOS circuit formed by laying an n-channel FET and a p-channel FET in two stages. From the viewpoint of operation performance, it is common that a p-channel FET is formed in the lower layer, which is also the case in this embodiment.

Referring to FIG. 36A, a p-channel FET is formed in the lower layer by an ordinary IC technology. Reference numeral 4801 denotes an n-type silicon substrate; 4802, a field oxide film; 4803, a source region; and 4804, a drain region. In this embodiment, low-concentration impurity regions (the one on the drain region side is called a LDD region) 4805 and 4806 are formed.

Reference numeral 4807 denotes a gate electrode made of conductive polysilicon. Impurity regions 4808 which is the feature of the invention are formed right under the gate electrode 4807. In the example of FIG. 36A, one ends of the impurity regions 4808 are located in the low-concentration impurity region 4806 and the other ends are located in the drain region 4804 past the LDD region 4805.

An n-channel FET is formed in the upper layer by using the SOI technology. A single crystal silicon layer as the active layer of the n-channel FET is obtained by using a known wafer bonding technique. Therefore, an interlayer insulating film 4809 is a lamination film of an interlayer insulating film that covers the lower layer FET and a thermal oxidation film of the wafer bonded, and hence includes a bonding surface (indicated by a broken line).

Then, a source region 4810, a channel forming region 4811, and a drain region 4812 are formed by a known TFT technique. Also in this case, low-concentration impurity regions 4813 and 4814 are formed such that a channel forming region 4811 are interposed in between. Impurity regions 4815 according to the invention are formed in the channel forming region 4811.

After an interlayer insulating film 4817 is formed so as to cover a gate electrode 4816, interconnections 4818-4820 are formed. The interconnection 4818 is common to the drain region 4804 of the p-channel FET and the drain region 4812 of the n-channel FET.

The stacked CMOS circuit having the above-described structure of FIG. 36A can reduce the device occupation area, and therefore can increase the degree of integration when used in constructing a VLSI or a ULSI.

Since the use of the invention allows pursuit of high-speed operation without lowering the breakdown voltage, it becomes possible to provide a CMOS circuit superior in frequency characteristic.

Figure 36B:
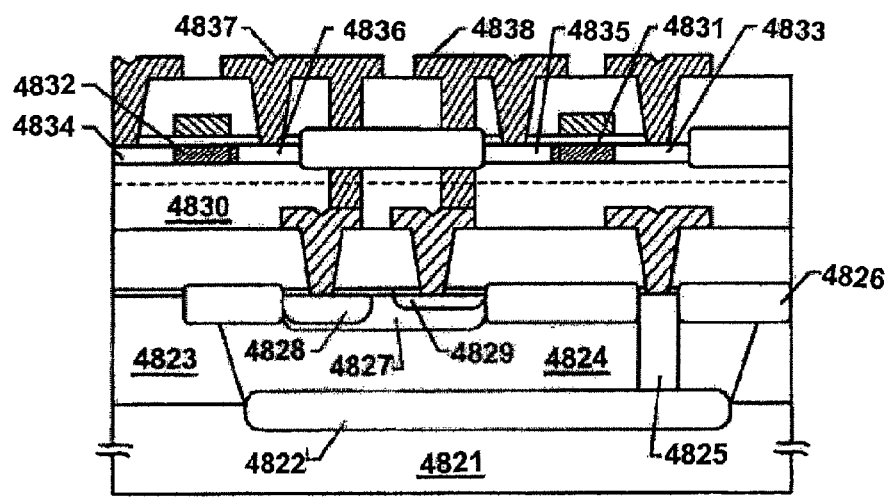

Next, FIG. 36B shows an example in which the invention is applied to a Bi-CMOS circuit that is a composite circuit of a CMOS circuit and a bipolar transistor. A bipolar transistor is formed in the lower layer and a CMOS circuit including semiconductor devices of a SOI structure is formed in the upper layer.

Referring to FIG. 36B, reference numeral 4821 denotes a p-type silicon substrate; 4822, a buried $n^+$ region; and 4823, a p-well formed by epitaxial growth. A portion of the p-well 4823 located over the buried $n^+$ region 4824 has been doped with an n-type impurity has turned to an n-well 4824 serving as a collector. Reference numeral 4825 denotes a deep $n^+$ region as a lead-out electrode for the buried $n^+$ region 4822. Reference numeral 4826 denotes a field oxide film formed by an ordinary selective oxidation method.

To form the bipolar transistor in the n-well 4824, a p-type region 4827 as an active base is formed first and then a $p^+$ region 4828 as an external base and an $n^+$ region 4829 as an emitter region are formed.

The CMOS circuit of a SOI structure which has, as the active layer, the single crystal silicon layer obtained by the wafer bonding technique is formed over the above-configured bipolar transistor. An interlayer insulating film 4830 includes the bonding surface (indicated by the broken line). Since the CMOS circuit is not described here in detail because the sufficient description therefor has already been described made in Embodiment 1.

In the configuration of FIG. 36B, both of impurity regions 4831 of an n-channel FET and impurity regions 4832 of a p-channel FET are formed so as to go into drain regions 4835 and 4836 but do not go into source regions 4833 and 4834, respectively.

The upper-layer CMOS circuit and the lower-layer bipolar transistor are connected to each other by interconnections 4837 and 4838, to complete a Bi-CMOS structure.

The circuit configuration of the above Bi-CMOS circuit is intended to effectively utilize the high-speed operation of the bipolar transistor and the low power consumption of the CMOS circuit. By employing, as in this embodiment, a three-dimensional structure in which a CMOS circuit and a bipolar transistor are laminated, the occupation area can greatly be reduced, that is, a prior art problem of a large occupation area can be solved.

Figure 37A:
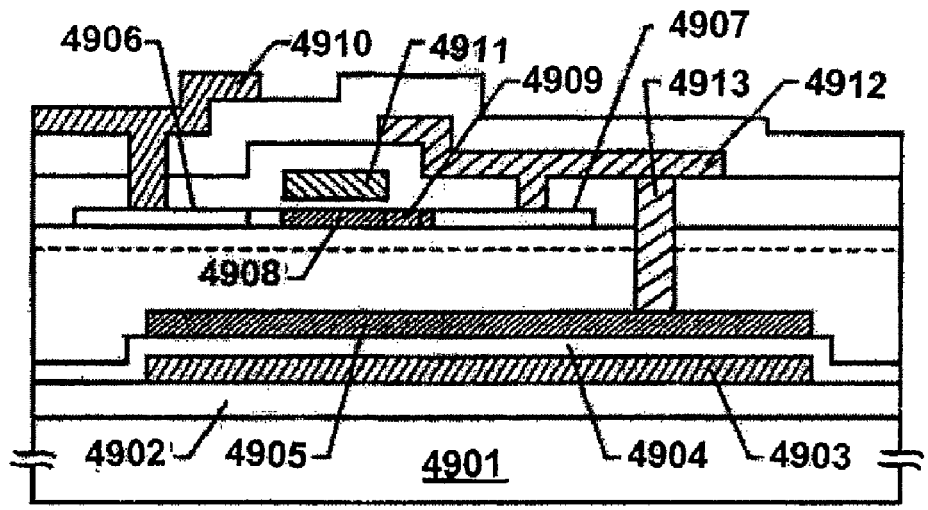

FIG. 37A shows an example in which the invention is applied to a DRAM (dynamic random access memory) manufactured by the SOI technology. The DRAM is a memory which stores information in a capacitor in the form of charge. Input/output of charge (information) is controlled by a semiconductor device (field-effect transistor) that is connected in series to the capacitor. This embodiment is directed to a case of using a stacked capacitor type DRAM.

Referring to FIG. 37A, reference numeral 4901 denotes a silicon substrate, and 4902 denotes an insulating film for isolating the silicon substrate 4901 from a charge storage electrode 4903 located above it. A capacitor electrode 4905 is provided over the charge storage electrode 4903 via an insulating film 4904 made of a large dielectric constant material. Although the insulating film 4904 is made of $Ta_2O_5$ in this embodiment, $Si_3N_4$ and like materials may also be used.

With the above structure, a capacitor having a large capacitance is formed between the capacitive storage electrode 4903 and the capacitor electrode 4905. The laminate structure of FIG. 37A has a feature that the lower layer is solely used as a charge storing region. Input/output of charge to/from the capacitor is performed by an IG-FET formed in the upper layer by the SOI technology.

In this embodiment, an n-channel FET having an LDD region is used as a semiconductor device for data signal control provided in the upper layer. Although in this embodiment a single crystal silicon layer as the active layer is obtained by a wafer bonding technique, it may be obtained by a polysilicon (or amorphous silicon) recrystallization technique that uses laser light or an electron beam. A bonding junction interface is indicated by a broken line in FIG. 37A.

The active layer, i.e., the single crystal silicon layer, includes a source region 4906 and a drain region 4907. Impurity regions 4908 according to the invention are formed in a channel forming region. The impurity regions 4908 are formed so as to penetrate through an LDD region 4909 and go into the drain region 4907.

A data signal sent via a bit line 4910 is supplied to a drain electrode 4912 by controlling the voltage of a word line 4911. The signal is then stored in the lower-layer capacitor via a buried plug 4913 that connects the drain electrode 4912 in the upper layer and the capacitor electrode 4905 in the lower layer.

The DRAM is suitable for construction of a high integration density, large-scale memory because each memory unit is constituted of a very small number of elements, i.e., an IG-FET and a capacitor. With an additional advantage of a low manufacturing cost, the DRAM is a circuit that is currently used in a largest quantity.

Figure 37B:
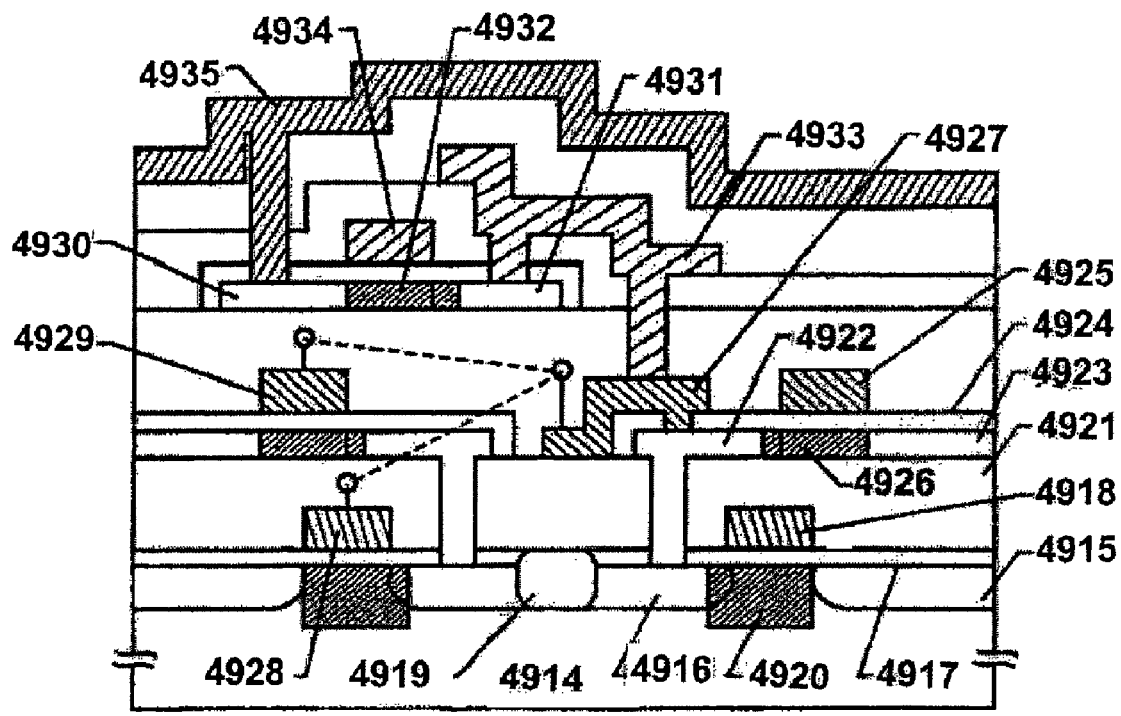

FIG. 37B shows an example in which FETs according to the invention are used in a SRAM (static random access memory).

The SRAM is a memory in which a bistable circuit such as a flip-flop is used as a storage element and which stores a binary information value (0 or 1) in accordance with the bistable state (on/off or off/on) of the bistable circuit. The SRAM is advantageous in being capable of holding information as long as it is supplied with a voltage.

The storage circuit is constituted of NMOS circuits or CMOS circuits. FIG. 37B is a sectional view of a cell as a combination of CMOS circuits of a SRAM. Both FETs in the lowermost layer are p-channel FETs and both FETs in the intermediate layer are n-channel FETs. Therefore, the following description will be basically directed to the two upper and lower FETs on the right-hand side of FIG. 37B.

Referring to FIG. 37B, a source region 4915 and a drain region 4916 which are p-wells are formed in an n-type silicon substrate 4914, and a gate electrode 4918 is formed above the n-type substrate 4914 through a gate insulating film 4917. The elements located on the right-hand side (as viewed in FIG. 37B) are isolated from those located on the left-hand side by a field oxide film 4919.

Reference numeral 4920 denotes impurity regions according to the invention. In this embodiment, the impurity regions 4920 are formed so as to go into the drain region 4916 but do not go into the source region 4915.

The active layer of the n-channel FET in the intermediate layer is formed by a laser (or electron) beam recrystallization method which is part of the SOI technology. More specifically, a polysilicon or amorphous silicon film is formed on a planarized interlayer insulating film 4921, melted by a laser beam, an electron beam, or the like, and then recrystallized.

Although another technique of the SOI technology, such as the wafer bonding technique, may naturally be used, in this embodiment the recrystallization method allows the drain region 4922 of the intermediate-layer n-channel FET to be directly connected to the drain region 4916 of the p-channel FET.

A source region 4923 and a drain region 4922 are formed in the above-obtained active layer (single crystal silicon layer) by a known TFT technique, and a gate electrode 4925 is formed above it through a gate insulating film 4924. Impurity regions 4926 according to the invention are formed right under the gate electrode 4925 so as to go into only the drain region 4922.

The gate electrode 4925 of the n-channel PET is formed by using polysilicon that is rendered conductive, and an interconnection 4927 is formed at the same time as the gate electrode 4925 by using the same material. The interconnection 4927 serves to supply an output signal of the right-hand CMOS circuit to gate electrodes 4928 and 4929 of the left-hand CMOS circuit. In FIG. 37B, broken lines indicate that the interconnection 4927 is electrically connected to the gate electrodes 1928 and 1929, a structure for which connection is not shown in the drawing.

An n-channel FET serving as a transfer gate is provided in the uppermost layer. The active layer of this FET is a single crystal silicon layer obtained by the wafer bonding technique.

After a single crystal silicon layer is processed into an island shape, a source region 4930, a drain region 4931, and impurity regions 4932 according to the invention are formed therein to provide the active layer.

The drain region 4931 of the n-channel FET to serve as a transfer gate is electrically connected to the intermediate-layer interconnection 4927 via a connection electrode 4933. By applying a voltage to a word line 4934, a data signal is supplied from a bit line 4935 to the CMOS circuits.

Having advantages of a large operation margin and an extremely small data holding current, the CMOS-type SRAM configured in the above-described manner is widely used for a low-voltage battery backup purpose. The SRAM has further advantages such as high-speed operation, high reliability, and easiness in incorporation into a system.

As described above, by virtue of the invention the semiconductor devices of this embodiment such as the Bi-CMOS circuit and the SRAM circuit can be miniaturized while the short channel effects are avoided, and therefore they allow simultaneous pursuit of both high reliability (such as a high breakdown voltage) and high-speed operation. That is, it can be said that the invention is very effective in realizing ultra-high integration density circuits in view of the system-on-chip concept which will be put into practice in the future.

Embodiment 22

This embodiment is directed to a case where a semiconductor device according to the invention is incorporated into a product (electronic apparatus), specifically an IC circuit incorporated in a notebook-sized personal computer. This embodiment will be described with reference to FIG. 38.

Figure 38:
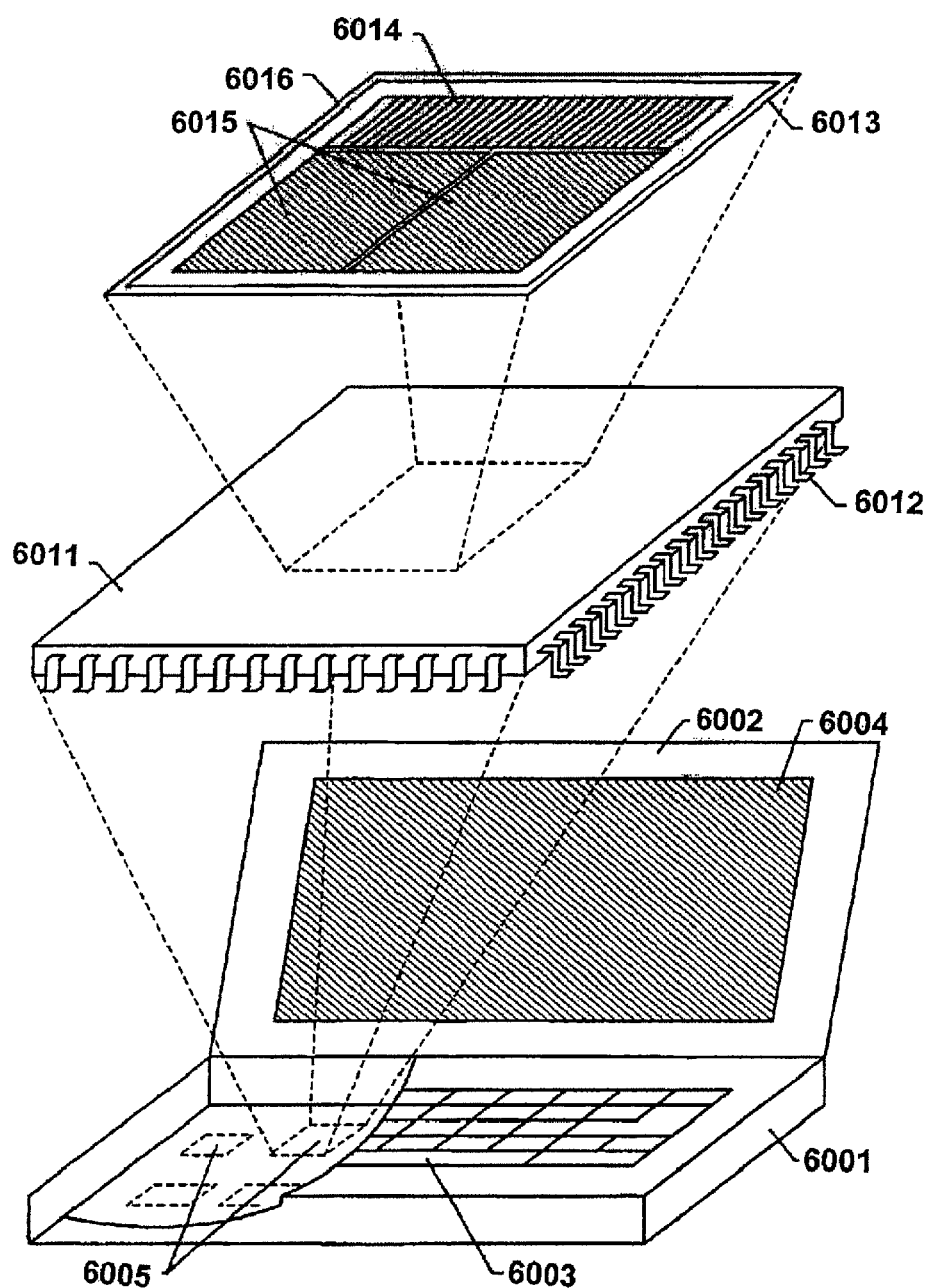
FIG. 38 shows an electronic apparatus (eighth embodiment) using semiconductor devices according to the invention.

Referring to FIG. 38, reference numeral 6001 denotes a main body; 6002, a lid; 6003, a keyboard; and 6004, an image display section. Various integrated circuits 6005 are incorporated in the main body 6001.

FIG. 38 shows one of the integrated circuits 6005 taken out of the apparatus. A semiconductor chip is protected by a resin or the like and covered with a package 6011. The semiconductor chip is to be connected to the external circuits via leads 6012. As for the integrated circuit (IC chip) 6005, usually, one can see only the black package 6011 and the leads 6012 and hence the integrated circuit 6005 is entirely a black box.

FIG. 38 also shows the semiconductor chip taken out of the protective package 6011. For example, the semiconductor chip is configured in the following manner. A computing section (processor) 6014 and memory sections 6015 are provided on a substrate 6013. Reference numeral 6016 denotes a bonding section for connecting semiconductor devices to the leads 6012.

The computing section 6014 and the memory sections 6015 are constructed by using a CMOS circuit, a Bi-CMOS circuit, a DRAM circuit, a SRAM circuit, and other various types of circuits. The configuration of this embodiment shown in FIG. 38 is characterized in that the computing section 6014 and the memory sections 6015 are formed on the same substrate, which is according to what is called the system-on-chip (system IC) concept.

In the configuration in which the computing section 6014 and the memory sections 6015 are arranged adjacent to each other, exchange of data between the computing section 6014 and the memory sections 6015 can be performed at very high speed. Thus, a circuit that operates at high speed can be constructed.

Further, all the necessary circuits can be integrated on one chip in which case the manufacturing cost can be reduced very much. In addition, a product can be miniaturized by reducing the occupation area. Allowing formation of a three-dimensional integrated circuit as described in the seventh embodiment, the SOI technology will no doubt provide even higher integration densities in the future.

Further, since by utilizing the invention IG-FETs and even integrated circuits can be miniaturized without being affected by the short channel effects, it is expected that application electronic apparatuses as semiconductor devices can further be miniaturized and made more suitable for portable use by realizing the above-mentioned one-chip configuration.

Embodiment 23

This embodiment is directed to examples of electronic apparatuses incorporating IGFETs according to the invention and integrated circuits that are constructed by using such IGFETs.

As described above, although this specification uses the terms "IG-FET," "integrated circuit" "electronic apparatus," etc. for convenience of description, all of them are basically constructed by utilizing semiconductors and therefore should be covered by the term "semiconductor device."

In general, semiconductor devices (electronic apparatuses) to which the invention is applicable include all semiconductor devices that require an IC circuit. Thus, the application range of the invention is extremely wide and include devices that are used in most of human activities.

Specific examples of semiconductor devices are active electro-optical devices such as a liquid crystal display device, an EL display device, and a CL display device, a TV camera, a personal computer, a car navigation apparatus, a TV projection apparatus, a video camera, and a portable information terminal apparatus (personal digital assistant). The portable information terminal apparatus includes such semiconductor devices as a cellular telephone and a mobile computer. FIGS. 39A-39D show typical examples of the above semiconductor devices.

FIG. 39A shows a TV camera which consists of a main body 5001, a camera section 5002, a display device 5003, and manipulation switches 5004. The invention can be applied to an integrated circuit 5005 that is provided inside the apparatus.

FIG. 39B shows a car navigation apparatus which consists of a main body 5101, a display device 5102, manipulation buttons 5103, and an antenna 5104. The invention can be applied to an integrated circuit 5105 that is provided inside the apparatus. Although the display device 5102 is used as a monitor, the allowable resolution range is relatively wide because the main purpose is display of a map.

FIG. 39C shows a portable information terminal apparatus (cellular telephone) which consists of a main body 5301, a voice output section 5302, a voice input section 5303, a display device 5304, manipulation buttons 5305, and an antenna 5306. The invention can be applied to an integrated circuit 5307 that is provided inside the apparatus.

The cellular telephone of FIG. 39C is a semiconductor device that should operate in a high frequency range, it is required to operate at very high speed. The invention enables incorporation of an integrated circuit that can operate at high speed while its breakdown voltage is not lowered.

FIG. 39D shows a video camera which consists of a main body 5401, a display device 5402, an eyepiece unit 5403, manipulation buttons 5404, and a tape holder 5405. The invention can be applied to an integrated circuit 5406 that is provided inside the apparatus. An image to be taken is displayed on the display device 5402 and can be viewed through the eyepiece unit 5403 on a real-time basis. Therefore, a user can take a picture while watching a displayed image.

As described above, the application range of the invention is very wide: the invention can be applied to various types of semiconductor devices (including electronic apparatuses) having a semiconductor integrated circuit.

Embodiment 24

A semiconductor device according to the invention exhibits much superior electrical characteristics, and an integrated circuit constructed by using such semiconductor devices is given a frequency characteristic covering a sufficiently high frequency range. In this embodiment, a description will be made of examples of performance of semiconductor devices according to the invention.

A semiconductor element itself formed according to the invention exhibits a much superior device characteristic (current-voltage characteristic of an IG-FET), and the threshold voltage $V_{th,n}$ of an n-channel FET and the threshold voltage $V_{th,p}$ of a p-channel FET can be controlled for a necessary drive voltage in ranges of −0.3 to 3.0 V and −3.0 to 0.3 V (typically 0 to ±0.3 V), respectively. A much superior sub-threshold characteristic can also be obtained in which the S-value is 60-85 mV/decade, in some cases 60-70 mV/decade.

Further, for the reasons described in the first embodiment, a high mobility (larger than 1,000 $cm^2/Vs$) can be obtained. In calculating a mobility value based on a calculation formula, care should be given to the fact that the mobility is in inverse proportion to the channel width W. In practicing the invention, an actual mobility value cannot be obtained unless a measured channel width $W_{pa}$ is substituted into a formula because the channel width is narrowed by impurity regions by not a small amount.

A much superior frequency characteristic can be obtained by constructing an integrated circuit by using semiconductor devices according to the invention that can attain the above-mentioned superior electrical characteristics. For example, by constructing a 9-stage ring oscillator by using semiconductor devices according to the invention, a frequency characteristic covering 2-10 GHz can be obtained with a drive voltage of 3.3 V.

The invention is also effective for electronic apparatuses that are required to have a frequency characteristic covering a high frequency range, such as a cellular telephone as a high frequency electronic apparatus. An integrated circuit used in an input section, for instance, of a cellular telephone is required to have a frequency characteristic including about 2 GHz (2.4 GHz) as in the case of an I/O circuit and a MUX/DMUX circuit. The invention can sufficiently be applied to such high-frequency integrated circuits.

Embodiment 25

This embodiment is directed to a configuration in which the same element as an impurity element for forming impurity regions for pinning is added to a base insulating layer (or an insulating substrate) of a single crystal silicon layer (active layer). This embodiment can be applied to both configurations of FIGS. 23A-23C and 33A-33C.

This embodiment is directed to a case where an n-type semiconductor device is to be formed and the impurity regions are formed by adding boron. (In the case of a p-type semiconductor device, phosphorus (or arsenic) may be added.)

Figure 40A:
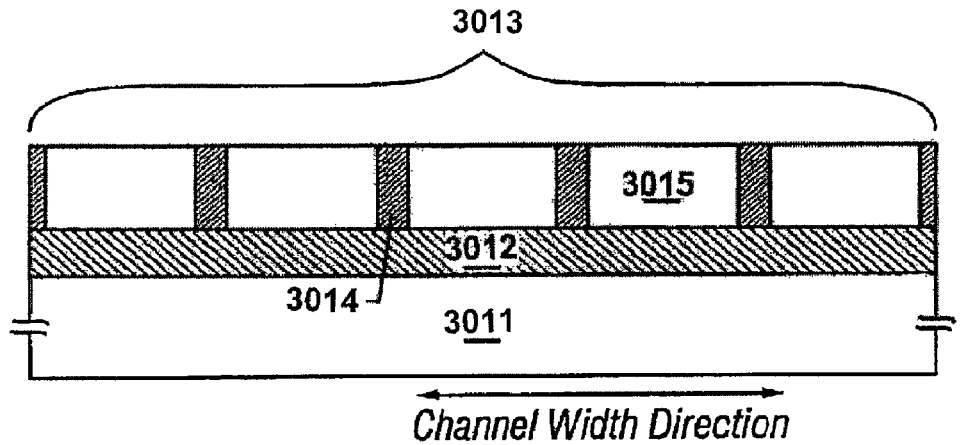
FIGS. 40A-40C show a configuration and energy profiles of a channel forming region of a semiconductor device according to an eleventh embodiment of the invention.

FIG. 40A is a sectional view taken by cutting a channel forming region by a plane perpendicular to the channel direction. Thus, during operation, carriers (electrons or holes) move in the direction perpendicular to the paper surface.

Referring to FIG. 40A, reference numerals 3011 and 3012 denote a substrate and an insulating layer (in this embodiment, an oxide film), respectively. A single crystal silicon layer 3013 serving as an active region is formed on the insulating layer 3012. Boron is locally added to the single crystal silicon layer 3013 to form impurity regions 3014 for pinning and channel forming regions 3015.

This embodiment is characterized in that the insulating layer 3012 contains boron at least in the vicinity of its surface. This structure may be formed in various manners depending on the manufacturing process of a SOI structure. A brief description will be made of a case of a wafer bonding SOI structure.

In the case of a wafer bonding SOI structure, a silicon substrate (first substrate) on which a thermal oxidation film is formed and a silicon substrate (second substrate) for supporting it are prepared. A thermal oxidation process for forming a thermal oxidation film on the first substrate is executed in an atmosphere containing boron. As a result, boron is added to a resulting thermal oxidation film.

Then the first and second substrates are bonded together by a known method, and an etch-back operation (or grinding) is performed from the back side of the first substrate. Thus, a SOI structure is obtained.

Then, boron is locally added by ion implantation, for instance, so that impurity regions for pinning are formed. Thus, the structure shown in FIG. 40A is obtained.

Figure 40B:
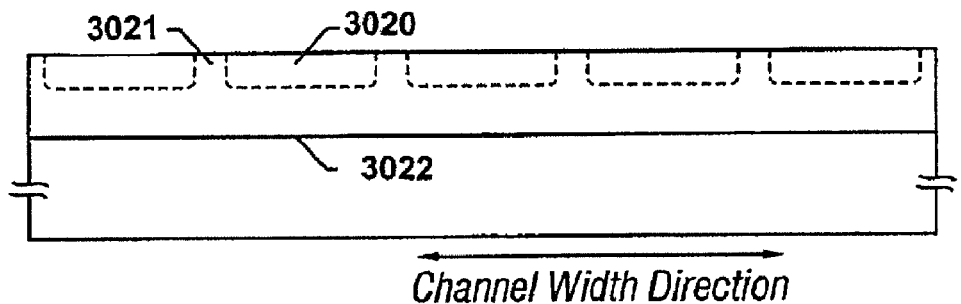

FIG. 40B schematically shows an energy profile of the structure of FIG. 40A, in which reference numeral 3020 denotes regions of low energy wall that correspond to the channel forming regions 3015.

The impurity regions 3014 for pinning and their vicinities correspond to a high energy wall region 3021 (energy barrier region). Reference numeral 3022 denotes an interface between the single crystal silicon layer 3013 and the insulating layer 3012. This embodiment is characterized in that a high energy barrier is intentionally formed in the vicinity of the interface 3022.

As described in the first embodiment, high energy barriers are formed in the impurity regions 3014 and encompass their vicinities because of impurity leakage. The same thing applies to the insulating layer 3012 which contains boron: naturally a high energy barrier is formed at and in the vicinity of the interface 3022 between the single crystal silicon layer 3013 and the insulating layer 3012.

Thus, the high-energy wall region 3021 (energy barrier) is formed as shown in FIG. 40B and carriers go through the other regions, i.e., the low-energy wall regions 3020.

Figure 40C:
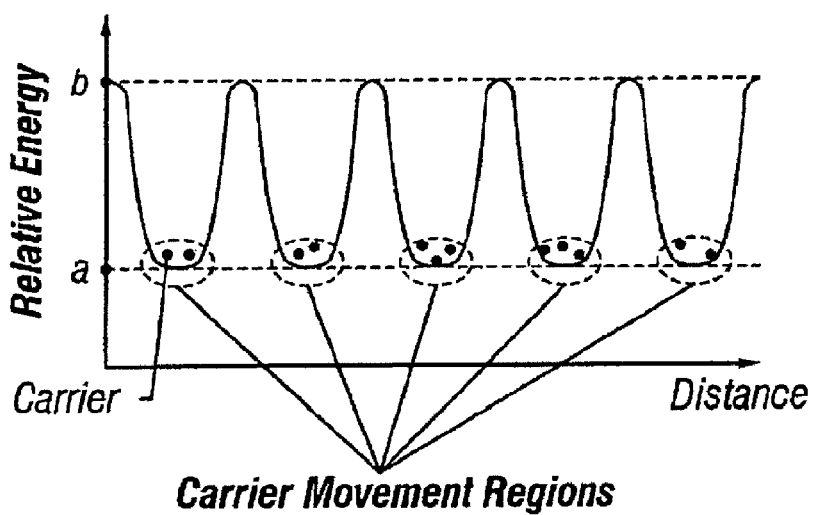

FIG. 40C shows an energy profile in the active region, in which the horizontal axis represents the distance in the channel width direction (direction traversing the channel) and the vertical axis represents the relative energy.

The energy profile diagrams of FIGS. 40B and 40C are drawn so as to correspond to each other. That is, the energy state of the low-energy regions 3020 corresponds to that of carrier movement regions in FIG. 40C.

The relative energy is lowest (level a in FIG. 40C) at the inside of the low-energy wall regions 3020 (particularly at the positions most distant from the impurity regions 3014), and highest (level b in FIG. 40C) in and in the vicinity of the impurity regions 3014 and at and in the vicinity of the interface 3022, i.e., in the region 3021.

In the invention, the relative energy a should be 3 or more times (preferably 10 or more times) larger than the relative energy b. In this case, carriers are allowed to go through the regions 3020 with preference given thereto.

Since a high energy barrier is formed in the vicinity of the interface 3022, no carriers go through the region in the vicinity of the interface 3022. Therefore, surface scattering of carriers which would otherwise occur in the vicinity of the surface of the base insulating layer 3012 can be prevented.

Although this embodiment is directed to the wafer bonding SOI structure, the advantages of this embodiment can be obtained as long as the structure of FIG. 40A is formed. That is, the invention can also be applied to SOI structures formed by other means.

Embodiment 26

The configuration of the eleventh embodiment can also be applied to a buried channel type semiconductor device. Further, although the eleventh embodiment is directed to the n-channel semiconductor device, the eleventh embodiment can easily be adapted for a p-type semiconductor device, and can be adapted even for a CMOS structure that is a complementary combination of n-type and p-type semiconductor devices.

In a certain situation, as for a substrate on which n-type semiconductor devices and p-type semiconductor devices are formed in a mixed manner, the configuration of the eleventh embodiment can be applied to only the n-type semiconductor devices.

As described above, since the invention is applied to semiconductor devices having a SOI structure, the invention enables formation of an integrated circuit that operates more than 10% faster and can be driven with more than 30% lower power consumption than a conventional integrated circuit formed on a bulk silicon substrate.

By utilizing the invention, the short channel effects can be prevented which would otherwise occur when the channel length is shortened. Specifically, a drain-side depletion layer is prevented from expanding to the source region and the region under the channel forming region by means of the impurity regions that are locally formed in the channel forming region, to provide a structure in which the drain voltage does not influence the energy (potential) state of the channel forming region. As a result, the punch-through phenomenon and deterioration of the subthreshold characteristic can be prevented, as well as a high drain breakdown voltage can be obtained.

Further, reduction in threshold voltage which is one aspect of the short channel effects can be compensated by increase in threshold voltage that is caused by the narrow channel effect. The narrow channel effect is artificially obtained by locally forming the impurity regions in the channel forming region according to the invention.

As described above, the invention allows even semiconductor devices in the deem submicron range that have extremely short channels to operate properly without causing any short channel effects. Thus, by using semiconductor devices according to the invention, integrated circuits can be constructed that are integrated at a very high density.

Further, according to the invention, it becomes possible to reduce scattering due to self-collision of carriers by defining carrier movement directions by forming slit-like lane regions in terms of energy.

That is, the factors of reducing the carrier mobility, such as the impurity scattering, the lattice scattering, and the scattering due to self-collision of carriers, are greatly reduced in degree, whereby the mobility is increased very much. Thus, the performance of semiconductor devices as typified by an IG-FET can further be improved.

The invention claimed is:

1. A semiconductor device comprising:
a single crystal silicon substrate;
a buried oxide film on the single crystal silicon substrate;
a single crystal silicon layer on the buried oxide film, the single crystal silicon layer including a source region, a drain region and a channel forming region;
an oxide film adjacent to a side surface of the single crystal silicon layer;
a gate insulating film on the channel forming region;
a gate electrode on the gate insulating film;
side walls comprising silicon nitride adjacent to side surfaces of the gate electrode; and
a silicon nitride film formed over the gate electrode,
wherein the single crystal silicon layer has a thickness of 100-2,000 Å.

2. The semiconductor device according to claim 1 wherein the buried oxide film has a thickness of 0.05-0.5 µm.

3. The semiconductor device according to claim 1 wherein the gate insulating film contains a halogen element.

4. The semiconductor device according to claim 1 wherein the channel forming region has a channel length of less than 0.35 µm.

5. A semiconductor device comprising:
a single crystal silicon substrate;
a buried oxide film on the single crystal silicon substrate;
a single crystal silicon layer on the buried oxide film, the single crystal silicon layer including a source region, a drain region and a channel forming region;
an oxide film adjacent to a side surface of the single crystal silicon layer;
a gate insulating film on the channel forming region;
a gate electrode comprising polysilicon on the gate insulating film;
side walls comprising silicon nitride adjacent to side surfaces of the gate electrode; and
a silicon nitride film formed over the gate electrode,
wherein each of the upper portion of the gate electrode, an upper portion of the source region, and an upper portion of the drain region comprises metal silicide, and
wherein the single crystal silicon layer has a thickness of 100-2,000 Å.

6. The semiconductor device according to claim 5 wherein the buried oxide film has a thickness of 0.05-0.5 µm.

7. The semiconductor device according to claim 5 wherein the gate insulating film contains a halogen element.

8. The semiconductor device according to claim 5 wherein the metal silicide is titanium silicide.

9. The semiconductor device according to claim 5 wherein the channel forming region has a channel length of less than 0.35 µm.

10. A semiconductor device comprising:
a single crystal silicon substrate;
a buried oxide film on the single crystal silicon substrate;
a single crystal silicon layer on the buried oxide film, the single crystal silicon layer including a source region, a drain region and a channel forming region;
a thermal oxide film adjacent to a side surface of the single crystal silicon layer;
a gate insulating film on the channel forming region;
a gate electrode on the gate insulating film;
side walls comprising silicon nitride adjacent to side surfaces of the gate electrode; and
a silicon nitride film formed over the gate electrode,
wherein the single crystal silicon layer has a thickness of 100-2,000 Å.

11. The semiconductor device according to claim 10 wherein the buried oxide film has a thickness of 0.05-0.5 µm.

12. The semiconductor device according to claim 10 wherein the gate insulating film contains a halogen element.

13. The semiconductor device according to claim 10 wherein the channel forming region has a channel length of less than 0.35 µm.

14. A semiconductor device comprising:
a single crystal silicon substrate;
a buried oxide film on the single crystal silicon substrate;
a single crystal silicon layer on the buried oxide film, the single crystal silicon layer including a source region, a drain region and a channel forming region;
a thermal oxide film adjacent to a side surface of the single crystal silicon layer;
a gate insulating film on the channel forming region;
a gate electrode comprising polysilicon on the gate insulating film;
side walls comprising silicon nitride adjacent to side surfaces of the gate electrode; and
a silicon nitride film formed over the gate electrode,
wherein each of an upper portion of the gate electrode, an upper portion of the source region, and an upper portion of the drain region comprises metal silicide, and
wherein the single crystal silicon layer has a thickness of 100-2,000 Å.

15. The semiconductor device according to claim 14 wherein the buried oxide film has a thickness of 0.05-0.5 µm.

16. The semiconductor device according to claim 14 wherein the gate insulating film contains a halogen element.

17. The semiconductor device according to claim 14 wherein the metal silicide is titanium silicide.

18. The semiconductor device according to claim 14 wherein the channel forming region has a channel length of less than 0.35 µm.

19. The semiconductor device according to claim 1 further comprising impurity regions for pinning of a depletion layer developing from the drain region toward the channel forming region and the source region.

20. The semiconductor device according to claim 5 further comprising impurity regions for pinning of a depletion layer developing from the drain region toward the channel forming region and the source region.

21. The semiconductor device according to claim 10 further comprising impurity regions for pinning of a depletion layer developing from the drain region toward the channel forming region and the source region.

22. The semiconductor device according to claim 14 further comprising impurity regions for pinning of a depletion layer developing from the drain region toward the channel forming region and the source region.

* * * * *

UNITED STATES PATENT AND TRADEMARK OFFICE
CERTIFICATE OF CORRECTION

PATENT NO. : 8,222,696 B2
APPLICATION NO. : 12/427140
DATED : July 17, 2012
INVENTOR(S) : Shunpei Yamazaki et al.

It is certified that error appears in the above-identified patent and that said Letters Patent is hereby corrected as shown below:

In the Specification

At column 8, line 2, "les" should be --ICs--;

At column 38, line 1, "ll" should be --µ--.

Signed and Sealed this
Twenty-ninth Day of October, 2013

Teresa Stanek Rea
*Deputy Director of the United States Patent and Trademark Office*